United States Patent
Furukawa et al.

(10) Patent No.: US 9,819,885 B2
(45) Date of Patent: Nov. 14, 2017

(54) SOLID-STATE IMAGING DEVICE AND IMAGING SYSTEM

(71) Applicant: OLYMPUS CORPORATION, Hachioji-shi, Tokyo (JP)

(72) Inventors: Eiji Furukawa, Saitama (JP); Toru Kondo, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/226,449

(22) Filed: Aug. 2, 2016

(65) Prior Publication Data

US 2016/0344969 A1 Nov. 24, 2016

Related U.S. Application Data

(63) Continuation of application No. PCT/JP2015/052523, filed on Jan. 29, 2015.

(30) Foreign Application Priority Data

Feb. 20, 2014 (JP) .................................. 2014-030603

(51) Int. Cl.
*H04N 5/3745* (2011.01)
*H04N 5/347* (2011.01)
(Continued)

(52) U.S. Cl.
CPC .......... *H04N 5/37455* (2013.01); *H03M 1/56* (2013.01); *H04N 5/347* (2013.01);
(Continued)

(58) Field of Classification Search
CPC .... H04N 5/347; H04N 5/3559; H04N 5/3745; H04N 5/37452; H04N 5/37455;
(Continued)

(56) References Cited

U.S. PATENT DOCUMENTS

2007/0063128 A1* 3/2007 Krymski ................ H04N 5/347
250/208.1
2007/0258000 A1* 11/2007 Kondo ................... H04N 5/217
348/308
(Continued)

FOREIGN PATENT DOCUMENTS

JP 6-291659 A 10/1994
JP 2008-118634 A 5/2008
(Continued)

OTHER PUBLICATIONS

International Search Report dated Mar. 17, 2015, issued in counterpart International Application No. PCT/JP2015/052523 (1 page).

*Primary Examiner* — Lin Ye
*Assistant Examiner* — Chriss Yoder, III
(74) *Attorney, Agent, or Firm* — Westerman, Hattori, Daniels & Adrian, LLP

(57) ABSTRACT

A solid-state imaging device includes a pixel signal processing unit including a plurality of pixels; a plurality of first charge storage circuits which are configured to hold the first signal charges generated by the photoelectric conversion units and output first signal voltages as first pixel signals; and a plurality of second charge storage circuits which are configured to hold second signal charges and output second signal voltages, and a differential analog/digital conversion unit includes: a plurality of first differential calculation units; a plurality of first analog/digital conversion units which are configured to perform analog/digital conversion to the first differential pixel signals and output digital values indicating magnitudes of the first differential pixel signals; and a plurality of second analog/digital conversion units which are configured to perform analog/digital conversion to the second pixel signal and output digital values indicating magnitudes of the second pixel signals.

20 Claims, 19 Drawing Sheets

(51) Int. Cl.
*H03M 1/12* (2006.01)
*H03M 1/56* (2006.01)
*H04N 5/378* (2011.01)
*H04N 9/04* (2006.01)
*H04N 5/355* (2011.01)

(52) U.S. Cl.
CPC ........... *H04N 5/3559* (2013.01); *H04N 5/378* (2013.01); *H04N 5/37452* (2013.01); *H04N 5/37457* (2013.01); *H04N 9/045* (2013.01); *H03M 1/123* (2013.01); *H04N 2209/045* (2013.01)

(58) Field of Classification Search
CPC .... H04N 5/37457; H04N 5/378; H04N 9/045; H01L 27/14609; H01L 27/14612; H01L 27/14614; H01L 27/2445; H03M 1/56; H03M 1/123
See application file for complete search history.

(56) References Cited

U.S. PATENT DOCUMENTS

| | | | |
|---|---|---|---|
| 2010/0163711 A1* | 7/2010 | Kondo | H04N 5/343 250/208.1 |
| 2011/0317715 A1 | 12/2011 | Hood | |
| 2013/0020471 A1 | 1/2013 | Korekado et al. | |
| 2013/0229560 A1* | 9/2013 | Kondo | H04N 5/374 348/308 |

FOREIGN PATENT DOCUMENTS

| | | |
|---|---|---|
| JP | 2011-217206 A | 10/2011 |
| JP | 2013-535162 A | 9/2013 |

\* cited by examiner

SOLID-STATE IMAGING DEVICE AND IMAGING SYSTEM

This application is a continuation application based on a PCT International Application No. PCT/JP2015/052523, filed on Jan. 29, 2015, whose priority is claimed on Japanese Patent Application No. 2014-030603, filed on Feb. 20, 2014. The contents of both the PCT International Application and the Japanese Patent Application are incorporated herein by reference.

BACKGROUND OF THE INVENTION

Field of the Invention

The present invention relates to a solid-state imaging device and an imaging system.

Description of Related Art

In recent years, imaging systems such as video cameras and electronic still cameras have been generally and broadly propagated. Charge coupled device (CCD) solid-state imaging devices or complementary metal oxide semiconductor (CMOS) solid-state imaging devices are mounted in such imaging systems. In such solid-state imaging devices, a plurality of pixels are disposed in a 2-dimensional matrix, signal charges generated by photoelectric conversion units such as photodiodes installed in the pixels on which light is incident are held in charge retention units, signal charges are amplified in amplification units installed in the pixels, and the amplified signal charges are output as pixel signals. At this time, in general CMOS solid-state imaging devices, pixel signals from pixels arrayed in a 2-dimensional matrix are sequentially read for each column in the related art.

While CCD solid-state imaging devices are manufactured through dedicated manufacturing processes, CMOS solid-state imaging devices can be manufactured using general semiconductor manufacturing processes. Accordingly, in CMOS solid-state imaging devices, for example, multiple functions can be realized by embedding various functional circuits in the solid-state imaging devices as in system on chips (SOC).

Therefore, examples in which solid-state imaging devices including analog digital conversion circuits (hereinafter referred to as "A/D conversion circuits") are used as CMOS solid-state imaging devices (hereinafter referred to as "solid-state imaging devices") mounted on imaging systems have increased. As an A/D conversion circuit included in such a solid-state imaging device, for example, there is a slope integration type A/D conversion circuit (see Japanese Unexamined Patent Application, First Publication No. 2008-118634) that performs analog/digital conversion using a ramp wave.

In the slope integration type A/D conversion circuit, a magnitude relation between a ramp wave (reference voltage) gradually varying at a predetermined slope over time and a pixel signal (analog signal) output from each pixel of the solid-state imaging device is compared, and a time from start of the comparison to reversion of the magnitude relation between the ramp wave and the pixel signal is counted by a counter. Here, a counted value (count value) counted by the counter is set to a value (digital value) indicating the magnitude of a pixel signal, that is, an analog signal output from the pixel.

As in the technology disclosed in Japanese Unexamined Patent Application, First Publication No. 2008-118634, a ratio of the entire power consumption of the solid-state imaging device occupied by power consumption of an A/D conversion circuit is large in the solid-state imaging device including the A/D conversion circuit. In an A/D conversion circuit performing analog/digital conversion using a counter as in a slope integration type A/D conversion circuit, power consumption of a counter which is performing analog/digital conversion has a large ratio. Therefore, in a solid-state imaging device of a column A/D scheme including a plurality of A/D conversion circuits at intervals of one column or a plurality of columns of a plurality of pixels disposed in a 2-dimensional matrix, power consumption of a counter in the A/D conversion circuit occupies a considerable ratio of the entire power consumption of the solid-state imaging device.

With recent requests for numerous pixels and high quality in solid-state imaging devices, the number of A/D conversion circuits included in a solid-state imaging device or the number of bits of digital values to be output has increased. For example, A/D conversion circuits of 12 bits are included for each column of a plurality of pixels disposed in a 2-dimensional matrix in a solid-state imaging device. Therefore, power consumption of counters in A/D conversion circuits included in a solid-state imaging device has a larger ratio, and thus power consumption of the solid-state imaging device increases. Further, with requests for high-speed operations in imaging systems, it is also necessary for a solid-state imaging device to operate at a high speed, and thus power consumption of counters in A/D conversion circuits included in solid-state imaging devices has further increased.

SUMMARY OF THE INVENTION

According to a first aspect of the present invention, a solid-state imaging device includes a pixel signal processing unit including a plurality of pixels in which photoelectric conversion units generating first signal charges obtained by photoelectrically converting incident light are disposed in a matrix; a plurality of first charge storage circuits which are configured to hold the first signal charges generated by the photoelectric conversion units and output first signal voltages as first pixel signals, the first signal voltages being generated based on the held first signal charges; and a plurality of second charge storage circuits which are configured to hold second signal charges based on the first signal charges generated by the photoelectric conversion units in the plurality of pixels and output second signal voltages as second pixel signals reduced to a pre-determined number of pixels, the second signal voltages being generated based on the held second signal charges, and a differential analog/digital conversion unit includes: a plurality of first differential calculation units which are configured to output pixel signals as first differential pixel signals, the first differential pixel signals being obtained by calculating differences between the first pixel signals of a corresponding column and the second pixel signals based on the first pixel signals, and the first differential pixel signals corresponding to each column of the pixels; a plurality of first analog/digital conversion units which are configured to perform analog/digital conversion to the first differential pixel signals output from the corresponding first differential calculation units and output digital values indicating magnitudes of the first differential pixel signals, each of the plurality of the first analog/digital conversion units corresponding to one of the plurality of first differential calculation units; and a plurality of second analog/digital conversion units which are configured to perform analog/digital conversion to the second pixel signals output from the second charge storage circuits of a corresponding column and output digital values indicating magnitudes of the second pixel signals, each of the plurality of second analog/digital conversion units corresponding to one column of the second charge storage circuits, wherein each of the plurality of first analog/digital conversion units outputs a digital value of the number of bits less than the number of bits of a digital value output by each of the plurality of second analog/digital conversion units.

According to a second aspect of the present invention, in the solid-state imaging device according to the first aspect, the second pixel signal may be a signal of the second signal voltage based on the second signal charges with a charge amount obtained by averaging the signal charges based on the first signal charges, the first signal charges being generated during the same exposure period by the photoelectric conversion units in the corresponding pixel among the plurality of pixels.

According to a third aspect of the present invention, in the solid-state imaging device according to the second aspect, the differential analog/digital conversion unit may further include an analog/digital conversion mode control unit which is configured to control the number of bits when the corresponding first analog/digital conversion units perform the analog/digital conversion to the first differential pixel signals, each of the analog/digital conversion mode control units corresponding to one of the plurality of first analog digital conversion units.

According to a fourth aspect of the present invention, in the solid-state imaging device according to the third aspect, the analog/digital conversion mode control unit may firstly read the second pixel signals corresponding to the first differential pixel signals subjected to the analog-digital conversion by the corresponding first analog/digital conversion units, and then control the number of bits based on a dynamic range of signals based on the read second pixel signals.

According to a fifth aspect of the present invention, in the solid-state imaging device according to the fourth aspect, the analog/digital conversion mode control unit may control the number of bits based on a dynamic range of the second pixel signals which is calculated based on digital values, the digital values being obtained when the corresponding second analog/digital conversion units perform the analog/digital conversion to the second pixel signals corresponding to the first differential pixel signals subjected to the analog/digital conversion by the corresponding first analog/digital conversion units.

According to a sixth aspect of the present invention, in the solid-state imaging device according to the fourth aspect, the analog/digital conversion mode control unit may control the number of bits based on a dynamic range of the second pixel signals, the second pixel signals corresponding to the first differential pixel signals subjected to the analog-digital conversion by the corresponding first analog/digital conversion units.

According to a seventh aspect of the present invention, in the solid-state imaging device according to the third aspect, the analog/digital conversion mode control unit may control the number of bits based on a dynamic range of the first differential pixel signals subjected to the analog-digital conversion by the corresponding first analog/digital conversion units.

According to an eighth aspect of the present invention, in the solid-state imaging device according to the second aspect, each of the plurality of first analog/digital conversion units may perform analog/digital conversion to the corresponding first differential pixel signal by a designated number of bits.

According to a ninth aspect of the present invention, the solid-state imaging device according to any one of the second to eighth aspects may further include a photoelectric conversion substrate on which the plurality of photoelectric conversion units are disposed; a first substrate on which a plurality of the first charge storage circuits and the second charge storage circuits are disposed; a second substrate on which another plurality of the first charge storage circuits and the second charge storage circuits are disposed; a first connection unit configured to electrically connect the photoelectric conversion substrate to the first substrate; and a second connection unit configured to electrically connect the first substrate to the second substrate; wherein the plurality of first differential calculation units and the plurality of first analog/digital conversion units are disposed on one of the first and second substrates on which the first charge storage circuits of the corresponding pixels are disposed, and wherein the plurality of second analog/digital conversion units are disposed on the other of the first and second substrate on which the corresponding second charge storage circuits are disposed.

According to a tenth aspect of the present invention, in the solid-state imaging device according to the ninth aspect, the first connection unit may be disposed between the photoelectric conversion substrate and the first substrate, the first connection unit may be configured to correspond to each of either the plurality of first charge storage circuits or the plurality of second charge storage circuits disposed on the first substrate, and the first connection unit may be configured to electrically connect each of the signal lines of the first signal charges between the photoelectric conversion substrate and the first substrate, the first signal charges being transmitted from the photoelectric conversion units disposed in the photoelectric conversion substrate to the corresponding first charge storage circuits or the second charge storage circuits disposed on the first substrate, and the second connection unit may be disposed between the first and second substrates, the second connection unit may be configured to correspond to each of the other of the plurality of first charge storage circuits and the plurality of second charge storage circuits disposed on the second substrate, and the second connection unit may be configured to electrically connect each of the signal lines of the first signal charges with each of the signal lines of the second pixel signals between the first and second substrates, the first signal charges being transmitted from the photoelectric conversion units disposed in the photoelectric conversion substrate to the rest of the corresponding first and second charge storage circuits disposed on the second substrate via the first substrate, and the second pixel signals being used for calculating differences with the first pixel signals corresponding to the first differential calculation units.

According to an eleventh aspect of the present invention, the solid-state imaging device according to any one of the second to eighth aspects may further include a photoelectric conversion substrate on which the plurality of photoelectric conversion units are disposed; a first substrate on which the plurality of first charge storage circuits and the plurality of second charge storage circuits are disposed; and a first connection unit configured to electrically connect the photoelectric conversion substrate to the first substrate. The first differential calculation units, the first analog/digital conversion units, and the second analog/digital conversion units may be disposed on the first substrate.

According to a twelfth aspect of the present invention, in the solid-state imaging device according to the eleventh aspect, the first connection unit may be disposed between the photoelectric conversion substrate and the first substrate, the first connection unit may be configured to correspond to at least either the plurality of first charge storage circuits and the plurality of second charge storage circuits disposed on the first substrate, and the first connection unit may be configured to electrically connect each of signal lines of the first signal charges between the photoelectric conversion substrate and the first substrate, the first signal charges being transmitted from each of the photoelectric conversion units disposed in the photoelectric conversion substrate to at least either the corresponding first charge storage circuits or the corresponding second charge storage circuits disposed on the first substrate.

According to a thirteenth aspect of the present invention, in the solid-state imaging device according to any one of the first to twelfth aspects, the pixel signal processing unit may further include a plurality of third charge storage circuits configured to hold the second signal charges based on the first signal charges held by the plurality of second charge storage circuits, and output the second signal voltages as third pixel signals based on the held second signal charges, the third pixel signals being further reduced to a predetermined number of pixels. The differential analog/digital conversion unit may further include a plurality of second differential calculation units configured to correspond to each column of the second charge storage circuits and output pixel signals which are obtained by calculating differences between the second pixel signals of a corresponding column and the third pixel signals corresponding to the second pixel signals, as second differential pixel signals, and a plurality of third analog/digital conversion units configured to correspond to each column of the third charge storage circuits, perform analog/digital conversion to the third pixel signals output from the third charge storage circuits of the corresponding column, and output digital values indicating magnitudes of the third pixel signals. Each of the plurality of second analog/digital conversion units may be configured to correspond to each of the plurality of second differential calculation units, perform the analog/digital conversion to the second differential pixel signals output from the corresponding second differential calculation units, the second differential pixel signals being instead of the second pixel signals output from the second charge storage circuits, and output digital values indicating magnitudes of the second differential pixel signals, the number of bits of the digital values being less than the number of bits of the digital values output by the third analog/digital conversion units.

According to a fourteenth aspect of the present invention, in the solid-state imaging device according to the thirteenth aspect, the third pixel signal may be a signal of a third signal voltage based on third signal charges with a charge amount obtained by averaging the second signal charges based on the first signal charges held by the plurality of corresponding second charge storage circuits.

According to a fifteenth aspect of the present invention, in the solid-state imaging device according to the fourteenth aspect, the differential analog/digital conversion unit may further include an analog/digital conversion mode control unit which is configured to control the number of bits when the corresponding first analog/digital conversion units perform the analog/digital conversion to the first differential pixel signals, each of the analog/digital conversion mode control units corresponding to one of the plurality of first analog digital conversion units, and the analog/digital conversion mode control unit may further correspond to each of the plurality of second analog/digital conversion units and control the number of bits when the corresponding second analog/digital conversion units perform the analog/digital conversion on the second differential pixel signals.

According to a sixteenth aspect of the present invention, in the solid-state imaging device according to the fifteenth aspect, the analog/digital conversion mode control unit may firstly read the third pixel signals instead of the second pixel signals, and then control the number of bits when the corresponding first analog/digital conversion units perform the analog/digital conversion to the first differential pixel signals and the number of bits when the corresponding second analog/digital conversion units perform the analog/digital conversion to the second differential pixel signals, based on a dynamic range of signals according to the read third pixel signals.

According to a seventeenth aspect of the present invention, in the solid-state imaging device according to the sixteenth aspect, the analog/digital conversion mode control unit may control the number of bits based on a dynamic range of the third pixel signals, the third pixel signals corresponding to the first differential pixel signals subjected to the analog/digital conversion by the corresponding first analog/digital conversion units and the second differential pixel signals subjected to the analog/digital conversion by the corresponding second analog/digital conversion units, and the third pixel signals being calculated based on digital values obtained through the analog/digital conversion by the corresponding third analog/digital conversion units.

According to an eighteenth aspect of the present invention, in the solid-state imaging device according to the sixteenth aspect, the analog/digital conversion mode control unit may control the number of bits based on a dynamic range of the third pixel signals, the third pixel signals corresponding to the first differential pixel signals subjected to the analog/digital conversion by the corresponding first analog/digital conversion units and the second differential pixel signals subjected to the analog/digital conversion by the corresponding second analog/digital conversion units.

According to a nineteenth aspect of the present invention, in the solid-state imaging device according to the sixteenth aspect, the analog/digital conversion mode control unit may control the number of bits based on a dynamic range of the differential pixel signals subjected to the analog/digital conversion by the corresponding first analog/digital conversion units when the first analog/digital conversion units performs the analog/digital conversion on the first differential pixel signals, and may control the number of bits based on a dynamic range of the second differential pixel signals subjected to the analog/digital conversion by the corresponding second analog/digital conversion units when the second analog/digital conversion units perform the analog/digital conversion on the second differential pixel signals.

According to a twentieth aspect of the present invention, in the solid-state imaging device according to the fifteenth aspect, the analog/digital conversion mode control unit may control the number of bits based on a dynamic range of the second differential pixel signals subjected to the analog/digital conversion by the corresponding second analog/digital conversion units.

According to a twenty-first aspect of the present invention, in the solid-state imaging device according to the fourteenth aspect, each of the plurality of second analog/digital conversion units may perform the analog/digital conversion to the corresponding second differential pixel signals by a designated number of bits.

According to a twenty-second aspect of the present invention, the solid-state imaging device according to any one of the fourteenth to twenty-first aspects may further include a second substrate on which another plurality of the first charge storage circuits and the second charge storage circuits are disposed; a third substrate on which the plurality of third charge storage circuits and the plurality of third analog/digital conversion units are disposed; and a third connection unit which is configured to electrically connect the second substrate to the third substrate.

According to a twenty-third aspect of the present invention, in the solid-state imaging device according to the twenty-second aspect, the third connection unit may be disposed between the second substrate and the third substrate, the third connection unit may be configured to correspond to the third charge storage circuits disposed on the third substrate, and the third connection unit may be configured to electrically connect each of signal lines of the third signal charges to each of signal lines of the third pixel signals between the second substrate and the third substrate, the third signal charges being transmitted from the second charge storage circuits disposed on the second substrate to the corresponding third charge storage circuits disposed on the third substrate, the third pixel signals being used for calculating differences from the corresponding second pixel signals corresponding to each of the plurality of second differential calculation units.

According to a twenty-fourth aspect of the present invention, the solid-state imaging device according to any one of the fourteenth to twenty-second aspects may further include a first substrate on which the plurality of first charge storage circuits and the plurality of second charge storage circuits are disposed, wherein the plurality of third charge storage circuits and the plurality of third analog/digital conversion units are further disposed on the first substrate.

According to a twenty-fifth aspect of the present invention, an imaging system includes the solid-state imaging device according to any one of the first to twenty-fourth aspects.

According to a twenty-sixth aspect of the present invention, the imaging system according to the twenty-fifth aspect may further include an analog/digital conversion number-of-bits control unit configured to designate the number of bits when at least the first analog/digital conversion units perform the analog/digital conversion on the corresponding first differential pixel signals.

DETAILED DESCRIPTION OF THE INVENTION

First Embodiment

Hereinafter, embodiments of the present invention will be described with reference to the drawings. The following description includes specific detailed content for examples. However, it should be understood by those skilled in the art that the specific detailed content is within the scope of the present invention even when various changes of the detailed content to be described below are made. Accordingly, exemplary embodiments of the present invention to be described below will be described without loss of generality and without any limitation of the claimed invention.

Figure 1:
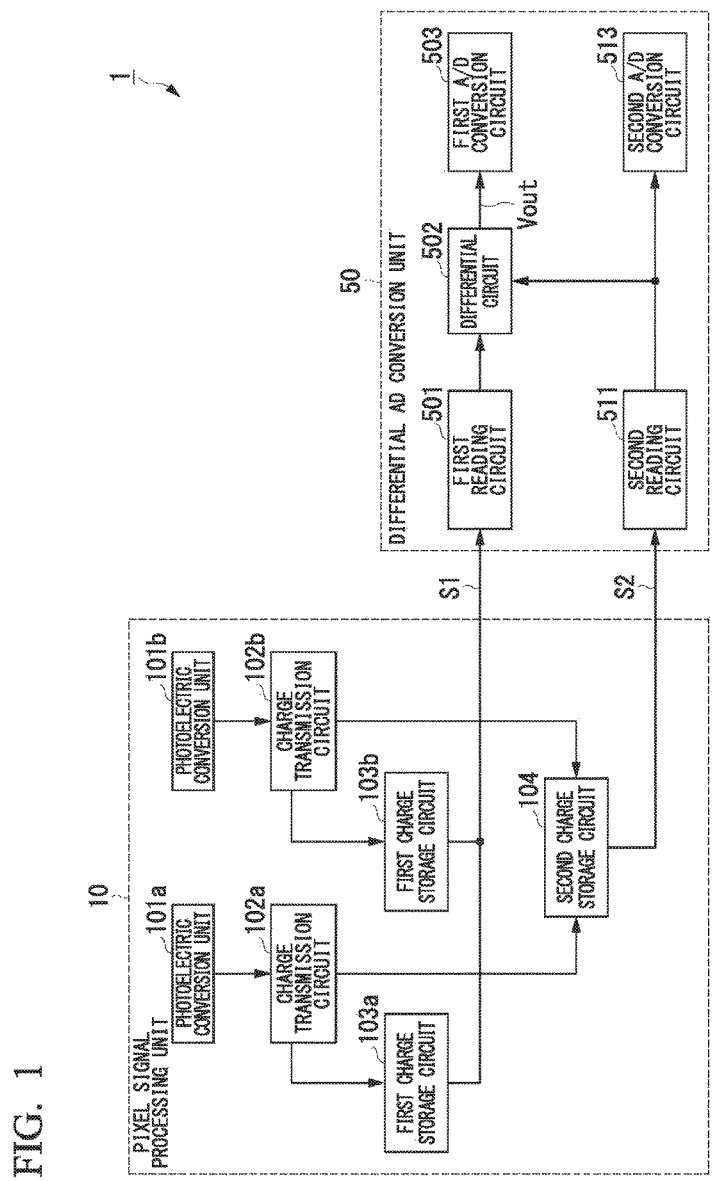
FIG. 1 is a block diagram showing a schematic configuration of a solid-state imaging device according to a first embodiment of the present invention.

FIG. 1 is a block diagram showing a schematic configuration of a solid-state imaging device according to a first embodiment of the present invention. A solid-state imaging device 1 shown in FIG. 1 is configured to include a pixel signal processing unit 10 and a differential analog/digital conversion unit (hereinafter referred to as a "differential AD conversion unit") 50. The pixel signal processing unit 10 outputs a pixel signal obtained by photoelectrically converting light incident on the solid-state imaging device 1. The differential AD conversion unit 50 outputs image data obtained by performing analog/digital conversion on the pixel signal output from the pixel signal processing unit 10. In the solid-state imaging device 1, a pixel array is formed by disposing a plurality of pixels in a 2-dimensional matrix and the pixel array is included in the pixel signal processing unit 10. To facilitate the description, however, an example of a case in which two pixels, that is, pixels 100a and 100b, are disposed in the pixel signal processing unit 10 included in the solid-state imaging device 1 in FIG. 1 will be described. In practice, there are a plurality of pairs of pixels 100a and 100b (for example, pairs of ½ of the total number of pixels of the solid-state imaging device 1). In the solid-state imaging device 1, constituent elements such as vertical and horizontal scanning circuits are also included, but these are omitted in FIG. 1. The vertical and horizontal scanning circuits and the like are constituent elements that drive constituent elements of the pixels disposed in the pixel signal processing unit 10 under the control of a control device that controls the solid-state imaging device 1 included in an imaging system on which the solid-state imaging device 1 is mounted.

In the following description, to distinguish the pixels to which constituent elements correspond, that is, the pixels 100a and 100b, from each other, reference numerals "a" and "b" indicating corresponding pixels are suffixed to the reference numerals of the constituent elements. More specifically, "a" is suffixed to the reference numerals of constituent elements corresponding to the pixel 100a and "b" is suffixed to the reference numerals of constituent elements corresponding to the pixel 100b for description. Reference numerals "a" and "b" are not suffixed to constituent elements commonly corresponding to the pixels 100a and 100b for description. When constituent elements are constituent elements corresponding to one of the pixels 100a and 100b, but corresponding pixels are not distinguished in the description, reference numerals "a" and "b" are not indicated and only the reference numerals of the constituent elements are indicated for description.

The pixel signal processing unit 10 of the solid-state imaging device 1 shown in FIG. 1 is configured to include photoelectric conversion units 101a and 101b, charge transmission circuits 102a and 102b, first charge storage circuits 103a and 103b, and a second charge storage circuit 104. In the pixel signal processing unit 10 of the solid-state imaging device 1 shown in FIG. 1, one second charge storage circuit 104 is disposed for two photoelectric conversion units 101a and 101b. However, for example, one second charge storage circuit 104 may be disposed for 9 photoelectric conversion units or one second charge storage circuit 104 may be disposed for 25 photoelectric conversion units. That is, one second charge storage circuit 104 may be disposed for a plurality of photoelectric conversion units.

The differential AD conversion unit 50 of the solid-state imaging device 1 shown in FIG. 1 is configured to include a first reading circuit 501, a differential circuit 502, a first A/D conversion circuit 503, a second reading circuit 511, and a second A/D conversion circuit 513. In the differential AD conversion unit 50 of the solid-state imaging device 1, the first reading circuit 501, the differential circuit 502, and the first A/D conversion circuit 503 are common constituent elements to the pixels 100a and 100b.

Each of the photoelectric conversion units 101a and 101b is a photoelectric conversion unit, such as a photodiode, that generates signal charges by photoelectrically converting incident light and stores the generated signal charges.

The charge transmission circuit 102a is a circuit that transmits the signal charges generated and stored by the corresponding photoelectric conversion unit 101a to each of the first charge storage circuit 103a and the second charge storage circuit 104. The charge transmission circuit 102b is a circuit that transmits the signal charges generated and stored by the corresponding photoelectric conversion unit 101b to each of the first charge storage circuit 103b and the second charge storage circuit 104.

The first charge storage circuit 103a is a circuit that holds (stores) the signal charges generated by the corresponding photoelectric conversion unit 101a and transmitted from the corresponding charge transmission circuit 102a. The first charge storage circuit 103b is a circuit that holds (stores) the signal charges generated by the corresponding photoelectric conversion unit 101b and transmitted from the corresponding charge transmission circuit 102b. Each of the first charge storage circuit 103a and the first charge storage circuit 103b is also a circuit that outputs signal voltages according to the held signal charges as pixel signals (hereinafter referred to as "full-resolution image signals") S1 to the first reading circuit 501 in the differential AD conversion unit 50.

The second charge storage circuit 104 is a circuit (averaged-charge storage circuit) that holds (stores) signal charges obtained by averaging charge amounts of the signal charges or signal charges obtained by averaging the charge amounts of the signal charges generated by the photoelectric conversion unit 101a and the photoelectric conversion unit 101b and transmitted from the charge transmission circuit 102a and the charge transmission circuit 102b. That is, the second charge storage circuit 104 is a circuit that holds signal charges in a state in which the number of pixels (pixel number) included in the pixel signal processing unit 10 is reduced by arithmetically averaging the signal charges of the pixels included in the pixel signal processing unit 10 of the solid-state imaging device 1. The second charge storage circuit 104 is also a circuit that outputs signal voltages according to the held signal charges as pixel signals in a state in which the number of pixels is reduced (hereinafter referred to as "reduced image signals") S2 to the second reading circuit 511 in the differential AD conversion unit 50.

As a configuration in which the signal charges of the pixels are added and averaged to reduce the number of pixels, for example, there are a configuration in which the signal charges are added and averaged when the second charge storage circuit 104 holds the signal charges generated by the photoelectric conversion units 101a and 101b and a configuration in which the signal charges are arithmetically averaged when the signal voltages (the reduced image signals S2) according to the signal charges held by the second charge storage circuit 104 are output. The configuration in which the signal charges are added and averaged may be a configuration in which the signal charges are arithmetically averaged after the signal voltages according to the signal charges held by the second charge storage circuit 104 are output.

The first reading circuit 501 is a circuit that sequentially reads the full-resolution image signals S1 from the first charge storage circuit 103a and the first charge storage circuit 103b in the pixel signal processing unit 10 and sequentially outputs the read full-resolution image signals S1 to the differential circuit 502.

The second reading circuit 511 is a circuit that sequentially reads the reduced image signals S2 in the state in which the number of pixels is reduced from the second charge storage circuit 104 in the pixel signal processing unit 10 and sequentially outputs the read reduced image signals S2 to each of the differential circuit 502 and the second A/D conversion circuit 513.

In the case of a configuration in which the signal charges are output directly without adding and averaging the signal voltages (the reduced image signals S2) according to the signal charges held by the second charge storage circuit 104 in the pixel signal processing unit 10, the second reading circuit 511 may be configured such that the signal voltages are sequentially output to each of the differential circuit 502 and the second A/D conversion circuit 513 after the signal voltages (the reduced image signals S2) sequentially read from the second charge storage circuit 104 are arithmetically averaged.

The differential circuit 502 calculates differences between the full-resolution image signals S1 input from the first reading circuit 501 and the reduced image signals S2 in the state in which the number of pixels is reduced input from the second reading circuit 511. The differential circuit 502 outputs the pixel signals obtained by calculating the differences as a differential pixel signal Vout to the first A/D conversion circuit 503.

The first A/D conversion circuit 503 is a slope integration type A/D conversion circuit. The first A/D conversion circuit 503 performs analog/digital conversion on each differential pixel signal Vout (analog signal) input from the differential circuit 502 and outputs a value (digital value) indicating the magnitude of each differential pixel signal Vout (analog signal).

The second A/D conversion circuit 513 is a slope integration type A/D conversion circuit. The second A/D conversion circuit 513 directly performs analog/digital conversion on each reduced image signal S2 (analog signal) input from the second reading circuit 511 and outputs a value (digital value) indicating the magnitude of each reduced image signal S2 (analog signal).

The number of bits of the digital value output by each of the first A/D conversion circuit 503 and the second A/D conversion circuit 513 is determined in advance. Here, the number of bits of the digital value output by the first A/D conversion circuit 503 is less than the number of bits of the digital value output by the second A/D conversion circuit 513. The number of bits of the digital value determined in advance by each of the first A/D conversion circuit 503 and the second A/D conversion circuit 513 will be described below.

According to the first embodiment, a solid-state imaging device (the solid-state imaging device 1) includes: a pixel signal processing unit (the pixel signal processing unit 10) configured to include a plurality of pixels (the pixels 100a and 100b) in which photoelectric conversion units (the photoelectric conversion units 101a and 101b) generating first signal charges obtained by photoelectrically converting incident light are disposed in a matrix, a plurality of first charge storage circuits (the first charge storage circuits 103a and 103b) that hold the first signal charges generated by the photoelectric conversion units 101a and 101b and output first signal voltages as first pixel signals (the full-resolution image signals S1) according to the held first signal charges, and a plurality of second charge storage circuits (the second charge storage circuits 104) that hold second signal charges based on the second signal charges generated by the photoelectric conversion units 101a and 101b in the plurality of pixels (the pixels 100a and 100b) and output second signal voltages (the reduced image signals S2) according to the held signal charges as second pixel signals (reduced image signals S2) reduced to a pre-determined number of pixels; and a differential analog/digital conversion unit (the differential AD conversion unit 50) configured to include a plurality of first differential calculation units (the differential circuits 502) that output pixel signals obtained by calculating differences between the full-resolution image signals S1 of a corresponding column and the reduced image signal S2 corresponding to the full-resolution image signals S1 as first differential pixel signals (the differential pixel signal Vout) in correspondence with each column of the pixels 100a and 100b, a plurality of first analog/digital conversion units (the first A/D conversion circuits 503) that perform analog/digital conversion on the differential pixel signals Vout output from the corresponding differential circuits 502 and output digital values indicating magnitudes of the differential pixel signals Vout in correspondence with the plurality of differential circuits 502, and a plurality of second analog/digital conversion units (the second A/D conversion circuits 513) that perform analog/digital conversion on the reduced image signals S2 output from the second charge storage circuits 104 of a corresponding column and output digital values indicating magnitudes of the reduced image signals S2 in correspondence with each column of the second charge storage circuits 104. Each of the plurality of first A/D conversion circuits 503 outputs a digital value of the number of bits smaller than the number of bits of a digital value output by each of the plurality of second A/D conversion circuits 513.

According to the first embodiment, the solid-state imaging device 1 is configured such that the reduced image signals S2 are signals of the second signal voltages according to the second signal charges with a charge amount obtained by averaging the signal charges based on the first signal charges generated during the same exposure period by the photoelectric conversion units 101a and 101b in the plurality of corresponding pixels (the pixels 100a and 100b).

In the above-described configuration, in the pixel signal processing unit 10 of the solid-state imaging device 1 according to the first embodiment, the pixels are exposed during the same exposure period, the signal charges generated by the photoelectric conversion unit 101a are held in the first charge storage circuit 103a, and the signal charges generated by the photoelectric conversion unit 101b are held in the first charge storage circuit 103b of the pixels. Further, in the pixel signal processing unit 10 of the solid-state imaging device 1 according to the first embodiment, the signal charges obtained by averaging the charge amounts of the signal charges and reducing the number of pixels are held in the second charge storage circuit 104. That is, in the pixel signal processing unit 10 of the solid-state imaging device 1 according to the first embodiment, the pixel signals (the full-resolution image signals S1) of all the pixels included in the pixel signal processing unit 10 and the pixel signals (the reduced image signals S2) obtained by reducing the number of pixels included in the pixel signal processing unit 10 can be held separately based on the signal charges obtained by the same one-time exposure.

The differential AD conversion unit 50 of the solid-state imaging device 1 according to the first embodiment separately reads the full-resolution image signals S1 held in the first charge storage circuits 103a and 103b in the pixel signal processing unit 10 and the reduced image signals S2 held in the second charge storage circuit 104. The differential AD conversion unit 50 of the solid-state imaging device 1 according to the first embodiment outputs the image data obtained by performing the analog/digital conversion on the read pixel signals. At this time, in the differential AD conversion unit 50 of the solid-state imaging device 1 according to the first embodiment, the differential circuit 502 calculates the difference between the full-resolution image signal S1 and the reduced image signal S2 to be subjected to the analog/digital conversion. Accordingly, the differential AD conversion unit 50 of the solid-state imaging device 1 according to the first embodiment can perform the signal voltages according to the signal charges in the state of the low level of the signal charges generated by the photoelectric conversion units 101a and 101b in the pixel signal processing units 10, that is, the full-resolution image signals S1 in which an entire luminance distribution (dynamic range) of all the full-resolution image signals S1 obtained by the same exposure is narrowed. Accordingly, in the differential AD conversion unit 50 of the solid-state imaging device 1 according to the first embodiment, power consumption of the counter can be reduced by shortening a counting time of the counter in the first A/D conversion circuit 503 when the full-resolution image signals S1 are subjected to the analog/digital conversion. Accordingly, it is possible to achieve a reduction in the power consumption of the solid-state imaging device 1 according to the first embodiment or an imaging system on which the solid-state imaging device 1 according to the first embodiment is mounted.

FIG. 1 shows the pixel signal processing unit 10 of the solid-state imaging device 1 according to the first embodiment configured to include the second charge storage circuit 104 that holds the signal charges obtained by averaging the charge amount of the signal charges generated by the photoelectric conversion units 101a and 101b included in the pixels. However, the configuration of the pixel signal processing unit 10 of the solid-state imaging device 1 according to the first embodiment is not limited to the configuration shown in FIG. 1.

<First Configuration Example of Pixel Signal Processing Unit>

Figure 2:
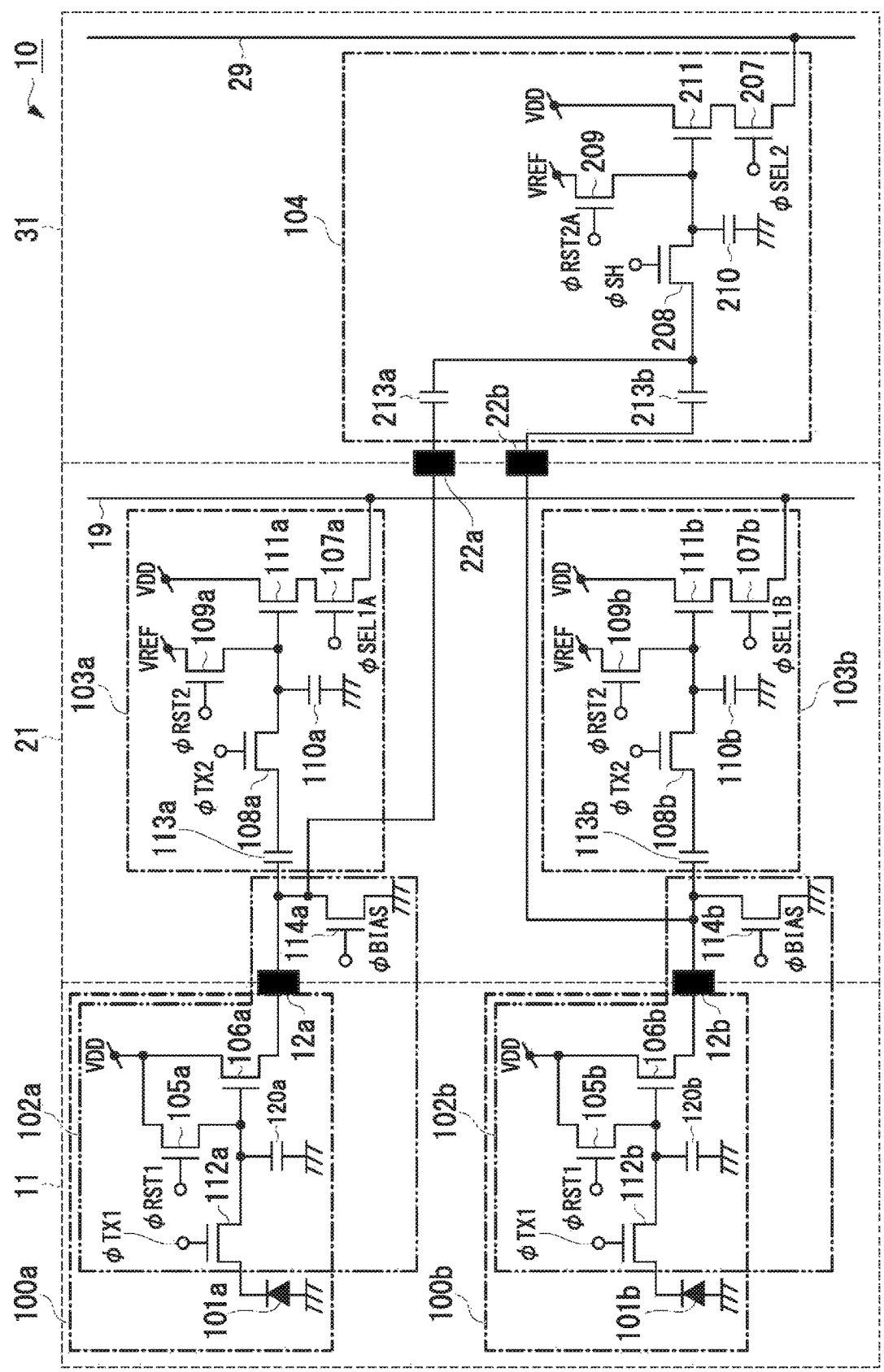
FIG. 2 is a circuit diagram showing a first configuration example of a pixel signal processing unit of the solid-state imaging device according to the first embodiment.

Next, an example of a more specific configuration of the pixel signal processing unit 10 of the solid-state imaging device 1 according to the first embodiment will be described. The pixel signal processing unit 10 in a first configuration example is a configuration example in which signal charges obtained by averaging signal charges are held when the signal charges generated by the photoelectric conversion units 101 are held in the second charge storage circuit 104. FIG. 2 is a circuit diagram showing the first configuration example of the pixel signal processing unit 10 of the solid-state imaging device 1 according to the first embodiment. FIG. 2 shows the solid-state imaging device 1 having a multi-layered substrate structure in which constituent elements of the pixel signal processing unit 10 of the first configuration example are divided into a plurality of substrates. More specifically, the pixel signal processing unit 10 of the solid-state imaging device 1 has a multi-layered substrate structure of three substrates, a photoelectric conversion substrate 11, a first reading substrate 21, and a second reading substrate 31. In the case of the multi-layered substrate structure, signal lines of the substrates are electrically connected by connection unit electrically connecting signal lines between the different substrates (hereinafter referred to as "inter-substrate connection unit").

As the inter-substrate connection unit, for example, bumps or the like manufactured by an evaporation method or a plating method are used. At this time, spaces between the substrates may be filled with an insulation member such as an adhesive. Constituent elements formed on the connected substrates transmit and receive signals via the inter-substrate connection unit.

The structure of the inter-substrate connection unit is not limited to the above-described bump scheme. For example, a through-silicon-via (TSV) scheme can also be used. The structure of the solid-state imaging device 1 is not necessarily limited to the multi-layered substrate structure, but one substrate can also be used, that is, the photoelectric conversion substrate 11, the first reading substrate 21, and the second reading substrate 31 can also be used with a monolithic structure. However, when the foregoing three structures are compared, the number of contacts between the substrates per area can generally be larger in the bump scheme than in the TSV scheme. This is because a circuit may not be disposed in the periphery of a silicon through-electrode in the TSV scheme. In the case of the monolithic structure, it is considered that generated heat is large and power consumption is also large particularly when a solid-state imaging device is operated at a high speed, since circuits are congested. Accordingly, the bump scheme is the most preferable for a solid-state imaging device for a high resolution. However, when the number of contacts between substrates is small by pixel addition or the like, the TSV scheme may be used for connection. When the resolution of a solid-state imaging device is small, the TSV scheme may also be used.

In FIG. 2, in the pixel signal processing unit 10 of the first configuration example, the photoelectric conversion units 101a and 101b, pixel reset transistors 105a and 105b, first amplification transistors 106a and 106b, and charge transmission transistors 112a and 112b are formed in the photoelectric conversion substrate 11. In FIG. 2, node capacitors 120a and 120b are shown by signs of capacitors. The node capacitor 120a is a capacitor that is associated with a node connected to the gate terminal of the first amplification transistor 106a included in the pixel 100a. The node capacitor 120b is a capacitor that is associated with a node connected to the gate terminal of the first amplification transistor 106b included in the pixel 100b.

The pixel 100a is configured to include the photoelectric conversion unit 101a, the pixel reset transistor 105a, the first amplification transistor 106a, the charge transmission transistor 112a, and the node capacitor 120a. The pixel 100b is configured to include the photoelectric conversion unit 101b, the pixel reset transistor 105b, the first amplification transistor 106b, the charge transmission transistor 112b, and the node capacitor 120b.

In FIG. 2, in the pixel signal processing unit 10 of the first configuration example, first clamp transistors 109a and 109b, first sample-hold transistors 108a and 108b, second amplification transistors 111a and 111b, first select transistors 107a and 107b, first charge storage units 110a and 110b, pixel load transistors 114a and 114b, and first noise suppression elements 113a and 113b are formed in the first reading substrate 21. The charge transmission circuit 102a is configured to include the pixel reset transistor 105a, the first amplification transistor 106a, the charge transmission transistor 112a, the node capacitor 120a, and the pixel load transistor 114a. The charge transmission circuit 102b is configured to include the pixel reset transistor 105b, the first amplification transistor 106b, the charge transmission transistor 112b, the node capacitor 120b, and the pixel load transistor 114b. The first charge storage circuit 103a is configured to include the first clamp transistor 109a, the first sample-hold transistor 108a, the second amplification transistor 111a, the first select transistor 107a, the first charge storage unit 110a, and the first noise suppression element 113a. The first charge storage circuit 103b is configured to include the first clamp transistor 109b, the first sample-hold transistor 108b, the second amplification transistor 111b, the first select transistor 107b, the first charge storage unit 110b, and the first noise suppression element 113b.

In FIG. 2, in the pixel signal processing unit 10 of the first configuration example, the second charge storage circuit 104 is formed in the second reading substrate 31. The second charge storage circuit 104 is configured to include a second clamp transistor 209, a second sample-hold transistor 208, a third amplification transistor 211, a second select transistor 207, a second charge storage unit 210, a second noise suppression element 213a, and a second noise suppression element 213b.

The photoelectric conversion substrate 11 and the first reading substrate 21 are connected by first inter-substrate connection units 12a and 12b. The first reading substrate 21 and the second reading substrate 31 are connected by second inter-substrate connection unit 22a and 22b.

More specifically, in the pixel signal processing unit 10 of the first configuration example shown in FIG. 2, the first amplification transistor 106a of the photoelectric conversion substrate 11 is connected to the pixel load transistor 114a and the first noise suppression element 113a of the first reading substrate 21 via the first inter-substrate connection unit 12a. In the pixel signal processing unit 10 of the first configuration example shown in FIG. 2, the first amplification transistor 106b of the photoelectric conversion substrate 11 is connected to the pixel load transistor 114b and the first noise suppression element 113b of the first reading substrate 21 via the first inter-substrate connection unit 12b. In the pixel signal processing unit 10 of the first configuration example shown in FIG. 2, the first amplification transistor 106a of the photoelectric conversion substrate 11 is connected to the second noise suppression element 213a of the second reading substrate 31 via the first inter-substrate connection unit 12a and the second inter-substrate connection unit 22a. In the pixel signal processing unit 10 of the first configuration example shown in FIG. 2, the first amplification transistor 106b of the photoelectric conversion substrate 11 is connected to the second noise suppression element 213b of the second reading substrate 31 via the first inter-substrate connection unit 12b and the second inter-substrate connection unit 22b.

In the first configuration example of the pixel signal processing unit 10 in the solid-state imaging device 1 according to the first embodiment, the structure of the first inter-substrate connection units 12a and 12b electrically connecting the photoelectric conversion substrate 11 to the first reading substrate 21 or the structure of the second inter-substrate connection units 22a and 22b electrically connecting the first reading substrate 21 to the second reading substrate 31 is not particularly defined. Therefore, in the first configuration example of the pixel signal processing unit 10 in the solid-state imaging device 1 according to the first embodiment, for example, the first inter-substrate connection unit 12a, the first inter-substrate connection unit 12b, the second inter-substrate connection unit 22a, and the second inter-substrate connection unit 22b may all be formed as bumps. For example, the first inter-substrate connection unit 12a and the first inter-substrate connection unit 12b may be formed as bumps, the second inter-substrate connection unit 22a, and the second inter-substrate connection unit 22b may be formed as silicon through-electrodes. A monolithic structure in which the constituent elements formed in the photoelectric conversion substrate 11, the first reading substrate 21, and the second reading substrate 31 are formed in one substrate may be formed.

Each of the photoelectric conversion units 101a and 101b is a photodiode that photoelectrically converts incident light to generate and store signal charges.

The charge transmission transistor 112a transmits the signal charges generated and stored by the corresponding photoelectric conversion unit 101a according to a control signal φTX1 input from a vertical scanning circuit (not shown) to the gate terminal of the corresponding first amplification transistor 106a. At this time, the signal charges transmitted by the charge transmission transistor 112a are stored in the corresponding node capacitor 120a. The charge transmission transistor 112b transmits the signal charges generated and stored by the corresponding photoelectric conversion unit 101b according to the control signal φTX1 input from the vertical scanning circuit (not shown) to the gate terminal of the corresponding first amplification transistor 106b. At this time, the signal charges transmitted by the charge transmission transistor 112b are stored in the corresponding node capacitor 120b.

The first amplification transistor 106a outputs the signal charges transmitted to the gate terminal, that is, the signal voltage according to the signal charges stored in the corresponding node capacitor 120a, to the corresponding first inter-substrate connection unit 12a. Accordingly, the signal voltage according to the signal charges generated by the photoelectric conversion unit 101a is output to the first reading substrate 21 via the first inter-substrate connection unit 12a. The signal voltage according to the signal charges generated by the photoelectric conversion unit 101a is also output to the second reading substrate 31 via the second inter-substrate connection unit 22a. The first amplification transistor 106b outputs the signal charges transmitted to the gate terminal, that is, the signal voltage according to the signal charges stored in the corresponding node capacitor 120b, to the corresponding first inter-substrate connection unit 12b. Accordingly, the signal voltage according to the signal charges generated by the photoelectric conversion unit 101b is output to the first reading substrate 21 via the first inter-substrate connection unit 12b. The signal voltage according to the signal charges generated by the photoelectric conversion unit 101b is also output to the second reading substrate 31 via the second inter-substrate connection unit 22b.

Each of the pixel reset transistors 105a and 105b resets the signal charges in the pixel 100a or 100b according to the control signal φRST1 input from the vertical scanning circuit (not shown) to a supply voltage VDD.

The pixel load transistor 114a operates as a load of the first amplification transistor 106a outputting the corresponding signal voltage according to a control signal φBIAS input from the vertical scanning circuit (not shown). The pixel load transistor 114a supplies the corresponding first amplification transistor 106a with a current for driving the first amplification transistor 106a outputting the corresponding signal voltage. The pixel load transistor 114b operates as a load of the first amplification transistor 106b outputting the corresponding signal voltage according to the control signal φBIAS input from the vertical scanning circuit (not shown).

The pixel load transistor 114b supplies the corresponding first amplification transistor 106b with a current for driving the first amplification transistor 106b outputting the corresponding signal voltage.

The first noise suppression element 113a is a capacitor that holds (stores) the signal voltage input from the corresponding first amplification transistor 106a via the first inter-substrate connection unit 12a. The first noise suppression element 113b is a capacitor that holds (stores) the signal voltage input from the corresponding first amplification transistor 106b via the first inter-substrate connection unit 12b.

The first clamp transistor 109a clamps the corresponding first charge storage unit 110a and first noise suppression element 113a to a fixed potential VREF according to a control signal φRST2 input from the vertical scanning circuit (not shown). The first clamp transistor 109b clamps the corresponding first charge storage unit 110b and first noise suppression element 113b to the fixed potential VREF according to the control signal φRST2 input from the vertical scanning circuit (not shown). Accordingly, the first charge storage units 110a and 110b and the first noise suppression elements 113a and 113b hold the clamped fixed potential VREF.

The first sample-hold transistor 108a holds the signal voltage of the corresponding first noise suppression element 113a in the corresponding first charge storage unit 110a according to a control signal φTX2 input from the vertical scanning circuit (not shown). The first sample-hold transistor 108b holds the signal voltage of the corresponding first noise suppression element 113b in the corresponding first charge storage unit 110b according to the control signal φTX2 input from the vertical scanning circuit (not shown).

The first charge storage unit 110a is a capacitor that holds (stores) a signal voltage (a signal subjected to a noise removing process) input via the corresponding first sample-hold transistor 108a. The first charge storage unit 110b is a capacitor that holds (stores) a signal voltage (a signal subjected to a noise removing process) input via the corresponding first sample-hold transistor 108b.

The signal output from the pixel 100a is subjected to a process of removing noise caused by a leakage current (dark current) due to the configuration of the pixel load transistor 114a, the first clamp transistor 109a, the first sample-hold transistor 108a, the first charge storage unit 110a, and the first noise suppression element 113a. Then, the first charge storage unit 110a holds the signal subjected to the noise removing process. The signal output from the pixel 100b is subjected to a process of removing noise caused by a leakage current (dark current) due to the configuration of the pixel load transistor 114b, the first clamp transistor 109b, the first sample-hold transistor 108b, the first charge storage unit 110b, and the first noise suppression element 113b. Then, the first charge storage unit 110b holds the signal subjected to the noise removing process.

As the first charge storage units 110a and 110b, it is preferable to use metal insulator metal (MIM) capacitors or metal oxide semiconductor (MOS) capacitors which are capacitors in which a leakage current (dark current) per unit area is small. Accordingly, it is possible to improve resistance to noise and obtain signals with high quality.

The second amplification transistor 111a outputs the voltage of the gate terminal, that is, the signal voltage according to the signal stored in the corresponding first charge storage unit 110a and subjected to the noise removing process. The second amplification transistor 111b outputs the voltage of the gate terminal, that is, the signal voltage according to the signal stored in the corresponding first charge storage unit 110b and subjected to the noise removing process.

The first select transistor 107a outputs the signal voltage output from the second amplification transistor 111a as a pixel signal (the full-resolution image signal S1) of the pixel included in the solid-state imaging device 1 to a first vertical signal line 19 according to a corresponding control signal φSEL1A input from the vertical scanning circuit (not shown). The first select transistor 107b outputs the signal voltage output from the second amplification transistor 111b as a pixel signal (the full-resolution image signal S1) of the pixel included in the solid-state imaging device 1 to the first vertical signal line 19 according to a corresponding control signal φSEL1B input from the vertical scanning circuit (not shown). Accordingly, the full-resolution image signal S1 according to the signal charges generated by any one of the photoelectric conversion units 101a and 101b included in the pixels is read to the first vertical signal line 19.

The second noise suppression element 213a is a capacitor that holds (stores) the signal voltage input from the corresponding first amplification transistor 106a via the first inter-substrate connection unit 12a and the second inter-substrate connection unit 22a. The second noise suppression element 213b is a capacitor that holds (stores) the signal voltage input from the corresponding first amplification transistor 106b via the first inter-substrate connection unit 12b and the second inter-substrate connection unit 22b.

The second clamp transistor 209 clamps the second charge storage unit 210 and each of the second noise suppression elements 213a and 213b to the fixed potential VREF according to a control signal φRST2A input from the vertical scanning circuit (not shown). Accordingly, the second charge storage unit 210 and each of the second noise suppression elements 213a and 213b is held at the clamped fixed potential VREF.

The second sample-hold transistor 208 holds an intermediate signal voltage of the signal voltages of the second noise suppression elements 213a and 213b, that is, the averaged signal voltage, in the second charge storage unit 210 according to a control signal φSH input from the vertical scanning circuit (not shown).

The second charge storage unit 210 is a capacitor that holds (stores) the signal voltage (the signal subjected to the noise removing process in the second charge storage circuit 104) input via the second sample-hold transistor 208.

A process of removing noise caused due to a leakage current (dark current) is performed in the second charge storage circuit 104 by a configuration of the pixel load transistor 114a formed in the first reading substrate 21, and the second clamp transistor 209, the second sample-hold transistor 208, the second charge storage unit 210, the second noise suppression element 213a, and the second noise suppression element 213b formed in the second charge storage circuit 104. The second charge storage unit 210 holds the signal subjected to the noise removing process.

As the second charge storage unit 210, it is preferable to use an MIM capacitor or an MOS capacitor which is a capacitor in which a leakage current (dark current) per unit area is small, as in the pixels 100a and 100b. Accordingly, it is possible to improve resistance to noise and obtain signals with high quality.

The third amplification transistor 211 outputs the voltage of the gate terminal, that is, the signal voltage according to the signal stored in the second charge storage unit 210 and subjected to the noise removing process.

The second select transistor 207 outputs the signal voltage output from the third amplification transistor 211 as the pixel signal (the reduced image signal S2) obtained by averaging the full-resolution image signals S1 of the pre-determined number of pixels included in the solid-state imaging device 1 to the second vertical signal line 29 according to a control signal φSEL2 input from the vertical scanning circuit (not shown). Accordingly, the reduced image signal S2 according to the signal charges obtained by averaging the charge amounts of the signal charges generated by the photoelectric conversion units 101a and 101b included in the pixels is read to the second vertical signal line 29.

In such a configuration, in the pixel signal processing unit 10 of the first configuration example, the signal voltages according to the signal charges obtained when the two photoelectric conversion units (the photoelectric conversion units 101a and 101b) photoelectrically convert the incident light are read via the corresponding inter-substrate connection units (the first inter-substrate connection units 12a and 12b and the second inter-substrate connection units 22a and 22b) corresponding to the two photoelectric conversion units. In the pixel signal processing unit 10 of the first configuration example, the signals (the signals after the noise removing process) after the noise suppression are held in the charge storage units (the first charge storage units 110a and 110b) corresponding to the two photoelectric conversion units. In the pixel signal processing unit 10 of the first configuration example, signals (signals after the noise removing process) obtained by performing noise suppression on signal voltages according to the signal charges obtained by averaging the charge amounts of the signal charges photoelectrically converted by the two photoelectric conversion units are held in the charge storage unit (the second charge storage unit 210) common to the two photoelectric conversion units. Thereafter, in the solid-state imaging device 1, the signal voltages according to the signals subjected to the noise removing process and stored in the charge storage units (the first charge storage units 110a and 110b and the second charge storage unit 210) of the pixel signal processing unit 10 are sequentially read as the pixel signals to the first vertical signal line 19 and the second vertical signal line 29.

The example of the configuration in which the pixel 100a including the constituent elements including the photoelectric conversion unit 101a and the pixel 100b including the constituent elements including the photoelectric conversion unit 101b are paired in the pixel signal processing unit 10 of the first configuration example shown in FIG. 2 has been described, but the pair of the pixels disposed in the pixel signal processing unit 10 of the solid-state imaging device 1 is not limited to the configuration shown in FIG. 2. That is, one pair of pixels can also be configured by a greater number of pixels than in the configuration shown in FIG. 2. By disposing a plurality of pairs of pixels, it is possible to form a pixel array in the pixel signal processing unit 10 included in the solid-state imaging device 1.

Figure 3:
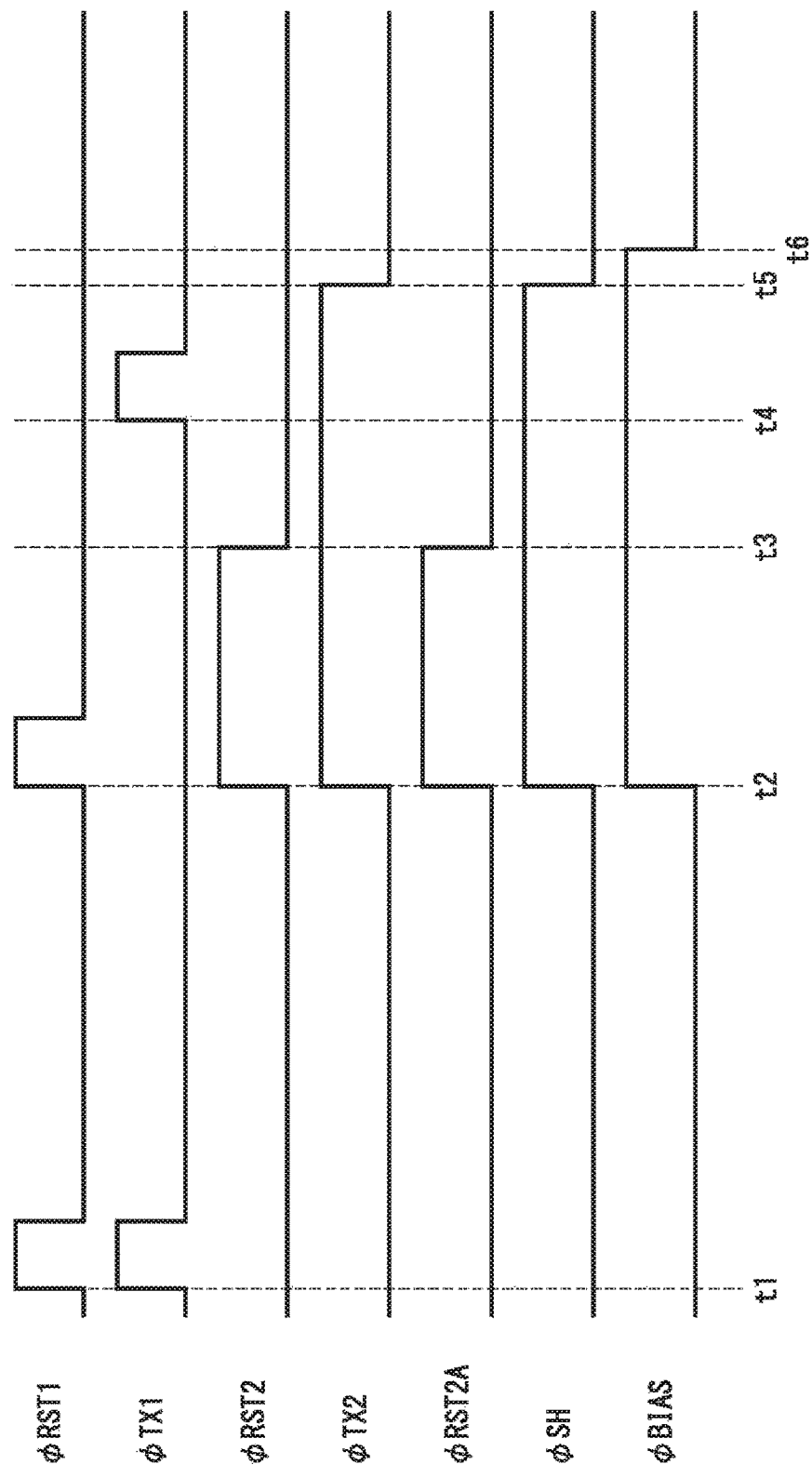
FIG. 3 is a timing chart showing timings at which the pixel signal processing unit of the first configuration example of the solid-state imaging device according to the first embodiment is driven.

Next, driving timings of the pixel signal processing unit 10 of the first configuration example in the solid-state imaging device 1 according to the first embodiment will be described. FIG. 3 is a timing chart showing timings at which the pixel signal processing unit 10 of the first configuration example of the solid-state imaging device 1 according to the first embodiment is driven. The timing chart shown in FIG. 3 shows timings at which the pixels 100a and 100b are simultaneously exposed, and the full-resolution image signal S1 of the pixel 100a and the full-resolution image signal S1 of the pixel 100b are sequentially output to the first vertical signal line 19. Further, the timing chart shown in FIG. 3 shows timings controlled by the vertical scanning circuit (not shown) in an operation of the pixel signal processing unit 10 of the first configuration example in the solid-state imaging device 1 in which the reduced image signal S2 obtained by averaging the full-resolution image signal S1 of the pixel 100a and the full-resolution image signal S1 of the pixel 100b is output to the second vertical signal line 29.

In the pixel signal processing unit 10 of the first configuration example in the solid-state imaging device 1, as shown in FIG. 2, two pixels, the pixels 100a and 100b, are configured as one pair of pixels. The pixel signal processing unit 10 of the first configuration example in the solid-state imaging device 1 includes the first charge storage circuit 103a (including the first charge storage unit 110a) corresponding to the photoelectric conversion unit 101a, the first charge storage circuit 103b (including the first charge storage unit 110b) corresponding to the photoelectric conversion unit 101b, and the second charge storage circuit 104 (including the second charge storage unit 210) common to the two photoelectric conversion units 101a and 101b. Therefore, the timing chart shown in FIG. 3 shows timings at which the signal charges generated by the two photoelectric conversion units 101a and 101b are held in the first charge storage units 110a and 110b and the second charge storage unit 210.

At time t1, all of the pixels (the pixels 100a and 100b) of the pixel signal processing unit 10 are first reset. More specifically, at time t1, the vertical scanning circuit (not shown) simultaneously controls the control signals φTX1 and φRST1 to an "H" level to turn on the charge transmission transistors 112a and 112b and the pixel reset transistors 105a and 105b. Accordingly, the photoelectric conversion unit 101a and the node capacitor 120a included in the pixel 100a and the photoelectric conversion unit 101b and the node capacitor 120b included in the pixel 100b disposed in the pixel signal processing unit 10 are reset.

Thereafter, the vertical scanning circuit (not shown) simultaneously controls the control signals φTX1 and φRST1 to an "L" level to release the resetting of the pixels 100a and 100b. Accordingly, the pixels 100a and 100b disposed in the pixel signal processing unit 10 start to be exposed simultaneously. That is, the photoelectric conversion unit 101a included in the pixel 100a and the photoelectric conversion unit 101b included in the pixel 100b disposed in the pixel signal processing unit 10 start to store signal charges obtained by photoelectrically converting incident light.

Subsequently, after a given time has passed, that is, after any exposure time has passed, from time t2, the charge transmission circuit 102a performs reading of a signal with the reset level and an exposed signal (hereinafter referred to as a "signal with an exposure level") of the corresponding photoelectric conversion unit 101a to the corresponding first inter-substrate connection unit 12a and second inter-substrate connection unit 22a. Then, the first charge storage circuit 103a performs the noise removing process of taking a difference between the signal with the reset level and the signal with the exposure level of the corresponding photoelectric conversion unit 101a. From time t2, the charge transmission circuit 102b performs reading of the signal with the reset level and the signal with the exposure level of the corresponding photoelectric conversion unit 101b to the corresponding first inter-substrate connection unit 12b and the second inter-substrate connection unit 22b. Then, the first charge storage circuit 103b performs the noise removing process of taking a difference between the signal with the reset level and the signal with the exposure level of the corresponding photoelectric conversion unit 101b. The second charge storage circuit 104 performs the noise removing process of taking a difference between an averaged signal with the reset level and an averaged signal with the exposure level.

More specifically, at time t2, the vertical scanning circuit (not shown) controls the control signal ϕBIAS to operate the pixel load transistor 114a as a load of the corresponding first amplification transistor 106a. At time t2, the vertical scanning circuit (not shown) controls the control signal ϕBIAS to operate the pixel load transistor 114b as a load of the corresponding first amplification transistor 106b.

The vertical scanning circuit (not shown) controls the control signal ϕRST1 to the "H" level to turn on the pixel reset transistor 105a and the pixel reset transistor 105b and reset the node capacitors 120a and 120b. Accordingly, the signal voltage with the reset level of the photoelectric conversion unit 101a is output from the first amplification transistor 106a to the first noise suppression element 113a via the first inter-substrate connection unit 12a. Further, the signal voltage with the reset level of the photoelectric conversion unit 101a is output from the first amplification transistor 106a to the second noise suppression element 213a via the first inter-substrate connection unit 12a and the second inter-substrate connection unit 22a. The signal voltage with the reset level of the photoelectric conversion unit 101b is output from the first amplification transistor 106b to the first noise suppression element 113b via the first inter-substrate connection unit 12b. Further, the signal voltage with the reset level of the photoelectric conversion unit 101b is output from the first amplification transistor 106b to the second noise suppression element 213b via the first inter-substrate connection unit 12b and the second inter-substrate connection unit 22b.

The vertical scanning circuit (not shown) controls the control signals ϕRST2 and ϕTX2 to the "H" level to turn on the first clamp transistors 109a and 109b and the first sample-hold transistors 108a and 108b. Accordingly, the first charge storage units 110a and 110b and the first noise suppression elements 113a and 113b are each clamped. The vertical scanning circuit (not shown) controls the control signals ϕRST2A and ϕSH to the "H" level to turn on the second clamp transistor 209 and the second sample-hold transistor 208. Accordingly, the second charge storage unit 210, the second noise suppression element 213a, and the second noise suppression element 213b are each clamped.

Thereafter, the vertical scanning circuit (not shown) controls the control signal ϕRST1 to the "L" level to release the resetting of the node capacitor 120a and the node capacitor 120b. Subsequently, at time t3, the vertical scanning circuit (not shown) controls the control signal ϕRST2 to the "L" level to release the clamping of the first charge storage units 110a and 110b. The vertical scanning circuit (not shown) controls the control signal ϕRST2A to the "L" level to release the clamping of the second charge storage unit 210.

Subsequently, at time t4, the vertical scanning circuit (not shown) controls the control signal ϕTX1 to the "H" level to turn on the charge transmission transistors 112a and 112b. Accordingly, the vertical scanning circuit (not shown) transmits the signal charges stored in the photoelectric conversion unit 101a to the gate terminal of the first amplification transistor 106a and transmits the signal charges stored in the photoelectric conversion unit 101b to the gate terminal of the first amplification transistor 106b. At this time, the signal charges transmitted by the charge transmission transistor 112a are stored in the node capacitor 120a and the signal charges transmitted by the charge transmission transistor 112b are stored in the node capacitor 120b. Accordingly, the signal charges generated by the photoelectric conversion unit 101a, that is, the signal voltage (the signal with the exposure level) according to the signal charges stored in the node capacitor 120a, are output from the first amplification transistor 106a to the first noise suppression element 113a via the first inter-substrate connection unit 12a and are output to the second noise suppression element 213a via the first inter-substrate connection unit 12a and the second inter-substrate connection unit 22a. Further, the signal charges generated by the photoelectric conversion unit 101b, that is, the signal voltage (the signal with the exposure level) according to the signal charges stored in the node capacitor 120b, are output from the first amplification transistor 106b to the first noise suppression element 113b via the first inter-substrate connection unit 12b and are output to the second noise suppression element 213b via the first inter-substrate connection unit 12b and the second inter-substrate connection unit 22b.

The first noise suppression element 113a outputs a voltage of a difference between the signal voltage with the reset level and the signal voltage with the exposure level of the photoelectric conversion unit 101a, that is, the signal voltage subjected to the noise removing process. Similarly, the first noise suppression element 113b outputs the signal voltage of the photoelectric conversion unit 101b subjected to the noise removing process. Similarly, the second noise suppression element 213a outputs the signal voltage of the photoelectric conversion unit 101a subjected to the noise removing process. Similarly, the second noise suppression element 213b outputs the signal voltage of the photoelectric conversion unit 101b subjected to the noise removing process.

Thereafter, the vertical scanning circuit (not shown) controls the control signal ϕTX1 to the "L" level to stop the transmission of the signal charges stored in the photoelectric conversion unit 101a to the gate terminal of the first amplification transistor 106a and stop the transmission of the signal charges stored in the photoelectric conversion unit 101b to the gate terminal of the first amplification transistor 106b.

Subsequently, at time t5, the vertical scanning circuit (not shown) controls the control signal ϕTX2 to the "L" level to stop the sampling and holding of the first charge storage unit 110a and stop the sampling and holding of the first charge storage unit 110b. Accordingly, the first charge storage unit 110a holds the signal voltage subjected to the noise removing process and output by the first noise suppression element 113a and the photoelectric conversion unit 101b holds the signal voltage subjected to the noise removing process and output by the first noise suppression element 113b. The vertical scanning circuit (not shown) controls the control signal ϕSH to the "L" level to stop the sampling and holding of the second charge storage unit 210. Accordingly, the second charge storage unit 210 holds the intermediate signal voltage of the signal voltages subjected to the noise removing process and output by the second noise suppression elements 213a and 213b, that is, the averaged signal voltage.

As described above, the signal charges generated by the photoelectric conversion unit 101a included in the pixel 100a disposed in the pixel signal processing unit 10 are subjected to the noise removing process and held in the first charge storage unit 110a. Similarly, the signal charges generated by the photoelectric conversion unit 101b included in the pixel 100b are subjected to the noise removing process and held (stored) in the first charge storage unit 110b. The signal charges obtained by averaging the charge amount of the signal charges generated by the photoelectric conversion unit 101a included in the pixel 100a and the charge amount of the signal charges generated by the photoelectric conversion unit 101b included in the pixel 100b disposed in the pixel signal processing unit 10 are subjected to the noise removing process and held (stored) in the second charge storage unit 210.

Subsequently, at time t6, the vertical scanning circuit (not shown) controls the control signal ϕBIAS to stop the operation of the pixel load transistor 114a operating as the load of the corresponding first amplification transistor 106a and stops the operation of the pixel load transistor 114b operating as the load of the corresponding first amplification transistor 106b.

Thereafter, the vertical scanning circuit (not shown) sequentially controls the control signals ϕSEL1A and ϕSEL1B to sequentially output the signal voltages subjected to the noise removing process and held in the first charge storage units 110a and 110b as the full-resolution image signals S1 of the pixels to the first vertical signal line 19. The vertical scanning circuit (not shown) controls the control signal ϕSEL2 to output the averaged signal voltage subjected to the noise removing process and held in the second charge storage unit 210 as the reduced image signal S2 in which the number of pixels is reduced to the second vertical signal line 29.

In the first configuration example of the pixel signal processing unit 10 in the solid-state imaging device 1, output sequences of the full-resolution image signals S1 of all the pixels included in the pixel signal processing unit 10 and the reduced image signals S2 in which the number of pixels included in the pixel signal processing unit 10 is reduced are not particularly defined. Therefore, in the first configuration example of the pixel signal processing unit 10 in the solid-state imaging device 1, for example, the full-resolution image signals S1 can also be output subsequently to the reduced image signals S2. Accordingly, a detailed description of timings at which the vertical scanning circuit (not shown) controls the control signals ϕSEL1A, ϕSEL1B, and ϕSEL2 and outputs the full-resolution image signals S1 to the first vertical signal line 19 or timings at which the vertical scanning circuit (not shown) outputs the reduced image signals S2 to the second vertical signal line 29 will be omitted.

In the pixel signal processing unit 10 of the first configuration example, at these driving timings, the signal voltages according to the signal charges obtained when two photoelectric conversion units (the photoelectric conversion units 101a and 101b) photoelectrically convert incident light are read to the inter-substrate connection unit (the first inter-substrate connection units 12a and 12b and the second inter-substrate connection unit 22a and 22b) corresponding to the two photoelectric conversion units. In the pixel signal processing unit 10 of the first configuration example, at these driving timings, the signals subjected to the noise removing process are held in the charge storage units (the first charge storage units 110a and 110b) corresponding to the two photoelectric conversion units. At the driving timings of the pixel signal processing unit 10 of the first configuration example, each signal subjected to the noise removing process according to the signal charges obtained by averaging the charge amounts of the signal charges photoelectrically converted by the two photoelectric conversion units is held in the charge storage unit (the second charge storage unit 210) common to the two photoelectric conversion units. Then, in the solid-state imaging device 1, the signal voltages according to the signals subjected to the noise removing process and stored in the charge storage units (the first charge storage units 110a and 110b and the second charge storage unit 210) of the pixel signal processing unit 10 are output as the full-resolution image signals S1 to the first vertical signal line 19 and are output as the reduced image signals S2 to the second vertical signal line 29.

In the pixel signal processing unit 10 of the first configuration example in the solid-state imaging device 1 according to the first embodiment, the signal charges of the photoelectric conversion unit 101a included in the pixel 100a are subjected to the noise removing process and held in the first charge storage unit 110a, and the signal charges of the photoelectric conversion unit 101b included in the pixel 100b are subjected to the noise removing process and held in the first charge storage unit 110b. Further, in the pixel signal processing unit 10 of the first configuration example in the solid-state imaging device 1 according to the first embodiment, the signal charges are averaged, subjected to the noise removing process, and held in the second charge storage unit 210. That is, in the pixel signal processing unit 10 of the first configuration example in the solid-state imaging device 1 according to the first embodiment, the signal voltages subjected to the noise removing process are held separately in the charge storage unit 110a included in the pixel 100a, the first charge storage unit 110b included in the pixel 100b, and the second charge storage unit 210 corresponding to the pixels 100a and 100b. In the pixel signal processing unit 10 of the first configuration example in the solid-state imaging device 1 according to the first embodiment, the full-resolution image signals S1 according to the signal voltages held in the first charge storage units 110a and 110b are output to the first vertical signal line 19 and the reduced image signals S2 according to the signal voltages held in the second charge storage unit 210 are output to the second vertical signal line 29. That is, in the pixel signal processing unit 10 of the first configuration example in the solid-state imaging device 1 according to the first embodiment, both of the pixel signal (the full-resolution image signal S1) of all the pixels included in the pixel signal processing unit 10 and the pixel signal (the reduced image signal S2) in which the number of pixels included in the pixel signal processing unit 10 is reduced can be independently output.

<Second Configuration Example of Pixel Signal Processing Unit>

Next, an example of another configuration of the pixel signal processing unit 10 of the solid-state imaging device 1 according to the first embodiment will be described. The pixel signal processing unit 10 in a second configuration example has a configuration example in which signal charges generated by the photoelectric conversion units 101 are held in the second charge storage circuit 104 and the signal charges are subsequently averaged and output when the signal voltages (the reduced image signals S2) according to the held signal charges are output. As in the pixel signal processing unit 10 of the first configuration example, the pixel signal processing unit 10 of the second configuration example has a multi-layered substrate structure in which constituent elements included in the pixel signal processing unit 10 are separated and formed in three substrates, a photoelectric conversion substrate, a first reading substrate, and a second reading substrate. In the multi-layered substrate structure of the pixel signal processing unit 10 of the second configuration example, the number of inter-substrate connection unit connecting the first reading substrate to the second substrate is smaller than the number of inter-substrate connection unit of the pixel signal processing unit 10 of the first configuration example. Therefore, in the pixel signal processing unit 10 of the second configuration example, multiplexers are included in the pixel signal processing unit 10 as constituent elements for fewer inter-substrate connection unit between the first and second reading substrates. In the pixel signal processing unit 10 of the second configuration example, the full-resolution image signals S1 of the pixels included in the pixel signal processing unit 10 are averaged by controlling the multiplexers included in the pixel signal processing unit 10, as in the pixel signal processing unit 10 of the first configuration example.

The pixel signal processing unit 10 of the second configuration example also includes the same constituent elements as the pixel signal processing unit 10 of the first configuration example. Accordingly, in the constituent elements of the pixel signal processing unit 10 of the second configuration example, the same reference numerals are given to the same constituent elements as the constituent elements of the pixel signal processing unit 10 of the first configuration example and a detailed description of the constituent elements will be omitted.

Figure 4:
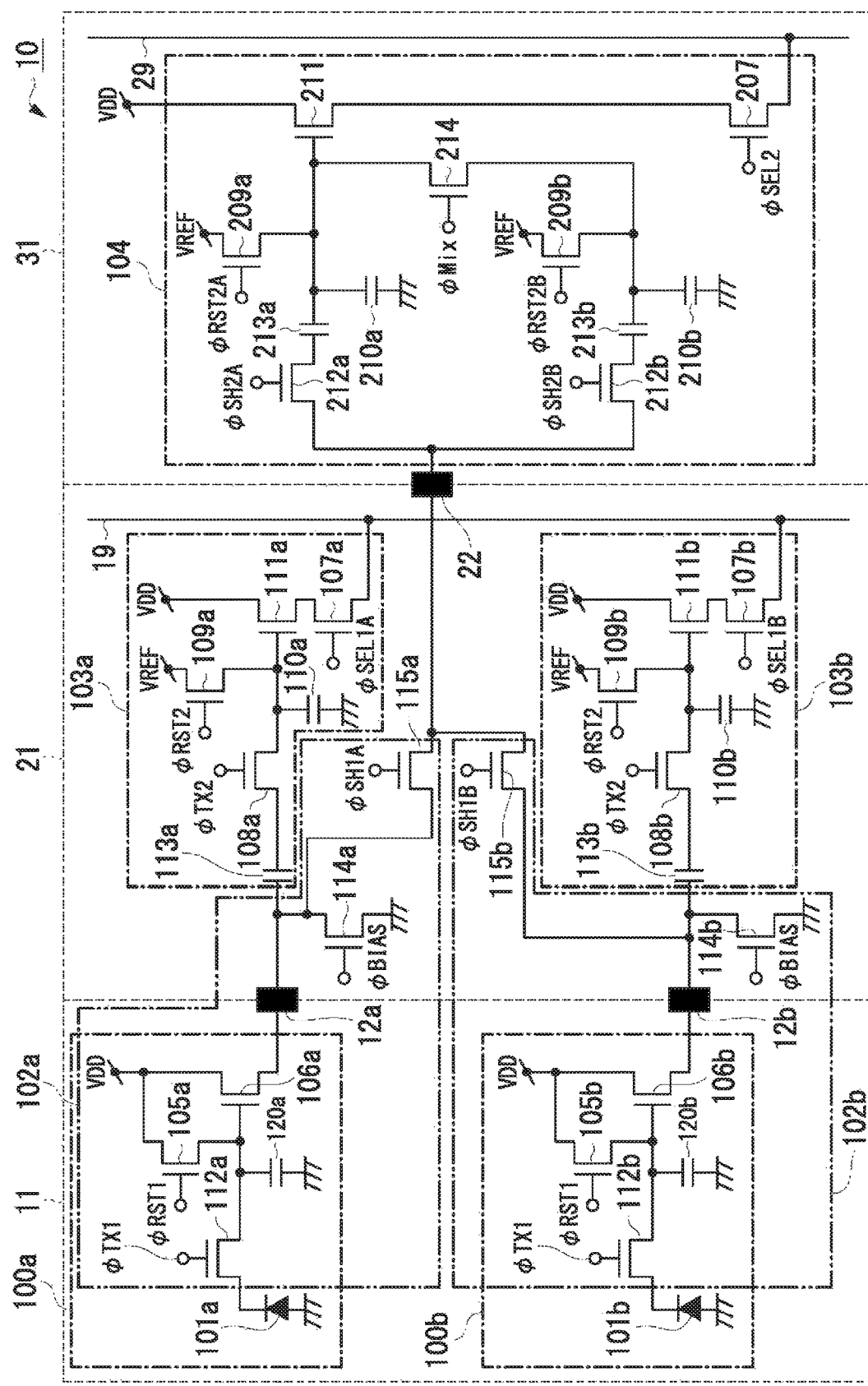
FIG. 4 is a circuit diagram showing a second configuration example of a pixel signal processing unit of the solid-state imaging device according to the first embodiment.

FIG. 4 is a circuit diagram showing the second configuration example of the pixel signal processing unit 10 of the solid-state imaging device 1 according to the first embodiment. In FIG. 4, in the pixel signal processing unit 10 of the second configuration example, photoelectric conversion units 101a and 101b, pixel reset transistors 105a and 105b, first amplification transistors 106a and 106b, and charge transmission transistors 112a and 112b are formed in the photoelectric conversion substrate 11. In FIG. 4, node capacitors 120a and 120b are also shown by signs of capacitors, as in the photoelectric conversion substrate 11 of the pixel signal processing unit 10 of the first configuration example. The pixel 100a is configured to include the photoelectric conversion unit 101a, the pixel reset transistor 105a, the first amplification transistor 106a, the charge transmission transistor 112a, and the node capacitor 120a. The pixel 100b is configured to include the photoelectric conversion unit 101b, the pixel reset transistor 105b, the first amplification transistor 106b, the charge transmission transistor 112b, and the node capacitor 120b. The photoelectric conversion substrate 11 is the same as the photoelectric conversion substrate 11 of the pixel signal processing unit 10 of the first configuration example.

In FIG. 4, in the pixel signal processing unit 10 of the second configuration example, first clamp transistors 109a and 109b, first sample-hold transistors 108a and 108b, second amplification transistors 11a and 11b, first select transistors 107a and 107b, first charge storage units 110a and 110b, pixel load transistors 114a and 114b, and first noise suppression elements 113a and 113b are formed in the first reading substrate 21. Further, in the pixel signal processing unit 10 of the second configuration example, a multiplexer configured to include pixel select transistors 115a and 115b is formed in the first reading substrate 21. The charge transmission circuit 102a is configured to include the pixel reset transistor 105a, the first amplification transistor 106a, the charge transmission transistor 112a, the node capacitor 120a, the pixel load transistor 114a, and the pixel select transistor 115a. The charge transmission circuit 102b is configured to include the pixel reset transistor 105b, the first amplification transistor 106b, the charge transmission transistor 112b, the node capacitor 120b, the pixel load transistor 114b, and the pixel select transistor 115b. The first charge storage circuit 103a is configured to include the first clamp transistor 109a, the first sample-hold transistor 108a, the second amplification transistor 111a, the first select transistor 107a, the first charge storage unit 110a, and the first noise suppression element 113a. The first charge storage circuit 103b is configured to include the first clamp transistor 109b, the first sample-hold transistor 108b, the second amplification transistor 111b, the first select transistor 107b, the first charge storage unit 110b, and the first noise suppression element 113b. In the constituent elements formed in the first reading substrate 21, the constituent elements other than the multiplexer are the same as the constituent elements formed in the first reading substrate 21 of the pixel signal processing unit 10 of the first configuration example.

In FIG. 4, in the pixel signal processing unit 10 of the second configuration example, the second charge storage circuit 104 is formed in the second reading substrate 31. The second charge storage circuit 104 is configured to include a second clamp transistor 209a, a second charge storage unit 210a, a second noise suppression element 213a, and a pixel select transistor 212a corresponding to the pixel 100a, a second clamp transistor 209b, a second charge storage unit 210b, a second noise suppression element 213b, and a pixel select transistor 212b corresponding to the pixel 100b, a third amplification transistor 211, a second select transistor 207, and an averaging switch transistor 214. In the second reading substrate 31, a demultiplexer corresponding to the multiplexer formed in the first reading substrate 21 is configured by the pixel select transistor 212a and the pixel select transistor 212b.

The photoelectric conversion substrate 11 and the first reading substrate 21 are connected by first inter-substrate connection units 12a and 12b. The first reading substrate 21 and the second reading substrate 31 are connected by a second inter-substrate connection unit 22.

More specifically, in the pixel signal processing unit 10 of the second configuration example shown in FIG. 4, the first amplification transistor 106a of the photoelectric conversion substrate 11 is connected to the pixel load transistor 114a, the first noise suppression element 113a, and the pixel select transistor 115a of the first reading substrate 21 via the first inter-substrate connection unit 12a. In the pixel signal processing unit 10 of the second configuration example shown in FIG. 4, the first amplification transistor 106b of the photoelectric conversion substrate 11 is connected to the pixel load transistor 114b, the first noise suppression element 113b, and the pixel select transistor 115b of the first reading substrate 21 via the first inter-substrate connection unit 12b. In the pixel signal processing unit 10 of the second configuration example shown in FIG. 4, the pixel select transistor 115a and the pixel select transistor 115b of the first reading substrate 21 are connected to the pixel select transistor 212a and the pixel select transistor 212b of the second reading substrate 31 via the second inter-substrate connection unit 22. Accordingly, the signal voltages according to the signal charges generated by the photoelectric conversion units 101a and 101b are output to the second reading substrate 31 via the multiplexer formed in the first reading substrate 21 and the second inter-substrate connection unit 22.

In the second configuration example of the pixel signal processing unit 10 in the solid-state imaging device 1 according to the first embodiment, the structure of the first inter-substrate connection units 12a and 12b electrically connecting the photoelectric conversion substrate 11 to the first reading substrate 21 or the structure of the second inter-substrate connection unit 22 electrically connecting the first reading substrate 21 to the second reading substrate 31 is not particularly defined, as in the pixel signal processing unit 10 of the first configuration example.

Each of the pixel select transistors 115a and 115b outputs one of the signal voltage input from the first amplification transistor 106a via the first inter-substrate connection unit 12*a* and the signal voltage input from the first amplification transistor 106*b* via the first inter-substrate connection unit 12*b*, to the second inter-substrate connection unit 22 according to a corresponding control signal φSH1A or φSH1B input from a vertical scanning circuit (not shown). That is, in the pixel signal processing unit 10 of the second configuration example, the pixel select transistors 115*a* and 115*b* are configured to operate as the multiplexer that selects signal charges from one of two signal voltages. Accordingly, the signal voltage according to the signal charges generated by one photoelectric conversion unit between the photoelectric conversion units 101*a* and 101*b* included in the pixels is output to the second reading substrate 31 via the second inter-substrate connection unit 22.

Each of the pixel select transistors 212*a* and 212*b* outputs the signal voltage input via the second inter-substrate connection unit 22 to the corresponding second noise suppression element 213*a* or 213*b* according to a corresponding control signal φSH2A or φSH2B input from the vertical scanning circuit (not shown) to hold the signal voltage. That is, in the pixel signal processing unit 10 of the second configuration example, the pixel select transistors 212*a* and 212*b* are configured to operate as the demultiplexer that outputs the one input signal voltage to one of the corresponding second noise suppression elements 213*a* and 213*b*. Accordingly, the signal voltages according to the signal charges generated by the photoelectric conversion units 101*a* and 101*b* included in the pixels are held in the corresponding second noise suppression elements 213*a* and 213*b*.

Each of the second noise suppression elements 213*a* and 213*b* is capacitor that holds (stores) the signal voltage output from the corresponding pixel select transistor 212*a* or 212*b*.

Each of the second clamp transistors 209*a* and 209*b* clamps the corresponding second charge storage unit 210*a* or 210*b* and the corresponding second noise suppression element 213*a* or 213*b* to a fixed potential VREF according to a corresponding control signal φRST2A or φRST2B input from the vertical scanning circuit (not shown). Accordingly, the second charge storage units 210*a* and 210*b* and the second noise suppression elements 213*a* and 213*b* hold the clamped fixed potential VREF.

The second charge storage unit 210*a* is a capacitor that holds (stores) a signal voltage (a signal subjected to a noise removing process in the second charge storage circuit 104) held by the corresponding second noise suppression element 213*a*. The second charge storage unit 210*b* is a capacitor that holds (stores) a signal voltage (a signal subjected to a noise removing process in the second charge storage circuit 104) held by the corresponding second noise suppression element 213*a*.

In the second charge storage circuit 104 of the second configuration example, a process of removing noise caused due to a leakage current (dark current) by the configuration of the second clamp transistor 209*a*, the second charge storage unit 210*a*, and the second noise suppression element 213*a* is performed in the second charge storage circuit 104. The second charge storage unit 210*a* holds the signal subjected to the noise removing process. In the second charge storage circuit 104 of the second configuration example, a process of removing noise caused due to a leakage current (dark current) by the configuration of the second clamp transistor 209*b*, the second charge storage unit 210*b*, and the second noise suppression element 213*b* is performed in the second charge storage circuit 104. The second charge storage unit 210*b* holds the signal subjected to the noise removing process.

As the second charge storage units 210*a* and 210*b*, it is preferable to use MIM capacitors or MOS capacitors which are capacitors in which a leakage current (dark current) per unit area is small, as in the second charge storage unit 210 of the first configuration example. Accordingly, it is possible to improve resistance to noise and obtain signals with high quality.

The averaging switch transistor 214 short-circuits the second charge storage units 210*a* and 210*b* according to a control signal φMix input from the vertical scanning circuit (not shown). Accordingly, in the short-circuited second charge storage units 210*a* and 210*b*, an intermediate signal voltage of the signal voltages subjected to the noise removing process and held before the short-circuit, that is, an averaged signal voltage, is held.

The third amplification transistor 211 is short-circuited by the voltage of the gate terminal, that is, the averaging switch transistor 214, and thus outputs a signal voltage according to the signal subjected to the noise removing process and obtained by averaging the signal voltages held in the second charge storage units 210*a* and 210*b*.

In such a configuration, in the pixel signal processing unit 10 of the second configuration example, the signal voltages according to the signal charges obtained when two photoelectric conversion units (the photoelectric conversion units 101*a* and 101*b*) photoelectrically convert the incident light are read via the inter-substrate connection units (the first inter-substrate connection units 12*a* and 12*b*) corresponding to the two photoelectric conversion units. In the pixel signal processing unit 10 of the second configuration example, the signals after the noise removing process are held in the charge storage units (the first charge storage units 110*a* and 110*b*) corresponding to the two photoelectric conversion units. In the pixel signal processing unit 10 of the second configuration example, the signal voltages according to the signal charges obtained through the photoelectric conversion by the two photoelectric conversion units are selected by the multiplexer (the pixel select transistors 115*a* and 115*b*) to be output to the second inter-substrate connection unit 22. In the pixel signal processing unit 10 of the second configuration example, the signal voltages according to the signal charges obtained through the photoelectric conversion by the two photoelectric conversion units are separated by the demultiplexer (the pixel select transistors 212*a* and 212*b*). In the pixel signal processing unit 10 of the second configuration example, the signals after the noise removing process are held in the charge storage units (the second charge storage units 210*a* and 210*b*) corresponding to the two photoelectric conversion units. Thereafter, in the pixel signal processing unit 10 of the second configuration example, the signals held in the charge storage units (the second charge storage units 210*a* and 210*b*) corresponding to the two photoelectric conversion units are averaged. Thereafter, in the solid-state imaging device 1, the signal voltages according to the signals subjected to the noise removing process and stored in the charge storage units (the first charge storage units 110*a* and 110*b*) of the pixel signal processing unit 10 and the averaged signal voltages are sequentially read as the pixel signals (the full-resolution image signals S1 and the reduced image signals S2) to the first vertical signal line 19 and the second vertical signal line 29.

The example of the configuration in which the pixel 100*a* including the constituent elements including the photoelectric conversion unit 101*a* and the pixel 100*b* including the constituent elements including the photoelectric conversion unit 101*b* are paired in the pixel signal processing unit 10 of the second configuration example shown in FIG. 4 has been described, but the pair of the pixels disposed in the pixel signal processing unit 10 of the solid-state imaging device 1 are not limited to the configuration shown in FIG. 4, as in the pixel signal processing unit 10 of the first configuration example. That is, one pair of pixels can also be configured by a greater number of pixels than in the configuration shown in FIG. 4. By disposing a plurality of pairs of pixels, it is possible to form a pixel array in the pixel signal processing unit 10 included in the solid-state imaging device 1.

Figure 5:
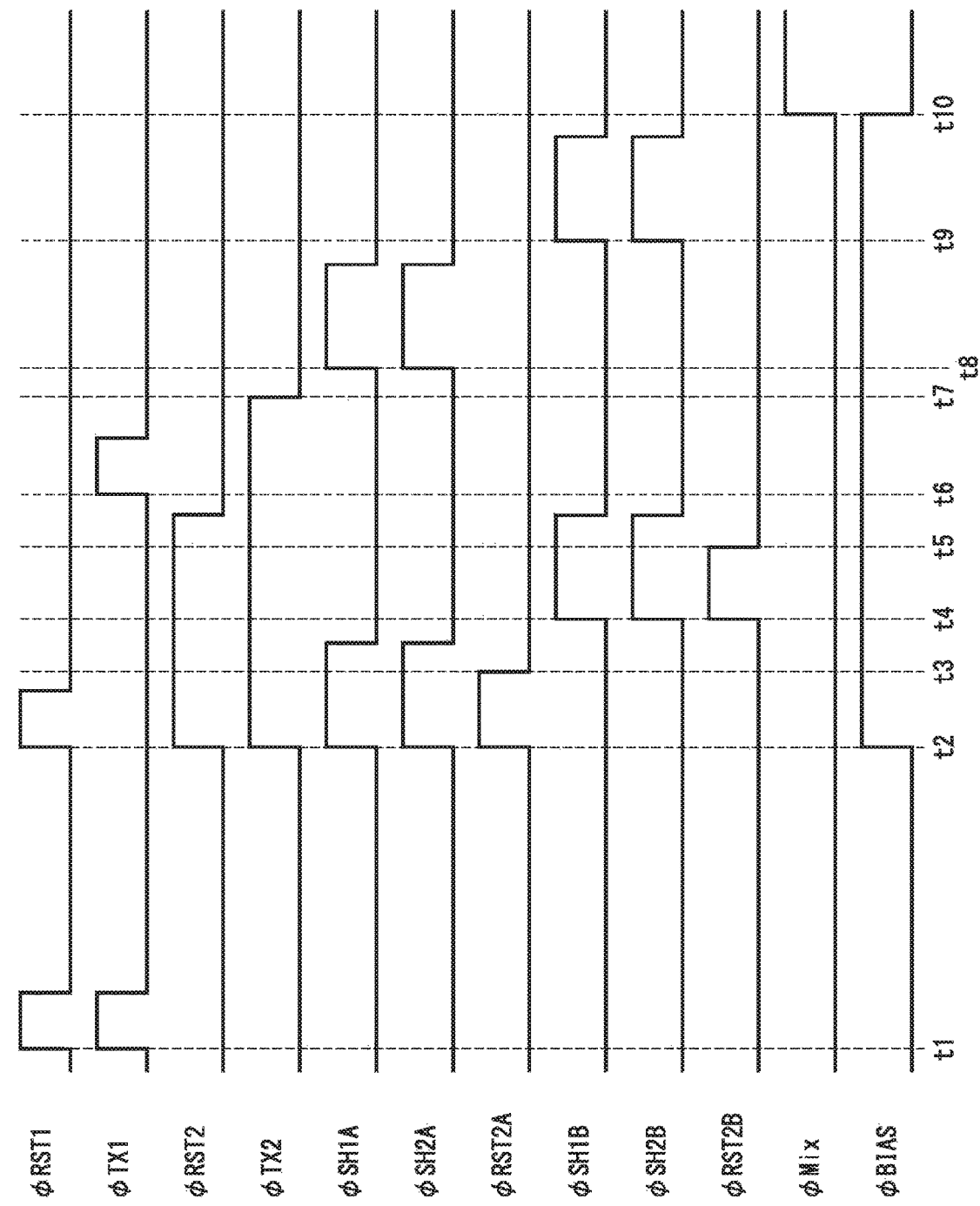
FIG. 5 is a timing chart showing timings at which the pixel signal processing unit of the second configuration example of the solid-state imaging device according to the first embodiment is driven.

Next, driving timings of the pixel signal processing unit 10 of the second configuration example in the solid-state imaging device 1 according to the first embodiment will be described. FIG. 5 is a timing chart showing timings at which the pixel signal processing unit 10 of the second configuration example of the solid-state imaging device 1 according to the first embodiment is driven. The timing chart shown in FIG. 5 shows timings of the pixel signal processing unit 10 of the first configuration example shown in FIG. 3 and driving timings controlled by the vertical scanning circuit (not shown) in an operation of the pixel signal processing unit 10 of the second configuration example in the solid-state imaging device 1 in which the pixels 100a and 100b are simultaneously exposed and the full-resolution image signal S1 of the pixel 100a and the full-resolution image signal S1 of the pixel 100b are sequentially output to the first vertical signal line 19 and in which the reduced image signal S2 obtained by averaging the full-resolution image signal S1 of the pixel 100a and the full-resolution image signal S1 of the pixel 100b are output to the second vertical signal line 29.

In the pixel signal processing unit 10 of the second configuration example in the solid-state imaging device 1, as shown in FIG. 4, two pixels, the pixels 100a and 100b, are configured as one pair of pixels. The pixel signal processing unit 10 of the second configuration example in the solid-state imaging device 1 includes the first charge storage circuit 103a (including the first charge storage unit 110a) corresponding to the photoelectric conversion unit 101a, the first charge storage circuit 103b (including the first charge storage unit 110b) corresponding to the photoelectric conversion unit 101b, and the second charge storage circuit 104 (including the second charge storage units 210a and 210b) common to the two photoelectric conversion units 101a and 101b. Therefore, the timing chart shown in FIG. 5 shows timings at which the signal charges generated by the two photoelectric conversion units 101a and 101b are held in the first charge storage units 110a and 110b and the second charge storage units 210a and 210b.

At time t1, all of the pixels (the pixels 100a and 100b) of the pixel signal processing unit 10 are first reset. More specifically, at time t1, the vertical scanning circuit (not shown) simultaneously controls the control signals φTX1 and φRST1 to the "H" level to turn on the charge transmission transistors 112a and 112b and the pixel reset transistors 105a and 105b. Accordingly, the photoelectric conversion unit 101a and the node capacitor 120a included in the pixel 100a and the photoelectric conversion unit 101b and the node capacitor 120b included in the pixel 100b disposed in the pixel signal processing unit 10 are reset.

Thereafter, the vertical scanning circuit (not shown) simultaneously controls the control signals φTX1 and φRST1 to the "L" level to release the resetting of the pixels 100a and 100b. Accordingly, the pixels 100a and 100b disposed in the pixel signal processing unit 10 start to be exposed simultaneously. That is, the photoelectric conversion unit 101a included in the pixel 100a and the photoelectric conversion unit 101b included in the pixel 100b disposed in the pixel signal processing unit 10 start to store signal charges obtained by photoelectrically converting incident light.

Subsequently, after a given time has passed, that is, after any exposure time has passed, from time t2, the charge transmission circuit 102a performs reading of a signal with the reset level and a signal with an exposed level of the corresponding photoelectric conversion unit 101a to the corresponding first inter-substrate connection unit 12a. Then, the first charge storage circuit 103a performs the noise removing process of taking a difference between the signal with the reset level and the signal with the exposure level of the corresponding photoelectric conversion unit 101a. From time t2, the charge transmission circuit 102a sequentially performs reading of the signal with the reset level and the signal with the exposure level of the corresponding photoelectric conversion unit 101a to the second inter-substrate connection unit 22. From time t2, the charge transmission circuit 102b performs reading of the signal with the reset level and the signal with the exposure level of the corresponding photoelectric conversion unit 101b to the corresponding first inter-substrate connection unit 12b. Then, the first charge storage circuit 103b performs the noise removing process of taking a difference between the signal with the reset level and the signal with the exposure level of the corresponding photoelectric conversion unit 101b. From time t2, the charge transmission circuit 102b sequentially performs reading of the signal with the reset level and the signal with the exposure level of the corresponding photoelectric conversion unit 101b to the second inter-substrate connection unit 22. The second charge storage circuit 104 sequentially performs the noise removing process of taking a difference between the signal with the reset level and the signal with the exposure level of the pixel 100a and the noise removing process of taking a difference between the signal with the reset level and the signal with the exposure level of the pixel 100b.

More specifically, at time t2, the vertical scanning circuit (not shown) controls the control signal φBIAS to operate the pixel load transistor 114a as a load of the corresponding first amplification transistor 106a. At time t2, the vertical scanning circuit (not shown) controls the control signal φBIAS to operate the pixel load transistor 114b as a load of the corresponding first amplification transistor 106b.

The vertical scanning circuit (not shown) controls the control signal φRST1 to the "H" level to turn on the pixel reset transistors 105a and 105b and reset the node capacitors 120a and 120b. Accordingly, the signal voltage with the reset level of the photoelectric conversion unit 101a is output from the first amplification transistor 106a to the first noise suppression element 113a via the first inter-substrate connection unit 12a. Further, the signal voltage with the reset level of the photoelectric conversion unit 101a is output from the first amplification transistor 106a to the pixel select transistor 115a. The signal voltage with the reset level of the photoelectric conversion unit 101b is output from the first amplification transistor 106b to the first noise suppression element 113b via the first inter-substrate connection unit 12b. Further, the signal voltage with the reset level of the photoelectric conversion unit 101b is output from the first amplification transistor 106b to the pixel select transistor 115b.

The vertical scanning circuit (not shown) controls the control signals φSH1A and φSH2A to the "H" level to turn on the pixel select transistor 115a and the pixel select transistor 212a. Accordingly, the signal voltage with the reset level of the photoelectric conversion unit 101a output from the first amplification transistor 106a to the pixel select transistor 115a via the first inter-substrate connection unit 12a is selected and output to the second noise suppression element 213a via the pixel select transistor 115a, the second inter-substrate connection unit 22, and the pixel select transistor 212a.

The vertical scanning circuit (not shown) controls the control signals φRST2 and φTX2 to the "H" level to turn on the first clamp transistors 109a and 109b and the first sample-hold transistors 108a and 108b. Accordingly, the first charge storage units 110a and 110b and the first noise suppression elements 113a and 113b are each clamped. The vertical scanning circuit (not shown) controls the control signal φRST2A to the "H" level to turn on the second clamp transistor 209a. Accordingly, the second charge storage unit 210a and the second noise suppression element 213a are each clamped.

Thereafter, the vertical scanning circuit (not shown) controls the control signal φRST1 to the "L" level to release the resetting of the node capacitor 120a and the node capacitor 120b. Subsequently, at time t3, the vertical scanning circuit (not shown) controls the control signal φRST2A to the "L" level to release the clamping of the second charge storage unit 210a. Thereafter, the vertical scanning circuit (not shown) controls the control signals φSH1A and φSH2A to the "L" level to turn off the pixel select transistor 115a and the pixel select transistor 212a and release the selection of the signal voltage with the reset level of the photoelectric conversion unit 101a.

Subsequently, at time t4, the vertical scanning circuit (not shown) controls the control signals φSH1B and φSH2B to the "H" level to turn on the pixel select transistors 115b and 212b. Accordingly, the signal voltage with the reset level of the photoelectric conversion unit 101b output from the first amplification transistor 106b to the pixel select transistor 115b via the first inter-substrate connection unit 12b is selected and output to the second noise suppression element 213b via the pixel select transistor 115b, the second inter-substrate connection unit 22, and the pixel select transistor 212b. The vertical scanning circuit (not shown) controls the control signal φRST2B to the "H" level to turn on the second clamp transistor 209b. Accordingly, the second charge storage unit 210b and the second noise suppression element 213b are each clamped.

Subsequently, at time t5, the vertical scanning circuit (not shown) controls the control signal φRST2B to the "L" level to release the clamping of the second charge storage unit 210b. Thereafter, the vertical scanning circuit (not shown) controls the control signals φSH1B and φSH2B to the "L" level to turn off the pixel select transistors 115b and 212b and release the selection of the signal voltage of the reset level of the photoelectric conversion unit 101b. The vertical scanning circuit (not shown) controls the control signal φRST2 to the "L" level to release the clamping of the first charge storage unit 110a and the first charge storage unit 110b.

Subsequently, at time t6, the vertical scanning circuit (not shown) controls the control signal φTX1 to the "H" level to turn on the charge transmission transistor 112a and transmit the signal charges stored in the photoelectric conversion unit 101a to the gate terminal of the first amplification transistor 106a. At this time, the signal charges transmitted by the charge transmission transistor 112a are stored in the node capacitor 120a. At time t6, the vertical scanning circuit (not shown) controls the control signal φTX1 to the "H" level to turn on the charge transmission transistor 112b and to transmit the signal charges stored in the photoelectric conversion unit 101b to the gate terminal of the first amplification transistor 106b. At this time, the signal charges transmitted by the charge transmission transistor 112b are stored in the node capacitor 120b. Accordingly, the signal charges generated by the photoelectric conversion unit 101a, that is, the signal voltage (the signal with the exposure level) according to the signal charges stored in the node capacitor 120a, are output from the first amplification transistor 106a to the first noise suppression element 113a via the first inter-substrate connection unit 12a and output to the pixel select transistor 115a. Further, the signal charges generated by the photoelectric conversion unit 101b, that is, the signal voltage (the signal with the exposure level) according to the signal charges stored in the node capacitor 120b, are output from the first amplification transistor 106b to the first noise suppression element 113b via the first inter-substrate connection unit 12b and output to the pixel select transistor 115b.

The first noise suppression element 113a outputs a voltage of a difference between the signal voltage with the reset level and the signal voltage with the exposure level of the photoelectric conversion unit 101a, that is, the signal voltage subjected to the noise removing process. Similarly, the first noise suppression element 113b outputs the signal voltage of the photoelectric conversion unit 101b subjected to the noise removing process.

Thereafter, the vertical scanning circuit (not shown) controls the control signal φTX1 to the "L" level to stop the transmission of the signal charges stored in the photoelectric conversion unit 101a to the gate terminal of the first amplification transistor 106a and stop the transmission of the signal charges stored in the photoelectric conversion unit 101b to the gate terminal of the first amplification transistor 106b.

Subsequently, at time t7, the vertical scanning circuit (not shown) controls the control signal φTX2 to the "L" level to stop the sampling and holding of the first charge storage unit 110a and stop the sampling and holding of the first charge storage unit 110b. Accordingly, the first charge storage unit 110a holds the signal voltage subjected to the noise removing process and output by the first noise suppression element 113a. The first charge storage unit 110b holds the signal voltage subjected to the noise removing process and output by the first noise suppression element 113b.

Until this point, the signal charges generated by the photoelectric conversion unit 101a included in the pixel 100a disposed in the pixel signal processing unit 10 are subjected to the noise removing process and held in the first charge storage unit 110a. Until this point, the signal charges generated by the photoelectric conversion unit 101b included in the pixel 100b are subjected to the noise removing process and held (stored) in the first charge storage unit 110b disposed in the pixel signal processing unit 10.

Subsequently, at time t8, the vertical scanning circuit (not shown) controls the control signals φSH1A and φSH2A to the "H" level to turn on the pixel select transistors 115a and 212a. Accordingly, the signal voltage (the signal with the exposure level) according to the signal charges generated by the photoelectric conversion unit 101a output from the first amplification transistor 106a to the pixel select transistor 115a via the first inter-substrate connection unit 12a, that is, the signal charges stored in the node capacitor 120a, is selected and output to the second noise suppression element 213a via the pixel select transistor 115a, the second inter-substrate connection unit 22, and the pixel select transistor 212a.

The second noise suppression element 213a outputs a voltage of a difference between the signal voltage with the reset level and the signal voltage with the exposure level of the photoelectric conversion unit 101a, that is, the signal voltage subjected to the noise removing process.

Thereafter, the vertical scanning circuit (not shown) controls the control signals φSH1A and φSH2A to the "L" level to turn off the pixel select transistors 115a and 212a and release the selection of the signal voltage according to the signal charges generated by the photoelectric conversion unit 101a.

Until this point, the signal charges generated by the photoelectric conversion unit 101a included in the pixel 100a disposed in the pixel signal processing unit 10 are subjected to the noise removing process and held (stored) in the second charge storage unit 210a.

Subsequently, at time t9, the vertical scanning circuit (not shown) controls the control signals φSH1B and φSH2B to the "H" level to turn on the pixel select transistors 115b and 212b. Accordingly, the signal voltage (the signal with the exposure level) according to the signal charges generated by the photoelectric conversion unit 101b output from the first amplification transistor 106b to the pixel select transistor 115b via the first inter-substrate connection unit 12b, that is, the signal charges stored in the node capacitor 120b, is selected and output to the second noise suppression element 213b via the pixel select transistor 115b, the second inter-substrate connection unit 22, and the pixel select transistor 212b.

The second noise suppression element 213b outputs a voltage of a difference between the signal voltage with the reset level and the signal voltage with the exposure level of the photoelectric conversion unit 101b, that is, the signal voltage subjected to the noise removing process.

Thereafter, the vertical scanning circuit (not shown) controls the control signals φSH1B and φSH2B to the "L" level to turn off the pixel select transistors 115b and 212b and release the selection of the signal voltage according to the signal charges generated by the photoelectric conversion unit 101b.

Until this point, the signal charges generated by the photoelectric conversion unit 101b included in the pixel 100b disposed in the pixel signal processing unit 10 are subjected to the noise removing process and held (stored) in the second charge storage unit 210b.

Subsequently, at time t10, the second charge storage circuit 104 performs a process of averaging the signal voltage subjected to the noise removing process and held in the second charge storage unit 210a and the signal voltage subjected to the noise removing process and held in the second charge storage unit 210b. More specifically, at time t10, the vertical scanning circuit (not shown) controls the control signal φMix to the "H" level to turn on the averaging switch transistor 214. Accordingly, the second charge storage units 210a and 210b are short-circuited, and the second charge storage units 210a and 210b hold the intermediate signal voltage of the signal voltages subjected to the noise removing process and being held. That is, the second charge storage units 210a and 210b hold the averaged signal voltage.

At time t10, the vertical scanning circuit (not shown) controls the control signal φBIAS to stop the operation of the pixel load transistor 114a operating as the load of the corresponding first amplification transistor 106a. At time t10, the vertical scanning circuit (not shown) controls the control signal φBIAS to stop the operation of the pixel load transistor 114b operating as the load of the corresponding first amplification transistor 106b.

Thereafter, the vertical scanning circuit (not shown) sequentially controls the control signals φSEL1A and φSEL1B to sequentially output the signal voltages subjected to the noise removing process and held in the first charge storage units 110a and 110b as the full-resolution image signals S1 of the pixels to the first vertical signal line 19. The vertical scanning circuit (not shown) controls the control signal φSEL2 to output the averaged signal voltage subjected to the noise removing process and held in the second charge storage units 210a and 210b as the reduced image signal S2 in which the number of pixels is reduced to the second vertical signal line 29.

In the pixel signal processing unit 10 of the second configuration example shown in FIG. 4, even after the vertical scanning circuit (not shown) controls the control signal φMix to the "L" level to release the short-circuit between the second charge storage units 210a and 210b, the averaged signal voltage subjected to the noise removing process and held in the second charge storage unit 210a can be output as the reduced image signal S2 in which the number of pixels is reduced to the second vertical signal line 29.

In the pixel signal processing unit 10 of the second configuration example, output sequences of the full-resolution image signals S1 and the reduced image signals S2 are not particularly defined, as in the pixel signal processing unit 10 of the first configuration example. Accordingly, a detailed description of timings at which the vertical scanning circuit (not shown) controls the control signals φSEL1A, φSEL1B, and φSEL2 and outputs the full-resolution image signals S1 to the first vertical signal line 19 or timings at which the vertical scanning circuit (not shown) outputs the reduced image signals S2 to the second vertical signal line 29 will be omitted.

In the pixel signal processing unit 10 of the second configuration example, at these driving timings, the signal voltages according to the signal charges obtained when two photoelectric conversion units (the photoelectric conversion units 101a and 101b) photoelectrically convert incident light are read to the inter-substrate connection units (the first inter-substrate connection units 12a and 12b) corresponding to the two photoelectric conversion units. In the pixel signal processing unit 10, the signals subjected to the noise removing process are held in the charge storage units (the first charge storage units 110a and 110b) corresponding to the two photoelectric conversion units. At the driving timings of the pixel signal processing unit 10 of the second configuration example, the signal voltages according to the signal charges subjected to the photoelectric conversion by the two photoelectric conversion units are selected by the multiplexer (the pixel select transistors 115a and 115b) and are output to the second inter-substrate connection unit 22 in the pixel signal processing unit 10. Then, the signal voltages according to the signal charges subjected to the photoelectric conversion by the two photoelectric conversion units are separated by the demultiplexer (the pixel select transistors 212a and 212b). In the pixel signal processing unit 10, the signals after the noise removing process are held in the charge storage units (the second charge storage units 210a and 210b) corresponding to the two photoelectric conversion units. Thereafter, in the pixel signal processing unit 10, the signals held in the charge storage units (the second charge storage units 210a and 210b) corresponding to the two photoelectric conversion units are averaged. Then, in the solid-state imaging device 1, the signal voltages according to the signals subjected to the noise removing process and stored in the charge storage units (the first charge storage units 110a and 110b) of the pixel signal processing unit 10 are output as the full-resolution image signals S1 to the first vertical signal line 19 and the averaged signal voltages are output as the reduced image signals S2 to the second vertical signal line 29.

In this way, in the pixel signal processing unit 10 of the second configuration example in the solid-state imaging device 1 according to the first embodiment, as in the pixel signal processing unit 10 of the first configuration example, the signal charges of the photoelectric conversion unit 101a included in the pixel 100a are subjected to the noise removing process and held in the first charge storage unit 110a, and the signal charges of the photoelectric conversion unit 101b included in the pixel 100b are subjected to the noise removing process and held in the first charge storage unit 110b. In the pixel signal processing unit 10 of the second configuration example in the solid-state imaging device 1 according to the first embodiment, the signal charges of the photoelectric conversion unit 101a included in the pixel 100a are subjected to the noise removing process and held in the second charge storage unit 210a, and the signal charges of the photoelectric conversion unit 101b included in the pixel 100b are subjected to the noise removing process and held in the second charge storage unit 210b. Thereafter, in the pixel signal processing unit 10 of the second configuration example in the solid-state imaging device 1 according to the first embodiment, the signal charges are averaged and held in the second charge storage units 210a and 210b. Accordingly, in the pixel signal processing unit 10 of the second configuration example in the solid-state imaging device 1 according to the first embodiment, as in the pixel signal processing unit 10 of the first configuration example, both of the pixel signal (the full-resolution image signal S1) of all the pixels included in the pixel signal processing unit 10 and the pixel signal (the reduced image signal S2) in which the number of pixels included in the pixel signal processing unit 10 is reduced, that is, the full-resolution image signals S1 of the pixels included in the pixel signal processing unit 10 are averaged (arithmetically averaged), can be independently output.

As described above, in the pixel signal processing unit 10 in the solid-state imaging device 1 according to the first embodiment, the pixels are exposed during the same exposure period, the signal charges generated by the photoelectric conversion unit 101a are held in the first charge storage circuit 103a, and the signal charges generated by the photoelectric conversion unit 101b are held in the first charge storage circuit 103b of the pixels. Further, in the pixel signal processing unit 10 of the solid-state imaging device 1 according to the first embodiment, the signal charges obtained by averaging the charge amounts of the signal charges (the signal charges in which the number of pixels is reduced) are held in the second charge storage circuit 104. In the pixel signal processing unit 10 in the solid-state imaging device 1 according to the first embodiment, the full-resolution image signals S1 according to the signal charges held in the first charge storage circuits 103a and 103b and the reduced image signals S2 according to the signal charges held in the second charge storage circuit 104 can be output separately. That is, in the pixel signal processing unit 10 of the solid-state imaging device 1 according to the first embodiment, the full-resolution image signals S1 and the reduced image signals S2 can be output separately based on the signal charges obtained by the same one-time exposure.

The configuration of the pixel signal processing unit 10 in the solid-state imaging device 1 according to the first embodiment is not limited to the configurations of the first and second configuration examples, but may be a configuration in which a scope is different without departing from the gist of the pixel signal processing unit 10 in the solid-state imaging device 1 according to the first embodiment.

In the pixel signal processing unit 10 of the first and second configuration examples in the solid-state imaging device 1 according to the first embodiment, the configuration in which the control signals input to the constituent elements corresponding to the pixels 100a and 100b are the same control signals in the pixels 100a and 100b except for the control signal φSEL1A input to the first select transistor 107a and the control signal φSEL1B input to the first select transistor 107b has been described. Based on such a configuration, the timing at which an operation of a global shutter function of simultaneously starting exposure of the photoelectric conversion unit 101a included in the pixel 100a and the photoelectric conversion unit 101b included in the pixel 100b and simultaneously transmitting the signal charges generated by the photoelectric conversion units 101a and 101b has been described as the driving timing of the pixel signal processing unit 10 of the first and second configuration examples in the solid-state imaging device 1 according to the first embodiment. However, the configuration or the driving timing of the pixel signal processing unit 10 in the solid-state imaging device 1 is not limited to the first and second configuration examples, but control signals input to the constituent elements of the pixels 100a and 100b may also be different between the pixels 100a and 100b so that the pixels 100a and 100b can be driven at different timings.

In the pixel signal processing unit 10 of the first and second configuration examples in the solid-state imaging device 1 according to the first embodiment, the configuration of the multi-layered substrate structure formed by three substrates, the photoelectric conversion substrate 11, the first reading substrate 21, and the second reading substrate 31, has been described based on the minimum configuration of the pixel signal processing unit 10 of the solid-state imaging device 1 shown in FIG. 1. However, the configuration of the pixel signal processing unit 10 in the solid-state imaging device 1 is not limited to the configuration of the pixel signal processing unit 10 in the solid-state imaging device 1 according to the first embodiment. For example, the signal charges obtained by averaging the signal charges corresponding to the pixels 100a and 100b and held in the second charge storage circuit 104 can also be further averaged. For example, in the second charge storage circuit 104, the number of pixels included in the pixel signal processing unit 10 is reduced in one stage, but it can also be further reduced in one or more stages. In this case, the pixel signal processing unit 10 in the solid-state imaging device 1 according to the first embodiment is considered to be more multi-layered. In the pixel signal processing unit 10 in the solid-state imaging device 1 according to the first embodiment, the number of stages in which the number of pixels included in the pixel signal processing unit 10 is reduced is not particularly defined.

In the solid-state imaging device 1 according to the first embodiment, the configuration of the pixel signal processing unit 10 in which two pre-determined pixels are paired and the signal charges obtained by averaging the charge amounts of the signal charges generated by the photoelectric conversion units 101 included in the pixels are held is shown in FIGS. 1, 2, and 4. However, in an actual solid-state imaging device, for example, color filters of a Bayer array are attached to the pixel array of the plurality of pixels disposed in a 2-dimensional matrix and the photoelectric conversion units 101 included in the pixels photoelectrically convert color corresponding to the attached color filters included in the incident light and generate signal charges. Accordingly, in the solid-state imaging device 1 according to the first embodiment, it is preferable to configure pairs of pixels such that a centroid of the color of the pasted color filters does not deviate and signal charges of different colors are not averaged.

Figure 6:
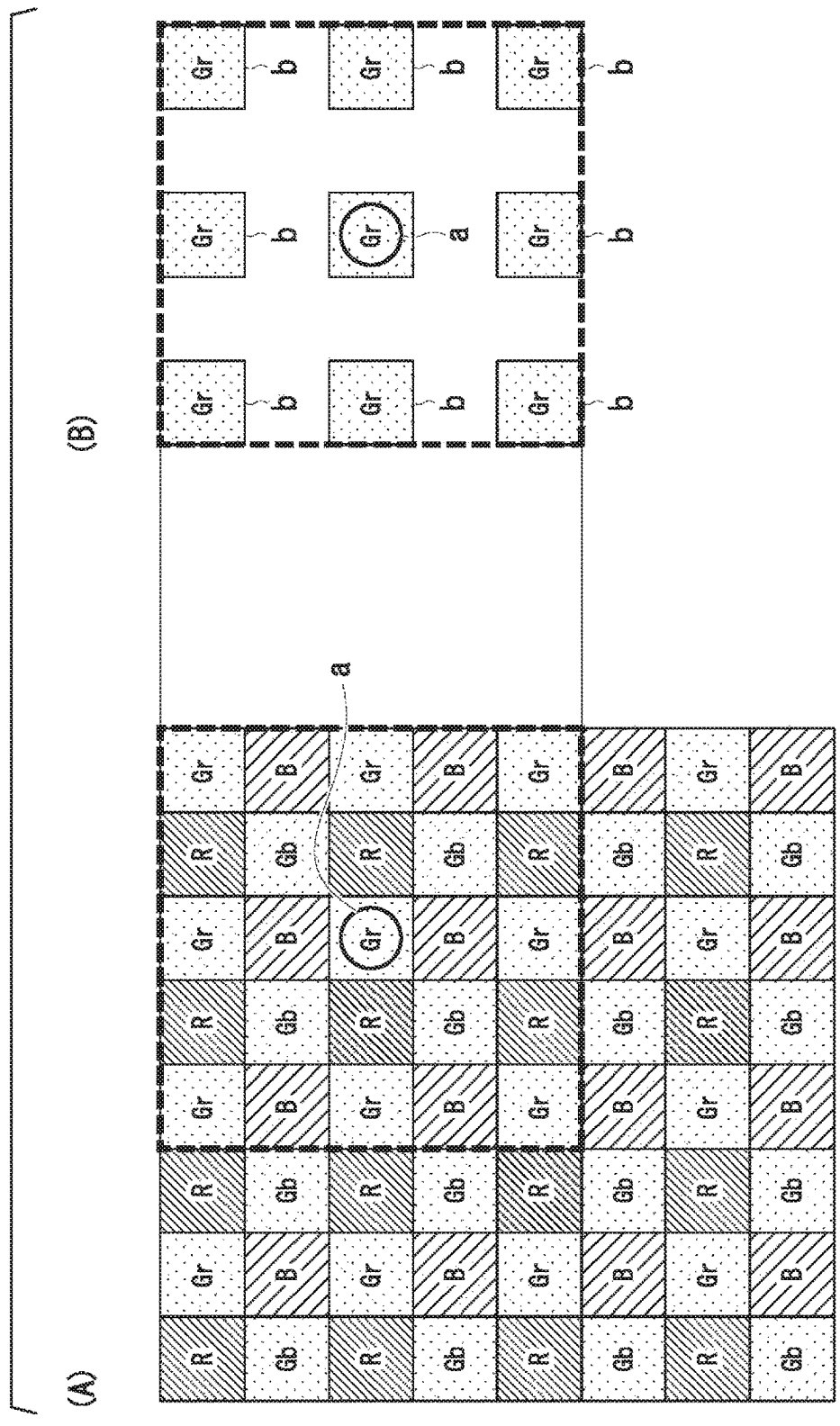
FIG. 6 is a diagram showing an example of the array of pixels in the solid-state imaging device according to the first embodiment.

An example of disposition of the pair of pixels in the pixel signal processing unit 10 of the solid-state imaging device 1 according to the first embodiment will be described. FIG. 6 is a diagram showing an example of the disposition of pixels in the solid-state imaging device 1 according to the first embodiment. FIG. 6 shows an example of a case in which color filters with the Bayer array are pasted to the solid-state imaging device 1.

As described above, when the color filters are attached to the solid-state imaging device 1, it is preferable to configure a set of pixels in the solid-state imaging device 1 such that the centroid of the same color does not deviate. (B) of FIG. 6 shows a case in which a Gr pixel 100a disposed in the third row and the sixth column in (A) of FIG. 6 is located at the centroid and 8 Gr pixels 100b of the same color disposed within a range of 5 rows and 5 columns in the periphery of the Or pixel 100a are formed as a set, that is, 9 pixels are formed as a set.

By configuring the set of pixels, as shown in (B) of FIG. 6, the reduced image signal S2 in which the number of pixels included in the pixel array is reduced to ⅓ in the row direction and ⅓ in the column direction, that is, the number of pixels included in the pixel array is reduced to ⅑ in total, can be output to the second charge storage circuit 104 in the solid-state imaging device 1 including the pixel signal processing unit 10 shown in FIG. 1. In the differential AD conversion unit 50 of the solid-state imaging device 1 according to the first embodiment, various processes can be performed based on each pixel signal output by the pixel signal processing unit 10.

The disposition of the pixels formed as the set in the pixel signal processing unit 10 of the solid-state imaging device 1 according to the first embodiment is not limited to the example shown in FIG. 6. For example, by forming a set of 25 pixels of the same color disposed in a range of 9 rows and 9 columns in the periphery of a centroid pixel, the signal charges in which the number of pixels included in the pixel array is reduced to ⅕ in the row direction and ⅕ in the column direction, that is, the number of pixels included in the pixel array is reduced to 1/25 in total, can be held in the second charge storage circuit 104.

<Example of Configuration of Differential AD Conversion Unit>

Next, an example of a more detailed configuration of the differential AD conversion unit 50 in the solid-state imaging device 1 according to the first embodiment will be described. The reading circuit 501 included in the differential AD conversion unit 50 merely sequentially reads the full-resolution image signals S1 according to the signal charges held in the first charge storage circuits 103a and 103b included in the pixel signal processing unit 10. The reading circuit 511 included in the differential AD conversion unit 50 merely reads the reduced image signals S2 according to the signal charges held by the second charge storage circuit 104 included in the pixel signal processing unit 10. Accordingly, the description of the more specific configurations of the reading circuits 501 and 511 will be omitted.

Figure 7A:
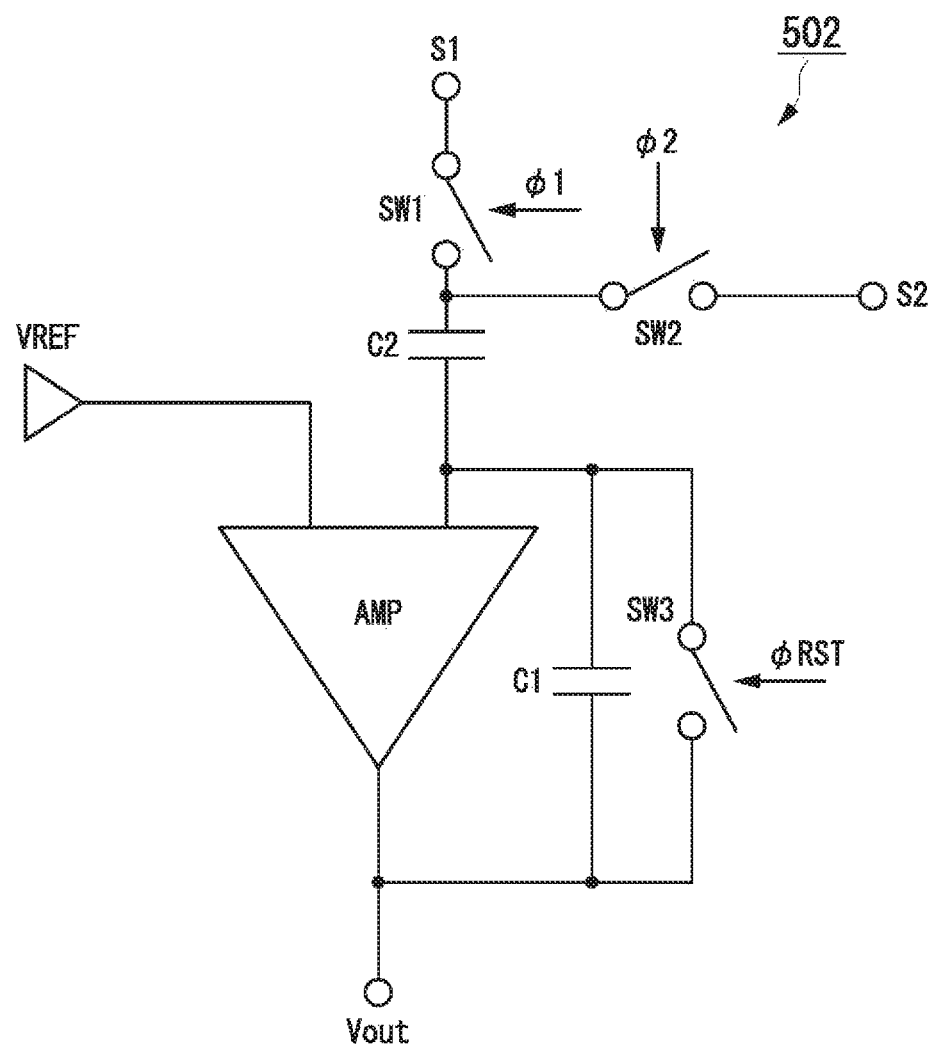
FIG. 7A is a circuit diagram showing an example of the configuration of a differential circuit included in a differential AD conversion unit of the solid-state imaging device according to the first embodiment.
Figure 7B:
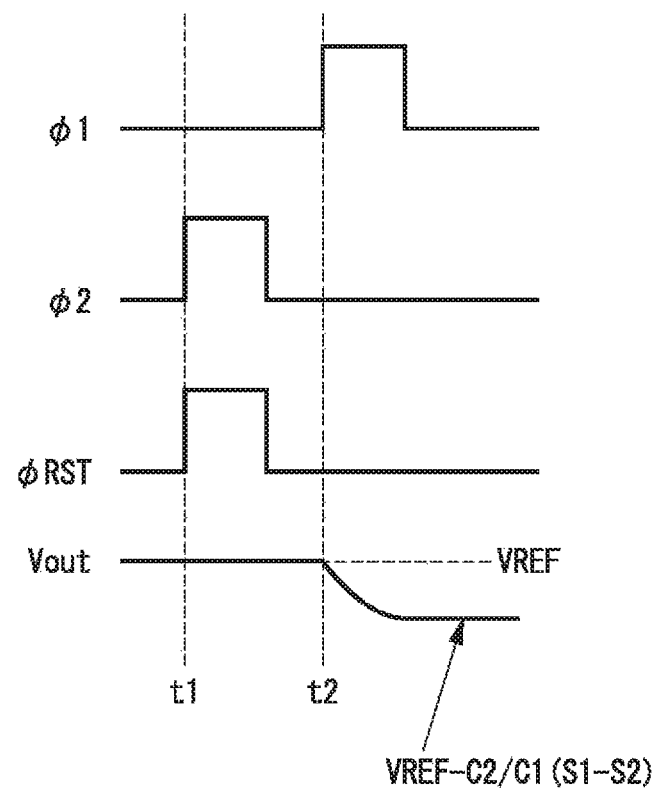
FIG. 7B is a timing chart showing operation timings of the differential circuit included in the differential AD conversion unit of the solid-state imaging device according to the first embodiment.

First, an example of a more specific configuration of the differential circuit 502 included in the differential AD conversion unit 50 will be described. FIG. 7A is a circuit diagram showing an example of the configuration of the differential circuit 502 included in the differential AD conversion unit 50 of the solid-state imaging device 1 according to the first embodiment. FIG. 7B is a timing chart showing an operation timing of the differential circuit 502 included in the differential AD conversion unit 50 of the solid-state imaging device 1 according to the first embodiment.

The differential circuit 502 shown in FIG. 7A is configured to include an operational amplifier AMP, a feedback capacitor C1, a sampling capacitor C2, and switches SW1 to SW3. The differential circuit 502 calculates a difference between the full-resolution image signal S1 read from the pixel signal processing unit 10 by the reading circuit 501 and the reduced image signal S2 read from the pixel signal processing unit 10 by the reading circuit 511. Then, the differential circuit 502 outputs the pixel signal of the difference between the full-resolution image signal S1 and the reduced image signal S2 as a differential pixel signal Vout to the first A/D conversion circuit 503.

The switch SW1 is a switch that selects the full-resolution image signal S1 read from the pixel signal processing unit 10 by the reading circuit 501. The switch SW1 outputs the input full-resolution image signal S1 to the sampling capacitor C2 according to a control signal φ1.

The switch SW2 is a switch that selects the reduced image signal S2 read from the pixel signal processing unit 10 by the reading circuit 511. The switch SW2 outputs the input reduced image signal S2 to the sampling capacitor C2 according to a control signal φ2.

The sampling capacitor C2 is a capacitor that samples and holds the charges according to the signal voltage of the pixel signal input from the switches SW1 and SW2. The sampling capacitor C2 outputs the signal voltage according to the held charges to the operational amplifier AMP.

The signal voltage according to the charges held by the sampling capacitor C2 is input to one input terminal of the operational amplifier AMP. The operational amplifier AMP arithmetically amplifies the signal voltage input to the one input terminal based on the fixed potential VREF input to the other input terminal and outputs the amplified signal voltage as a differential pixel signal Vout from an output terminal.

The feedback capacitor C1 is a feedback capacitor that is disposed between the one input terminal and the output terminal of the operational amplifier AMP.

The switch SW3 is a switch that initializes the operational amplifier AMP. The switch SW3 initializes the operational amplifier AMP by short-circuiting the one input terminal and the output terminal of the operational amplifier AMP according to the control signal φRST.

An operation of the differential circuit 502 will be described with reference to FIG. 7B. The differential circuit 502 first samples the reduced image signal S2 read from the pixel signal processing unit 10 by the reading circuit 511. Thereafter, the differential circuit 502 samples the full-resolution image signal S1 read from the pixel signal processing unit 10 by the reading circuit 501, and thus outputs the differential pixel signal Vout obtained by calculating the difference between the full-resolution image signal S1 and the reduced image signal S2.

More specifically, at time t1, in the differential circuit 502, the control signal 42 is controlled to the "H" level to turn on the switch SW2 and the reduced image signal S2 read from the pixel signal processing unit 10 by the reading circuit 511 is output to the sampling capacitor C2. Simultaneously, in the differential circuit 502, the control signal ϕRST is controlled to the "H" level to turn on the switch SW3 and the one input terminal and the output terminal of the operational amplifier AMP is short-circuited to reset (initialize) the operational amplifier AMP. Accordingly, a potential which is the fixed potential VREF is output as the differential pixel signal Vout from the output terminal of the operational amplifier AMP.

Thereafter, in the differential circuit 502, the control signals ϕ2 and ϕRST are controlled to the "L" level to end the outputting of the reduced image signal S2 to the sampling capacitor C2 and to release the resetting of the operational amplifier AMP.

Subsequently, at time t2, in the differential circuit 502, the control signal ϕ1 is controlled to the "H" level to turn on the switch SW1, and the full-resolution image signal S1 read from the pixel signal processing unit 10 by the reading circuit 501 is output to the sampling capacitor C2. Accordingly, the potential of the difference between the potential which is the fixed potential VREF input at the time of the resetting and the potential input after the releasing of the resetting, that is, the potential of the difference between the reduced image signal S2 output from the sampling capacitor C2 and the full-resolution image signal S1, is output as the differential pixel signal Vout from the output terminal of the operational amplifier AMP. The potential of the differential pixel signal Vout output from the output terminal of the operational amplifier AMP is expressed as in Formula (1) below.

$$Vout = Vref - C2/C1(S1 - S2) \qquad (1)$$

In accordance with such a configuration and operation timings, the differential circuit 502 outputs the differential pixel signal Vout obtained by calculating the difference between the full-resolution image signal S1 read from the pixel signal processing unit 10 by the reading circuit 501 and the reduced image signal S2 read from the pixel signal processing unit 10 by the reading circuit 511. Since the reduced image signal S2 is a pixel signal corresponding to the full-resolution image signal S1, the differential pixel signal Vout is a signal of which a voltage range is considerably less than that of the full-resolution image signal S1. That is, the differential pixel signal Vout is a pixel signal obtained by narrowing a dynamic range of the full-resolution image signal S1. Accordingly, thereafter, a counting time of a counter in the first A/D conversion circuit 503 operating when the first A/D conversion circuit 503 performs analog/digital conversion on the differential pixel signal Vout is shortened.

Figure 8A:
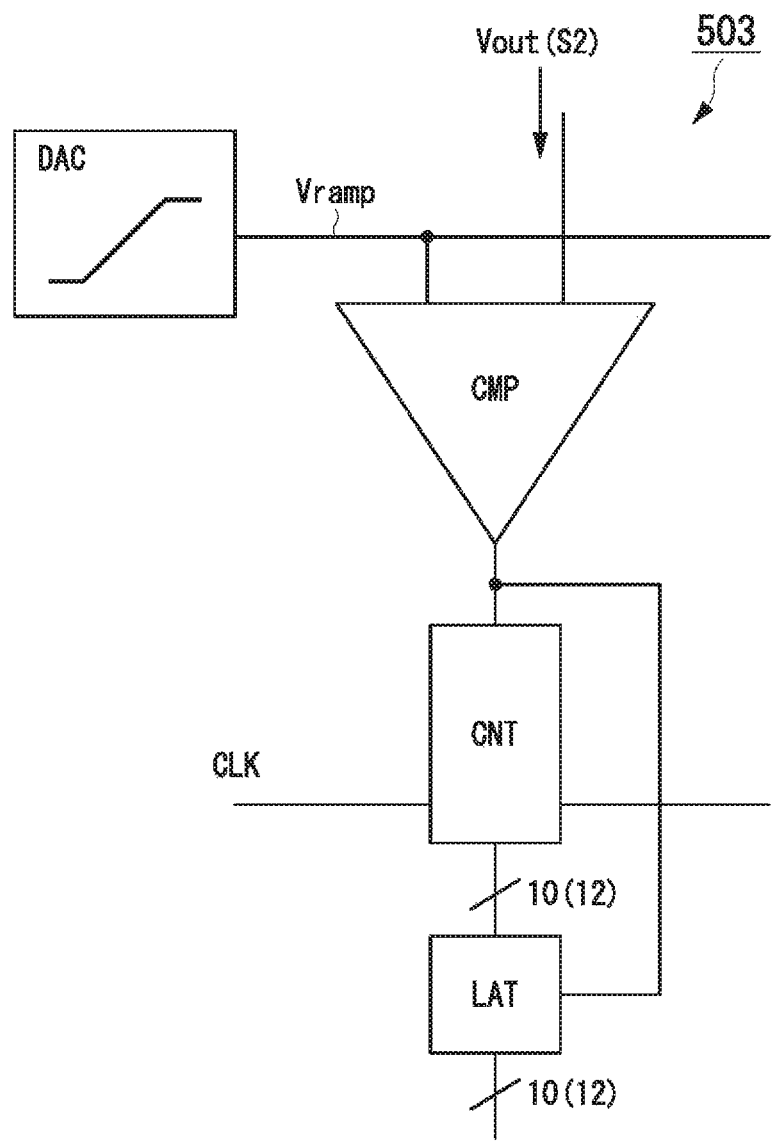
FIG. 8A is a circuit diagram showing an example of the configuration of an A/D conversion circuit included in the differential AD conversion unit of the solid-state imaging device according to the first embodiment.
Figure 8B:
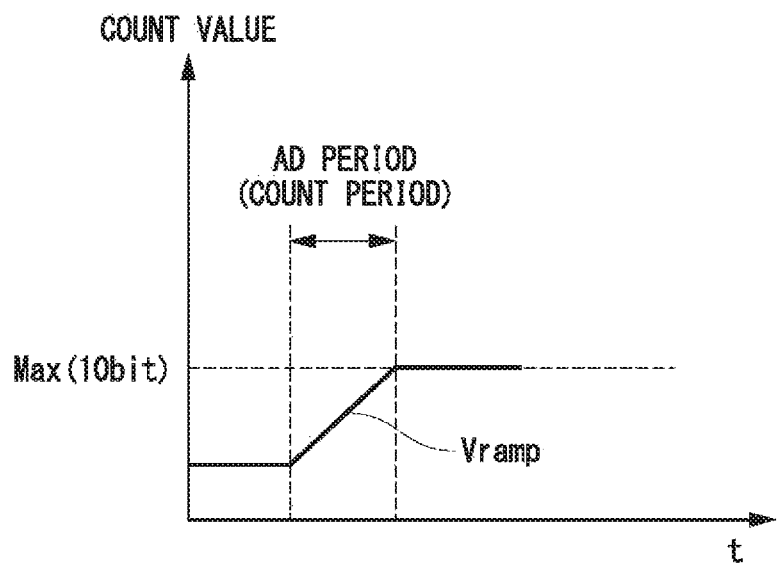
FIG. 8B is a timing chart showing an operation period of the A/D conversion circuit included in the differential AD conversion unit of the solid-state imaging device according to the first embodiment.
Figure 8C:
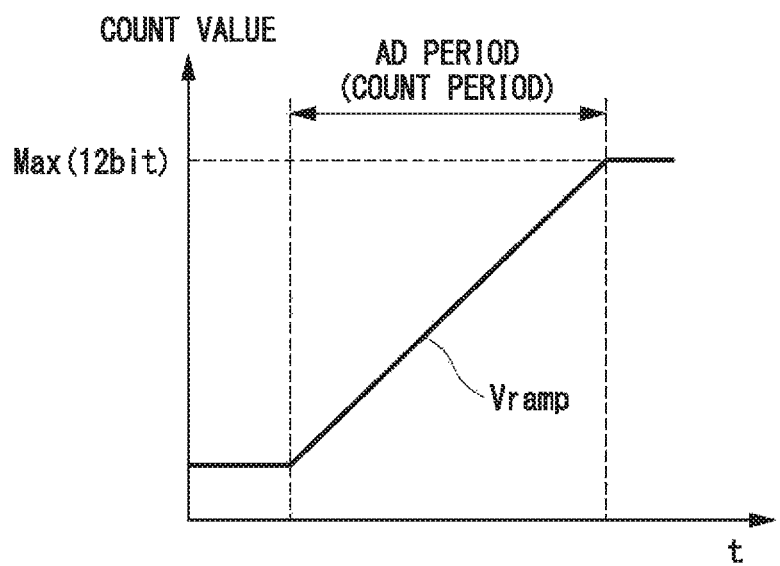
FIG. 8C is a timing chart showing an operation period of the A/D conversion circuit included in the differential AD conversion unit of the solid-state imaging device according to the first embodiment.

Next, an example of a more specific configuration of the first A/D conversion circuit 503 and the second A/D conversion circuit 513 included in the differential AD conversion unit 50 will be described. FIG. 8A is a circuit diagram showing an example of the configuration of the A/D conversion circuits (the first A/D conversion circuit 503 and the second A/D conversion circuit 513) included in the differential AD conversion unit 50 of the solid-state imaging device 1 according to the first embodiment. FIG. 8B is a timing chart showing an operation period of the first A/D conversion circuit 503. FIG. 8C is a timing chart showing an operation period of the second A/D conversion circuit 513.

The first A/D conversion circuit 503 shown in FIG. 8A is configured to include a reference signal generator DAC, a comparator CMP, a counter CNT, and a latch LAT. The first A/D conversion circuit 503 is a slope integration type A/D conversion circuit. The first A/D conversion circuit 503 outputs a value (digital value) indicating the magnitude of the differential pixel signal Vout (analog signal) obtained by performing the analog/digital conversion on the differential pixel signal Vout (analog signal) input from the differential circuit 502.

The reference signal generator DAC generates a ramp wave Vramp which is an analog signal with a potential increasing at a given ratio over time and outputs the generated ramp wave Vramp to the comparator CMP.

The comparator CMP compares the potential of the differential pixel signal Vout which is the analog signal input from the differential circuit 502 to the potential of the ramp wave Vramp input from the reference signal generator DAC. When the potential of the ramp wave Vramp becomes a potential for which a magnitude relation with the potential of the differential pixel signal Vout is reversed, the comparator CMP outputs a comparison signal for notifying of this state to the counter CNT and the latch LAT.

Based on clock signals CLK, the counter CNT counts a time of a period (AD period) in which the comparator CMP compares the potential of the differential pixel signal Vout to the potential of the ramp wave Vramp. More specifically, the counter CNT counts the number of clock signals CLK (clock number) from a timing at which the differential pixel signal Vout is input from the differential circuit 502 and the ramp wave Vramp is output by the reference signal generator DAC to a timing at which the comparison signal is input from the comparator CMP. That is, the counter CNT counts the clock number of the clock signals CLK from the timing at which the comparator CMP starts comparing the potentials to the timing at which the magnitude relation between the potentials is reversed and the comparator CMP ends the comparison. Then, the counter CNT outputs a digital value indicating a counted count value (count value=clock number) of the AD period to the latch LAT. A comparison number of the counter CNT is the number of bits for which all of the times of the AD period in which the comparator CMP compares the potential of the differential pixel signal Vout to the potential of the ramp wave Vramp can be counted. FIG. 8A shows a case in which the number of bits of the counter CNT is 10 bits.

The latch LAT holds the digital value indicating the count value (the clock number) of the AD period input from the counter CNT at a timing at which the comparison signal is input from the comparator CMP, that is, at a timing at which the comparator CMP ends the comparison of the potentials. Then, the latch LAT outputs the held digital value as image data (digital value) obtained by performing analog/digital conversion on the differential pixel signal Vout (the analog signal) input to the first A/D conversion circuit 503. The number of bits of the latch LAT is the number of bits for which all of the count values (=digital values) of the counter CNT can be held, that is, the number of bits equal to the number of bits of the counter CNT. FIG. 8A shows a case in which the number of bits of the latch LAT is 10 bits.

In the solid-state imaging device 1 according to the first embodiment, the second A/D conversion circuit 513 included in the differential AD conversion unit 50 also outputs image data (a digital value) obtained by performing the analog/digital conversion on the reduced image signal S2. The configuration of the second A/D conversion circuit 513 is the same as that of the first A/D conversion circuit 503 shown in FIG. 8A. As described above, however, while the differential pixel signal Vout subjected to the analog/digital conversion by the first A/D conversion circuit 503 is the pixel signal for which the dynamic range of the full-resolution image signal S1 is narrowed by the differential circuit 502, the reduced image signal S2 subjected to the analog/digital conversion by the second A/D conversion circuit 513 is not the pixel signal for which the dynamic range is narrowed. For this reason, the number of bits of the counter CNT and the latch LAT included in the second A/D conversion circuit 513 is greater than the number of bits of the counter CNT and the latch LAT included in the first A/D conversion circuit 503. In FIG. 8A, examples of the pixel signal (S2) input to the second A/D conversion circuit 513 and the number of bits (12 bits) of the counter CNT and the latch LAT included in the second A/D conversion circuit 513 are shown in "( ): parentheses." In the following description, the number of bits of the image data output by the second A/D conversion circuit 513 is the number of bits equal to the number of bits of image data output by an A/D conversion circuit included in a solid-state imaging device of the related art.

The number of bits of the A/D conversion circuit included in the solid-state imaging device of the related art and the number of bits of the counter CNT and the latch LAT included in each of the first A/D conversion circuit 503 and the second A/D conversion circuit 513 will be described later.

Next, operation periods of the first A/D conversion circuit 503 and the second A/D conversion circuit 513 will be described with reference to FIGS. 8B and 8C. FIG. 8B schematically shows a maximum AD period in which the first A/D conversion circuit 503 counts the clock number of the clock signals CLK corresponding to a maximum of 10 bits. FIG. 8C schematically shows a maximum AD period in which the second A/D conversion circuit 513 counts the clock number of the clock signals CLK corresponding to a maximum of 12 bits. The AD period of the second A/D conversion circuit 513 shown in FIG. 8C is the same as the AD period of the A/D conversion circuit included in the solid-state imaging device of the related art.

As described above, in the first A/D conversion circuit 503, within the AD period, the comparator CMP compares the potential of the input differential pixel signal Vout to the potential of the ramp wave Vramp. In the first A/D conversion circuit 503, within the AD period, the counter CNT counts the clock number of the clock signals CLK from the timing at which the reference signal generator DAC outputs the ramp wave Vramp and the comparator CMP starts the comparison of the potentials to the timing at which the comparator CMP ends the comparison of the potentials. In the second A/D conversion circuit 513, within the AD period, the comparator CMP compares the potential of the input reduced image signal S2 to the potential of the ramp wave Vramp. In the second A/D conversion circuit 513, within the AD period, the counter CNT counts the clock number of the clock signals CLK from the timing at which the reference signal generator DAC outputs the ramp wave Vramp and the comparator CMP starts the comparison of the potentials to the timing at which the comparator CMP ends the comparison of the potentials.

In the first A/D conversion circuit 503, at the timing at which the magnitude relation between the potential of the ramp wave Vramp and the potential of the input differential pixel signal Vout is reversed, the comparator CMP outputs the comparison signal for notifying of the reversing of the magnitude relation between the potential of the ramp wave Vramp and the potential of the input differential pixel signal Vout is reversed to the counter CNT. Accordingly, in the first A/D conversion circuit 503, the counter CNT stops counting the clock number of the clock signals CLK according to the comparison signal input from the comparator CMP, and the latch LAT holds the count value (the clock number) input from the counter CNT and outputs the count value as image data (digital value) according to the input pixel signal (the differential pixel signal Vout). In the second A/D conversion circuit 513, at the timing at which the magnitude relation between the potential of the ramp wave Vramp and the potential of the input reduced image signal S2 is reversed, the comparator CMP outputs the comparison signal for notifying of the reversing of the magnitude relation between the potential of the ramp wave Vramp and the potential of the input reduced image signal S2 is reversed to the counter CNT. Accordingly, in the second A/D conversion circuit 513, the counter CNT stops counting the clock number of the clock signals CLK according to the comparison signal input from the comparator CMP, and the latch LAT holds the count value (the clock number) input from the counter CNT and outputs the count value as image data (digital value) according to the input pixel signal (the reduced image signal S2). Therefore, in the A/D conversion circuit, power is consumed in the operation within the AD period.

Comparing FIGS. 8B and 8C, the AD period of the first A/D conversion circuit 503 that performs the analog/digital conversion on the differential pixel signal Vout for which the dynamic range of the full-resolution image signal S1 is narrowed by the differential circuit 502 is a period shorter than the AD period of the second A/D conversion circuit 513 that performs the analog/digital conversion on the reduced image signal S2. That is, an operation period in which the counter CNT included in the first A/D conversion circuit 503 counts the clock signals CLK is a period shorter than an operation period in which the counter CNT included in the second A/D conversion circuit 513 counts the clock signals CLK. Therefore, in the solid-state imaging device 1 according to the first embodiment, it is possible to reduce the power consumption when the counter CNT included in the first A/D conversion circuit 503 counts the clock signals CLK.

In other words, the operation period in which the counter CNT included in the first A/D conversion circuit 503 counts the clock signals CLK is a period shorter than the operation period of the counter included in the A/D conversion circuit included in the solid-state imaging device of the related art. Therefore, in the solid-state imaging device 1 according to the first embodiment, it is possible to reduce the power consumption of the first A/D conversion circuit 503 at the time of outputting of the image data according to the full-resolution image signal S1 more than power consumption of the A/D conversion circuit included in the solid-state imaging device of the related art.

The number of bits of the A/D conversion circuit included in the solid-state imaging device of the related art, the number of bits of the counter CNT and the latch LAT included in the first A/D conversion circuit 503, and the number of bits of the counter CNT and the latch LAT included in the second A/D conversion circuit 513 will be described. That is, the number of bits of pre-determined digital values of the first A/D conversion circuit 503 and the second A/D conversion circuit 513 will be described.

As shown in FIGS. 8B and 8C, in each of the first A/D conversion circuit 503 and the second A/D conversion circuit 513, when the potential of the input pixel signal is low, the magnitude relation with the potential of the ramp wave Vramp is reversed at an early stage, the counting of the clock number of the clock signals CLK by the counter CNT is stopped at an early stage, and the analog/digital conversion ends. That is, the image data (digital value) according to the input pixel signal becomes a small value. Conversely, when the potential of the input pixel signal is high, it takes some time until the magnitude relation with the potential of the ramp wave Vramp is reversed. The counting of the clock number of the clock signals CLK by the counter CNT is performed during a longer period, that is, the analog/digital conversion does not end in a long period and the image data (digital value) according to the input pixel signal becomes a large value.

For example, considering a configuration in which the full-resolution image signal S1 is subjected to the analog/digital conversion and the digital value (the image data) of 12 bits is output, when a maximum digital value is output in such a configuration, it is necessary to count 4095 clock signals CLK in the A/D conversion circuit included in the solid-state imaging device of the related art. Thus, the period of the analog/digital conversion is 4095 times of one period of the clock signals CLK.

In contrast, in the solid-state imaging device 1 according to the first embodiment, the first A/D conversion circuit 503 performs the analog/digital conversion on the differential pixel signal Vout which is the difference between the full-resolution image signal S1 and the reduced image signal S2 output by the differential circuit 502 and outputs the differential pixel signal Vout. The differential pixel signal Vout is a pixel signal for which the dynamic range of the full-resolution image signal S1 is narrowed, as described above. For example, when the range of the signal voltage of each of the full-resolution image signals S1 read from the pixel signal processing unit 10 by the reading circuit 501 is about 0 V to about 1 V, the range of the signal voltage of the differential pixel signal Vout obtained by the difference between the signal voltage of the full-resolution image signal S1 and the signal voltage of the reduced image signal S2 is considered to be a range of about 0 V to about 0.25 V. Accordingly, the first A/D conversion circuit 503 may perform the analog/digital conversion on the pixel signal with a range of the signal voltage narrower than that of the A/D conversion circuit included in the solid-state imaging device of the related art.

The first A/D conversion circuit 503 can output a digital value with high precision even when the period of the analog/digital conversion is shortened, that is, when the number of bits of the counter CNT is reduced to reduce the maximum number of bits of the digital value subjected to the analog/digital conversion. Therefore, in the first A/D conversion circuit 503, as shown in FIG. 8A, the number of bits of the counter CNT is set to 10 bits less than the number of bits (12 bits) of the counter included in the A/D conversion circuit included in the solid-state imaging device of the related art.

When the number of bits of the counter CNT is smaller by 1 bit, the operation period in which the clock signals CLK are counted becomes ½ of the period. Therefore, it is possible to reduce the power consumption of the counter CNT to ½. In the first A/D conversion circuit 503 shown in FIG. 8A, the number of bits of the counter CNT is reduced by 2 bits more than the number of bits (12 bits) of the counter included in the A/D conversion circuit included in the solid-state imaging device of the related art. Therefore, it is possible to reduce the power consumption of the counter CNT to ¼.

In the first A/D conversion circuit 503, the number of bits of the counter CNT is set to 10 bits. Thus, the number of bits necessary for the latch LAT is 10 bits, and thus is reduced by 2 bits. Accordingly, it is possible to reduce a bus width of a data bus through which the first A/D conversion circuit 503 outputs the image data (digital value) according to the full-resolution image signal S1 from the solid-state imaging device 1 according to the first embodiment. Accordingly, in the solid-state imaging device 1 according to the first embodiment, the power consumption accompanied with a variation in the level of each bit of the image data to be output can also be reduced more than in the solid-state imaging device of the related art.

As described above, in the solid-state imaging device 1 according to the first embodiment, the second A/D conversion circuit 513 included in the differential AD conversion unit 50 also outputs the image data (the digital value) obtained by performing the analog/digital conversion on the reduced image signal S2. The second A/D conversion circuit 513 is the same as the A/D conversion circuit included in the solid-state imaging device of the related art. Therefore, in the solid-state imaging device 1 according to the first embodiment, the power consumption corresponding to the output of the image data according to the differential pixel signal Vout output by the first A/D conversion circuit 503 is considered to increase. However, in the solid-state imaging device 1 according to the first embodiment, the reduced image signals S2 subjected to the analog/digital conversion by the second A/D conversion circuit 513 are the pixel signals in which the number of pixels included in the pixel signal processing unit 10 is reduced, that is, signals of fewer pixels than the full-resolution image signal S1. Therefore, in the solid-state imaging device 1 according to the first embodiment, even when the image data according to the reduced image signals S2 is output, the power consumption when the second A/D conversion circuit 513 included in the differential AD conversion unit 50 performs the analog/digital conversion on the reduced image signals S2 is less than in the solid-state imaging device 1 of the related art. Accordingly, even when the solid-state imaging device 1 according to the first embodiment outputs both of the image data according to the differential pixel signal Vout and the image data according to the reduced image signal S2, the power consumption of the entire solid-state imaging device 1 can be suppressed to be less than that of the solid-state imaging device of the related art.

Figure 9:
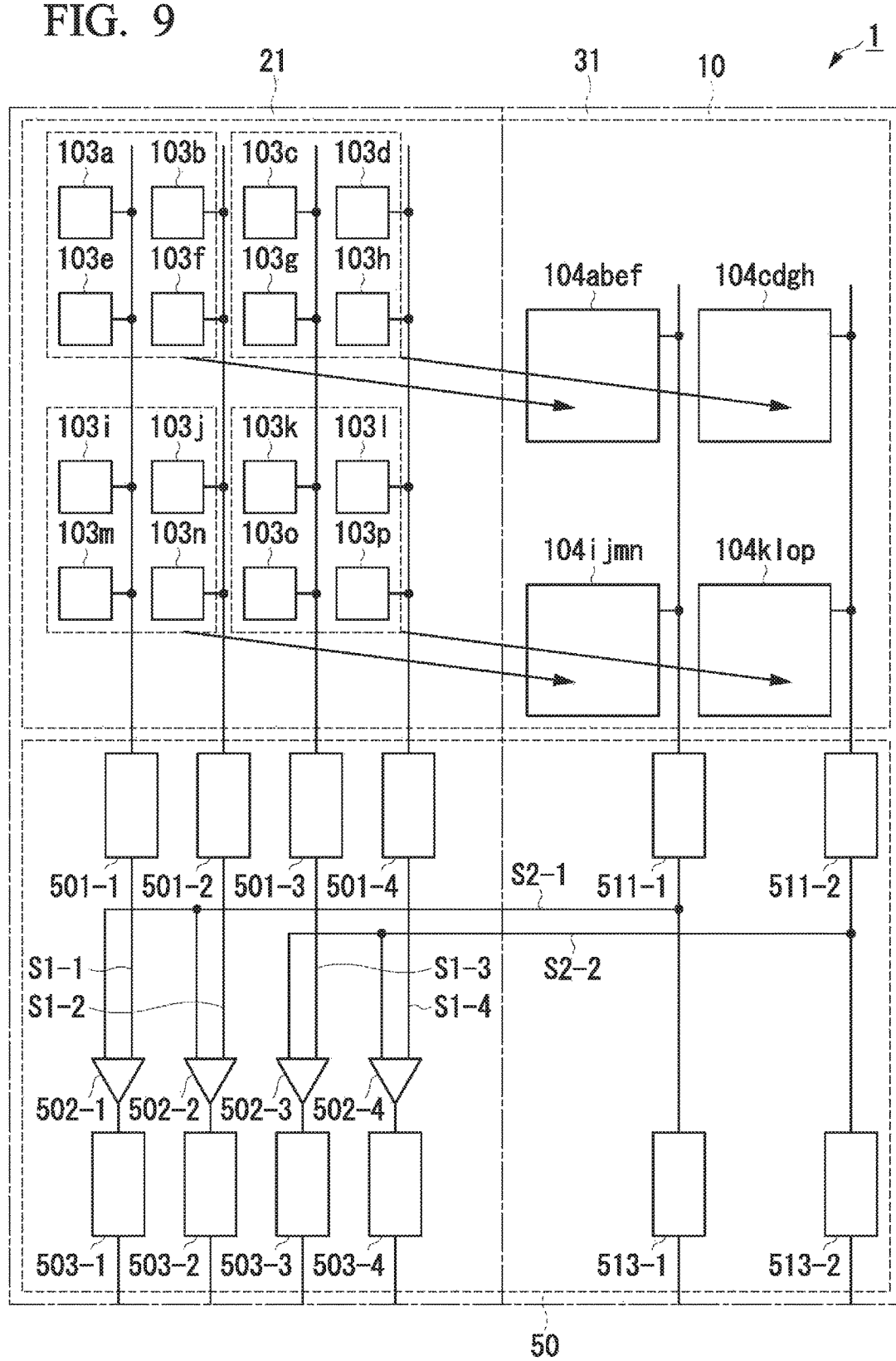
FIG. 9 is a block diagram showing a more specific configuration of the solid-state imaging device according to the first embodiment.

Next, an example of a more specific configuration of the solid-state imaging device 1 according to the first embodiment will be described. FIG. 9 is a block diagram showing the more specific configuration of the solid-state imaging device 1 according to the first embodiment. FIG. 9 shows an example of the configuration of the first reading substrate 21 and the second reading substrate 31 in the solid-state imaging device 1 that includes the pixel signal processing unit 10 in which the pixel array of the pixels disposed in the 2-dimensional matrix of 4 rows and 4 columns is formed and has the multi-layered substrate structure formed by three substrates. In FIG. 9, to facilitate the description, the configuration of the photoelectric conversion substrate in which the photoelectric conversion unit 101 and the charge transmission circuit 102 of each pixel shown in FIG. 1 are formed is omitted. In FIG. 9, the inter-substrate connection unit that electrically connects the signal lines of the substrates is also omitted.

In the following description, to distinguish the pixels to which the constituent elements correspond, that is, 16 pixels 100a to 100p, from each other, reference numerals "a" to "p" denoting the corresponding pixels are suffixed to the reference numerals of the constituent elements for description. More specifically, for example, "c" is suffixed to reference numeral of a constituent element corresponding to the pixel 100c. For example, "ij" is suffixed to reference numeral of a constituent element corresponding to both of the pixels 100*i* and 100*j* for description. Reference numerals "a" to "p" are not suffixed to constituent elements commonly corresponding to the pixels 100*a* to 100*p* for description. When the corresponding pixels are not distinguished from each other for description despite the fact that the pixels are the constituent element corresponding to the pixels 100*a* to 100*p*, reference numerals "a" to "p" are not used and only reference numerals of the constituent elements are used for description. In the following description, numerals denoting the corresponding pixels or columns of sets of the pixels are suffixed to reference numerals of the constituent elements for description to distinguish the pixels to which the constituent elements correspond or the columns of the sets of the pixels from each other. More specifically, for example, "-1" is suffixed to reference numerals of constituent elements corresponding to the first charge storage circuits 103 of the first column. For example, "-2" is suffixed to reference numerals of constituent elements corresponding to the second charge storage circuits 104 of the second column.

In FIG. 9, 16 first charge storage circuits 103 included in 16 pixels included in the pixel signal processing unit 10 of the solid-state imaging device 1 are formed in the first reading substrate 21. Further, 4 first reading circuits 501, 4 differential circuits 502, and 4 first A/D conversion circuits 503 corresponding to each column of 16 first charge storage circuits 103, that is, each column of 16 pixels included in the solid-state imaging device 1, are formed in the first reading substrate 21.

More specifically, the first charge storage circuits 103*a* to 103*p* included in the pixels 100*a* to 100*p* are formed in the first reading substrate 21. In the first reading substrate 21, the first reading circuit 501-1, the differential circuit 502-1, and the first A/D conversion circuit 503-1 are formed to correspond to the first charge storage circuits 103*a*, 103*e*, 103*i*, and 103*m* included in the pixels 100*a*, 100*e*, 100*i*, and 100*m* of the first column. Similarly, in the first reading substrate 21, the first reading circuit 501-2, the differential circuit 502-2, and the first A/D conversion circuit 503-2 are formed to correspond to the first charge storage circuits 103 included in the pixels of the second column. Similarly, in the first reading substrate 21, the first reading circuit 501-3, the differential circuit 502-3, and the first A/D conversion circuit 503-3 are formed to correspond to the first charge storage circuits 103 included in the pixels of the third column. The first reading circuit 501-4, the differential circuit 502-4, and the first A/D conversion circuit 503-4 are formed to correspond to the first charge storage circuits 103 included in the pixels of the fourth column.

In FIG. 9, in the second reading substrate 31, 4 second charge storage circuits 104 corresponding to a set of pixels (hereinafter referred to as a "pixel set") that form one set for every 2 rows and 2 columns are formed for 16 pixels included in the pixel signal processing unit 10 of the solid-state imaging device 1. In FIG. 9, one second charge storage circuit 104 is configured to correspond to 4 adjacent pixels, but a pixel set to which one second charge storage circuit 104 corresponds is configured such that the centroids of the pixels of the same color do not deviate, as shown in (B) of FIG. 6.

More specifically, in the second reading substrate 31, the second charge storage circuit 104*abef* corresponding to a pixel set formed by the pixels 100*a*, 100*b*, 100*e*, and 100*f* is formed. Similarly, in the second reading substrate 31, the second charge storage circuit 104*cdgh* corresponding to a pixel set formed by the pixels 100*c*, 100*d*, 100*g*, and 100*h* is formed, the second charge storage circuit 104*ijmn* corresponding to a pixel set formed by the pixels 100*i*, 100*j*, 100*m*, and 100*n* is formed, and the second charge storage circuit 104*klop* corresponding to a pixel set formed by the pixels 100*k*, 100*l*, 100*o*, and 100*p* is formed. Accordingly, in the solid-state imaging device 1 shown in FIG. 9, the number of pixels included in the pixel signal processing unit 10 can be reduced to ¼.

In the second reading substrate 31, 2 second reading circuits 511 and 2 second A/D conversion circuits 513 corresponding to each column of the second charge storage circuits 104, that is, each column of a pixel set formed by 4 pixels among 16 pixels included in the solid-state imaging device 1, are formed.

More specifically, in the second reading substrate 31, the second reading circuit 511-1 and the second A/D conversion circuit 513-1 are formed to correspond to the second charge storage circuit 104*abef* and the second charge storage circuit 104*ijmn* of the first column. Similarly, in the second reading substrate 31, the second reading circuit 511-2 and the second A/D conversion circuit 513-2 are formed to correspond to the second charge storage circuit 104*cdgh* and the second charge storage circuit 104*klop* of the second column.

The first charge storage circuits 103*a* to 103*p* hold (store) the signal charges generated by the corresponding photoelectric conversion units 101*a* to 101*p* (not shown) and output the signal voltages according to the held signal charges as the full-resolution image signals S1 to the corresponding first reading circuits 501 in the differential AD conversion unit 50. The second charge storage circuits 104*abef*, 104*cdgh*, 104*ijmn*, and 104*klop* hold (store) the signal charges for reducing the number of pixels of the pixels 100*a* to 100*p* included in the pixel signal processing unit 10 to ¼ by arithmetically averaging the signal charges generated by the corresponding photoelectric conversion units 101*a* to 101*p* (not shown) and transmitted from the corresponding first charge storage circuits 103*a* to 103*p*. The second charge storage circuits 104*abef*, 104*cdgh*, 104*ijmn*, and 104*klop* output the signal voltages according to the held signal charges as the reduced image signals S2 to the corresponding second reading circuits 511 in the differential AD conversion unit 50.

The first reading circuits 501-1 to 501-4 sequentially read the full-resolution image signals S1 from the first charge storage circuits 103*a* to 103*p* of the corresponding column and output the full-resolution image signals S1 to the corresponding differential circuits 502-1 to 502-4. The second reading circuits 511-1 and 511-2 sequentially read the reduced image signals S2 from the second charge storage circuits 104*abef*, 104*cdgh*, 104*ijmn*, and 104*klop* of the corresponding column and output the reduced image signals S2 to the corresponding differential circuits 502-1 to 502-4 and the second A/D conversion circuits 513-1 and 513-2. The reduced image signals S2 sequentially read by the second reading circuits 511-1 and 511-2 are output to the corresponding differential circuits 502-1 to 502-4 formed in the first reading substrate 21 via the same inter-substrate connection unit (not shown) as the second inter-substrate connection unit 22.

The first reading circuits 501-1 to 501-4 and the second reading circuits 511-1 and 511-2 may be configured to have a function of performing a process of removing noise from the read full-resolution image signals S1 and reduced image signals S2, for example, a function for a correlated double sampling (CDS) process, as the function of these reading circuits.

Accordingly, the differential circuits 502-1 to 502-4 output the differential pixel signals Vout obtained by calculating the differences between the full-resolution image signals S1 input from the corresponding first reading circuits 501 and the reduced image signals S2 input from the corresponding second reading circuits 511, to the corresponding first A/D conversion circuits 503-1 to 503-4. More specifically, the differential circuit 502-1 outputs the differential pixel signal Vout obtained by calculating the difference between the full-resolution image signal S1-1 input from the corresponding first reading circuit 501-1 and the reduced image signal S2-1 input from the corresponding second reading circuit 511-1 to the corresponding first A/D conversion circuit 503-1. The differential circuit 502-2 outputs the differential pixel signal Vout obtained by calculating the difference between the full-resolution image signal S1-2 input from the corresponding first reading circuit 501-2 and the reduced image signal S2-1 input from the corresponding second reading circuit 511-1 to the corresponding first A/D conversion circuit 503-2. The differential circuit 502-3 outputs the differential pixel signal Vout obtained by calculating the difference between the full-resolution image signal S1-3 input from the corresponding first reading circuit 501-3 and the reduced image signal S2-3 input from the corresponding second reading circuit 511-3 to the corresponding first A/D conversion circuit 503-3. The differential circuit 502-4 outputs the differential pixel signal Vout obtained by calculating the difference between the full-resolution image signal S1-4 input from the corresponding first reading circuit 501-4 and the reduced image signal S2-3 input from the corresponding second reading circuit 511-3 to the corresponding first A/D conversion circuit 503-4.

The first A/D conversion circuits 503-1 to 503-4 output the image data obtained by performing the analog/digital conversion on the differential pixel signals Vout input from the corresponding differential circuits 502-1 to 502-4, that is, the image data corresponding to the full-resolution image signals S1 of all the pixels included in the pixel signal processing unit 10. The second A/D conversion circuits 513-1 and 513-2 output the image data obtained by performing the analog/digital conversion on the reduced image signals S2 input from the corresponding second reading circuits 511-1 and 511-2, that is, the image data in which the number of pixels included in the pixel signal processing unit 10 is reduced to ¼.

According to the first embodiment, the solid-state imaging device 1 is configured to include: the photoelectric conversion substrate (the photoelectric conversion substrate 11) in which the plurality of photoelectric conversion units 101a and 101b are disposed; a first substrate (the first reading substrate 21) in which a plurality of the first charge storage circuits 103a and 103b and the second charge storage circuits 104 are disposed; a second substrate (the second reading substrate 31) in which another plurality of the first charge storage circuits 103a and 103b and the second charge storage circuits 104 are disposed; a first connection unit (the first inter-substrate connection unit 12a or 12b) configured to electrically connect the photoelectric conversion substrate 11 to the first reading substrate 21; and a second connection unit (the second inter-substrate connection unit 22a or 22b) configured to electrically connect the first reading substrate 21 to the second reading substrate 31. The plurality of differential circuits 502 and the plurality of first A/D conversion circuits 503 are disposed in one of the first reading substrate 21 and the second reading substrate 31 in which the first charge storage circuits 103a 103b of the corresponding pixels (the pixels 100a and 100b) are disposed. The plurality of second A/D conversion circuits 513 are disposed in the other of the first reading substrate 21 and the second reading substrate 31 in which the corresponding second charge storage circuits 104 are disposed.

According to the first embodiment, in the configuration of the solid-state imaging device 1, the first inter-substrate connection unit 12a or 12b is disposed between the photoelectric conversion substrate 11 and the first reading substrate 21, the first inter-substrate connection unit 12a or 12b corresponds to each of either the plurality of first charge storage circuits 103a and 103b or the plurality of second charge storage circuits 104 which are disposed on the first reading substrate 21, and the first inter-substrate connection unit 12a or 12b electrically connects signal lines of the first signal charges transmitted from the photoelectric conversion units (the photoelectric conversion units 101a and 101b) disposed in the photoelectric conversion substrate 11 to one of the corresponding first charge storage circuits 103a and 103b and the second charge storage circuit 104 disposed in the first reading substrate 21 between the photoelectric conversion substrate 11 and the first reading substrate 21. Further, the second inter-substrate connection unit 22a or 22b is disposed between the first reading substrate 21 and the second reading substrate 31, the second inter-substrate connection unit 22a or 22b corresponds to each of the other of the plurality of first charge storage circuits 103a and 103b and the plurality of second charge storage circuits 104 disposed in the photoelectric conversion substrate 11, and the second inter-substrate connection unit 22a or 22b electrically connects signal lines of the first signal charges transmitted from the photoelectric conversion units (the photoelectric conversion units 101a and 101b) disposed in the photoelectric conversion substrate 11 to the other of the plurality of first charge storage circuits 103a and the plurality of second charge storage circuits 103b, and the plurality of second charge storage circuits 104 disposed in the second reading substrate 31 via the first reading substrate 21 to signal lines of the second pixel signals for calculating differences from the full-resolution image signals S1 corresponding to the differential circuits 502 between the first reading substrate 21 and the second reading substrate 31.

As described above, in the solid-state imaging device 1 according to the first embodiment, the full-resolution image signals S1 of all the pixels and the reduced image signals S2 in which the number of pixels is reduced are held separately based on the signal charges obtained through the same one-time exposure of the pixels included in the pixel signal processing unit 10. In the solid-state imaging device 1 according to the first embodiment, the held pixel signals are subjected to the analog/digital conversion and both of the image data corresponding to the full-resolution image signals S1 of all the pixels (hereinafter referred to as "full-resolution image data") and the image data corresponding to the reduced image signals S2 in which the number of pixels is reduced (hereinafter referred to as "reduced image data") are output. At this time, in the solid-state imaging device 1 according to the first embodiment, the image data obtained by performing the analog/digital conversion on the differential pixel signals Vout taking the difference between the full-resolution image signals S1 and the reduced image signals S2 is output as the full-resolution image data corresponding to all the pixels included in the pixel signal processing unit 10. The differential pixel signal Vout is a pixel signal in a state in which the dynamic range of the signal charges generated by each of the pixels included in the pixel signal processing unit 10 is narrowed. Therefore, in the solid-state imaging device 1 according to the first embodiment, it is possible to shorten the counting time of the counter CNT included in the first A/D conversion circuit 503 when the analog/digital conversion is performed to output the full-resolution image data, and thus it is possible to reduce the number of bits of the counter CNT. Accordingly, in the solid-state imaging device 1 according to the first embodiment, it is possible to reduce the power consumption of the first A/D conversion circuit 503 when the full-resolution image data is output more than the power consumption when the A/D conversion circuit included in the solid-state imaging device of the related art outputs image data of all the pixels.

In the solid-state imaging device 1 according to the first embodiment, the image data obtained by directly performing the analog/digital conversion on the reduced image signal S2 is output as the reduced image data in which the number of pixels included in the pixel signal processing unit 10 is reduced. The number of bits of the reduced image data output by the solid-state imaging device 1 according to the first embodiment is the same as the number of bits of the image data output by the A/D conversion circuit included in the solid-state imaging device of the related art. Here, since the reduced image signals S2 are the pixel signals in which the number of pixels is reduced, it is possible to output the reduced image data in a state in which the power consumption is reduced more than when the A/D conversion circuit included in the solid-state imaging device of the related art outputs the image data of all the pixels. Accordingly, in the solid-state imaging device 1 according to the first embodiment, it is possible to output both of the full-resolution image data and the reduced image data in the state in which the power consumption is reduced overall more than that of the solid-state imaging device of the related art. Accordingly, it is possible to achieve low power consumption of the solid-state imaging device 1 according to the first embodiment or the imaging system on which the solid-state imaging device 1 according to the first embodiment is mounted.

In the first and second configuration examples of the pixel signal processing unit 10 in the solid-state imaging device 1 according to the first embodiment, the configuration of the multi-layered substrate structure formed by three substrates, the photoelectric conversion substrate 11, the first reading substrate 21, and the second reading substrate 31, has been described based on the minimum configuration of the pixel signal processing unit 10 of the solid-state imaging device 1 shown in FIG. 1. However, the configuration of the pixel signal processing unit 10 in the solid-state imaging device 1 is not limited to the configuration of the pixel signal processing unit 10 in the solid-state imaging device 1 according to the first embodiment. For example, the signal charges obtained by averaging the signal charges corresponding to the pixels 100a and 100b and held in the second charge storage circuit 104 can also be further averaged. For example, in the second charge storage circuit 104, the number of pixels included in the pixel signal processing unit 10 is reduced in one stage, but it can also be further reduced in one or more stages. In this case, the pixel signal processing unit 10 in the solid-state imaging device 1 according to the first embodiment is considered to be more multi-layered. In the pixel signal processing unit 10 in the solid-state imaging device 1 according to the first embodiment, the number of stages in which the number of pixels included in the pixel signal processing unit 10 is reduced is not particularly defined.

Figure 10:
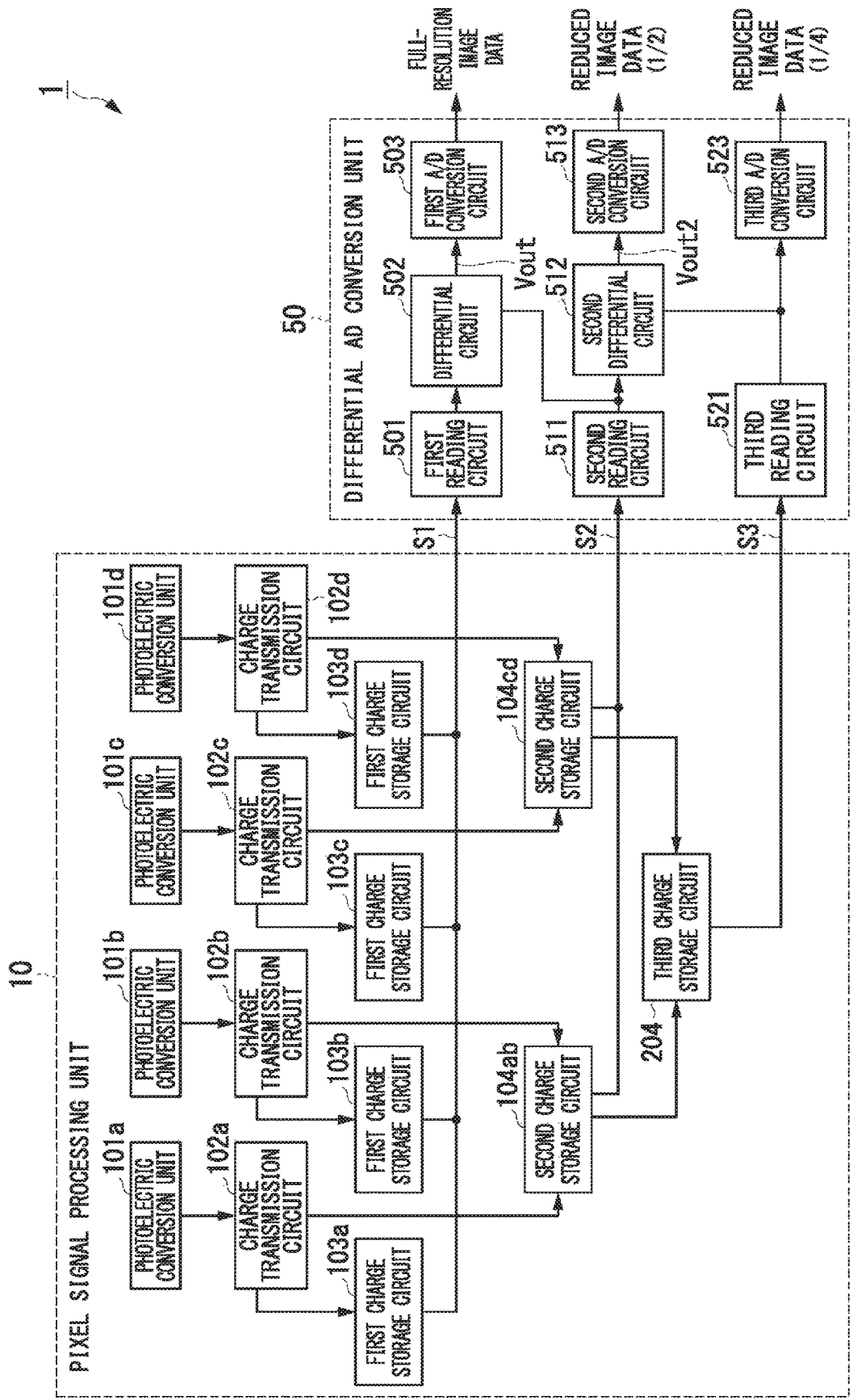
FIG. 10 is a block diagram showing a schematic configuration of a modified example of the solid-state imaging device according to the first embodiment.

An example of the configuration of the solid-state imaging device 1 when the pixel signal processing unit 10 of the solid-state imaging device 1 according to the first embodiment is configured such that the number of pixels is reduced in one or more stages than the pixel signal processing unit 10 of the solid-state imaging device 1 shown in FIG. 1 will be described. FIG. 10 is a block diagram showing a schematic configuration of a modification example of the solid-state imaging device 1 according to the first embodiment. In a modification example of the solid-state imaging device 1 shown in FIG. 10, a case in which four pixels, pixels 100a to 100d, are disposed in the pixel signal processing unit 10 included in the solid-state imaging device 1 will be described. In the solid-state imaging device 1 shown in FIG. 10, constituent elements such as a vertical scanning circuit or a horizontal scanning circuit that drives constituent elements of the pixels disposed in the pixel signal processing unit 10 according to control by a control device included in an imaging system on which the solid-state imaging device 1 is mounted are omitted.

In the following description, to distinguish the pixels to which the constituent elements correspond, that is, pixels 100a to 100d, from each other, reference numerals "a," "b," "c," and "d" denoting the corresponding pixels are suffixed to the reference numerals of the constituent elements for description. More specifically, for example, "a" is suffixed to reference numeral of a constituent element corresponding to the pixel 100a, "b" is suffixed to reference numeral of a constituent element corresponding to the pixel 100b, "c" is suffixed to reference numeral of a constituent element corresponding to the pixel 100c, and "d" is suffixed to reference numeral of a constituent element corresponding to the pixel 100d for description. Reference numerals "a" to "d" are not suffixed to constituent elements commonly corresponding to the pixels 100a to 100d for description. When the corresponding pixels are not distinguished from each other for description despite the fact that the pixels are the constituent element corresponding to the pixels 100a to 100d, reference numerals "a" to "d" are not used and only reference numerals of the constituent elements are used for description.

The pixel signal processing unit 10 of the solid-state imaging device 1 shown in FIG. 10 is configured to include 4 photoelectric conversion units 101a to 101d, 4 charge transmission circuits 102a to 102d, 4 first charge storage circuits 103a to 103d, and 3 other circuits including a second charge storage circuit 104ab, a second charge storage circuit 104cd, and a third charge storage circuit 204.

The differential AD conversion unit 50 of the solid-state imaging device 1 shown in FIG. 10 is configured to include a first reading circuit 501, a differential circuit 502, a first A/D conversion circuit 503, a second reading circuit 511, a second differential circuit 512, a second A/D conversion circuit 513, a third reading circuit 521, and a third A/D conversion circuit 523. In the differential AD conversion unit 50 of the solid-state imaging device 1, the first reading circuit 501, the differential circuit 502, and the first A/D conversion circuit 503 are constituent elements common to the pixels 100a to 100d. In the differential AD conversion unit 50 of the solid-state imaging device 1, the second reading circuit 511, the second differential circuit 512, and the second A/D conversion circuit 513 are constituent elements common to the second charge storage circuit 104ab and the second charge storage circuit 104cd.

The photoelectric conversion units 101a to 101d, the charge transmission circuits 102a to 102d, and the first charge storage circuits 103a to 103d are the same constituent elements as the photoelectric conversion unit 101a and 101b, the charge transmission circuits 102a and 102b, and the first charge storage circuits 103a and 103b of the pixel signal processing unit 10 of the solid-state imaging device 1 shown in FIG. 1. Accordingly, a detailed description of the constituent elements will be omitted.

The second charge storage circuits 104ab and 104cd are circuits (averaging charge storage circuits) that hold (store) signal charges obtained by averaging the charge amounts of the signal charges generated by the corresponding photoelectric conversion units 101 and transmitted from the corresponding two charge transmission circuits 102, as in the second charge storage circuit 104 of the pixel signal processing unit 10 of the solid-state imaging device 1 shown in FIG. 1. In the pixel signal processing unit 10 of the solid-state imaging device 1 shown in FIG. 10, the second charge storage circuit 104ab corresponds to the charge transmission circuits 102a and 102b, that is, corresponds to the photoelectric conversion units 101a and 101b. The second charge storage circuit 104cd corresponds to the charge transmission circuits 102c and 102d, that is, corresponds to the photoelectric conversion units 101c and 101d.

The second charge storage circuits 104ab and 104cd also transmit the averaged signal charges to the third charge storage circuit 204. That is, the second charge storage circuits 104ab and 104cd have the same function as the charge transmission circuit 102a or 102b. More specifically, the second charge storage circuits 104ab and 104cd have a function of transmitting the held averaged signal charges to the third charge storage circuit 204, instead of the signal charges generated and stored by the corresponding photoelectric conversion units 101 and transmitted to the first charge storage circuit 103 and the second charge storage circuit 104 by the charge transmission circuit 102. The signal charges transmitted to the third charge storage circuit 204 by the second charge storage circuits 104ab and 104cd may be the signal charges generated by the corresponding photoelectric conversion units 101 and transmitted from the corresponding two charge transmission circuits 102 instead of the averaged signal charges.

The third charge storage circuit 204 is a circuit (averaged-charge storage circuit) that holds (stores) the signal charges obtained by averaging the charge amount of the signal charges input from the second charge storage circuits 104ab and 10bcd. That is, the third charge storage circuit 204 is a circuit that holds the signal charges in a state in which the number of pixels included in the pixel signal processing unit 10 of the solid-state imaging device 1 is reduced, as in the second charge storage circuit 104 of the pixel signal processing unit 10 of the solid-state imaging device 1 shown in FIG. 1 or the second charge storage circuits 104ab and 104cd. Here, the third charge storage circuit 204 holds the signal charges in a state in which the number of pixels is further reduced after the number of pixels included in the pixel signal processing unit 10 of the solid-state imaging device 1 is reduced by the second charge storage circuits 104ab and 104cd.

The third charge storage circuit 204 is also a circuit that outputs a signal voltage according to the held signal charges in the state in which the number of pixels is further reduced as a pixel signal S3 (hereinafter referred to as a "reduced image signal S3") to the third reading circuit 521 in the differential AD conversion unit 50.

The configuration of the third charge storage circuit 204 is considered to be the same as the configuration of the second charge storage circuit 104 described in the first and second configuration examples of the pixel signal processing unit 10 in the solid-state imaging device 1 according to the first embodiment. That is, a third charge storage unit corresponding to the second charge storage units (the second charge storage units 210, 210a, and 210b) included in the second charge storage circuit 104 in the first and second configuration examples is considered to be included.

The first reading circuit 501, the differential circuit 502, and the first A/D conversion circuit 503 are the same constituent elements as the first reading circuit 501, the differential circuit 502, and the first A/D conversion circuit 503 of the differential AD conversion unit 50 of the solid-state imaging device 1 shown in FIG. 1. Accordingly, a detailed description of the constituent elements will be omitted.

The second reading circuit 511 outputs the read reduced image signals S2 to the second differential circuit 512 instead of outputting the reduced image signals S2 to the second A/D conversion circuit 513, and thus is the same constituent element as the second reading circuit 511 of the differential AD conversion unit 50 of the solid-state imaging device 1 shown in FIG. 1. Accordingly, a detailed description of the second reading circuit 511 will be omitted.

The third reading circuit 521 is a circuit that sequentially reads the reduced image signal S3 in the state in which the number of pixels is further reduced from the third charge storage circuit 204 in the pixel signal processing unit 10 and sequentially outputs the read reduced image signals S3 to the second differential circuit 512 and the third A/D conversion circuit 523.

When the third charge storage circuit 204 in the pixel signal processing unit 10 is configured to directly output the signal voltages (the reduced image signals S3) according to the held signal charges without arithmetically averaging the signal voltages, the third reading circuit 521 may be configured to sequentially output the reduced image signals S3 to the second differential circuit 512 and the third A/D conversion circuit 523 after the signal voltages (the reduced image signals S3) sequentially read from the third charge storage circuit 204 are arithmetically averaged.

The second differential circuit 512 calculates differences between the reduced image signals S2 which are in the state in which the number of pixels is reduced and are input from the second reading circuit 511 and the reduced image signals S3 which are in the state in which the number of pixels is further reduced and are input from the third reading circuit 521. The second differential circuit 512 outputs the pixel signals obtained by calculating the differences as second differential pixel signals Vout2 to the second A/D conversion circuit 513.

The second A/D conversion circuit 513 performs the analog/digital conversion on the second differential pixel signals Vout2 (analog signals) input from the second differential circuit 512 instead of performing the analog/digital conversion on the reduced image signals S2 (analog signals) input from the second reading circuit 511. The second A/D conversion circuit 513 outputs values (digital values) indicating the magnitudes of the second differential pixel signals Vout2 (analog signals).

The third A/D conversion circuit 523 is a slope integration type A/D conversion circuit (see FIGS. 8A to 8C). The third A/D conversion circuit 523 directly performs the analog/digital conversion on the reduced image signals S3 (analog signals) input from the third reading circuit 521 and outputs values (digital values) indicating the magnitudes of the reduced image signals S3 (analog signals).

According to the first embodiment, in the configuration of the solid-state imaging device 1, the pixel signal processing unit 10 further includes a plurality of third charge storage circuits (the third charge storage circuits 204) configured to hold the second signal charges based on the first signal charges held by the plurality of second charge storage circuits (the second charge storage circuits 104ab and 104cd) and output the second signal voltages according to the held second signal charges as third pixel signals (the reduced image signals S3) further reduced to a pre-determined number of pixels. The differential AD conversion unit 50 further includes a plurality of second differential calculation units (the second differential circuits 512) configured to output pixel signals obtained by calculating differences between the reduced image signals S2 of a corresponding column and the reduced image signals S3 corresponding to the reduced image signals S2 as second differential pixel signals (the second differential pixel signals Vout2) in correspondence with each column of the second charge storage circuits 104ab and 104cd; and a plurality of third analog/digital conversion units (the third A/D conversion circuits 523) configured to perform the analog/digital conversion on the reduced image signals S3 output from the third charge storage circuit 204 of the corresponding column in correspondence with each column of the third charge storage circuit 204 and to output digital values indicating magnitudes of the reduced image signals S3. The plurality of second A/D conversion circuits 513 perform the analog/digital conversion on the second differential pixel signals Vout2 output from the corresponding second differential circuit 512, instead of the reduced image signals S2 output from the second charge storage circuits 104ab and 104cd, and output digital values indicating the magnitudes of the second differential pixel signals Vout2 in which the number of bits is less than the number of bits of the digital values output by the third A/D conversion circuit 523 in correspondence with the plurality of second differential circuits 512.

According to the first embodiment, the solid-state imaging device 1 is configured such that the reduced image signals S3 are the signals of the third signal voltages according to the third signal charges of the averaged charge amounts of the second signal charges based on the first signal charges held by the plurality of corresponding second charge storage circuits (the second charge storage circuits 104ab and 104cd).

In the above-described configuration, in the pixel signal processing unit 10 of the solid-state imaging device 1 shown in FIG. 10, the pixels are exposed during the same exposure period, the signal charges generated in the pixels by the photoelectric conversion units 101 are held in the first charge storage circuits 103. Further, in the pixel signal processing unit 10, the signal charges (the signal charges in which the number of pixels is reduced) obtained by averaging the signal charges are held in the second charge storage circuits 104. The signal charges (the signal charges in which the number of pixels is further reduced) obtained by further averaging the averaged signal charges are held in the third charge storage circuit 204. That is, in the pixel signal processing unit 10 of the solid-state imaging device 1 shown in FIG. 10, the full-resolution image signals S1 of all the pixels included in the pixel signal processing unit 10, the reduced image signals S2 obtained by reducing the number of pixels included in the pixel signal processing unit 10, and the reduced image signals S3 obtained by further reducing the number of pixels can be held separately based on the signal charges obtained by the same one-time exposure.

The differential AD conversion unit 50 of the solid-state imaging device 1 shown in FIG. 10 separately reads the full-resolution image signals S1 held in the first charge storage circuits 103 in the pixel signal processing unit 10, the reduced image signals S2 held in the second charge storage circuits 104, and the reduced image signals S3 held in the third charge storage circuit 204. The differential AD conversion unit 50 of the solid-state imaging device 1 outputs the image data obtained by performing the analog/digital conversion on the read pixel signals. At this time, in the differential AD conversion unit 50 of the solid-state imaging device 1 shown in FIG. 10, the differential circuit 502 calculates the difference between each full-resolution image signal S1 and the reduced image signal S2 to be subjected to the analog/digital conversion and calculates the difference between the reduced image signal S3 and each reduced image signal S2 to be subjected to the analog/digital conversion. Accordingly, the differential AD conversion unit 50 of the solid-state imaging device 1 shown in FIG. 10 can also perform the analog/digital conversion on the full-resolution image signals S1 in which the dynamic range of the full-resolution image signals S1 generated by the photoelectric conversion units 101 in the pixel signal processing unit 10 and obtained through the same exposure is narrowed. Further, the differential AD conversion unit 50 of the solid-state imaging device 1 shown in FIG. 10 can perform the analog/digital conversion on the reduced image signals S2 in which the dynamic range of the reduced image signals S2 in which the number of pixels included in the pixel signal processing unit 10 is reduced is narrowed. Accordingly, it is possible to reduce power consumption of each counter in the differential AD conversion unit 50 of the solid-state imaging device 1 shown in FIG. 10 by shortening a counting time of the counter in the first A/D conversion circuit 503 when the full-resolution image signals S1 are subjected to the analog/digital conversion and a counting time of the counter in the second A/D conversion circuit 513 when the reduced image signal S2 is subjected to the analog/digital conversion. Accordingly, it is possible to achieve a reduction in the power consumption of the solid-state imaging device 1 shown in FIG. 10 or an imaging system on which the solid-state imaging device 1 according to the first embodiment is mounted.

In the solid-state imaging device 1 shown in FIG. 10, it is possible to output the image data corresponding to the full-resolution image signals S1 of all the pixels, the image data corresponding to the reduced image signals S2 in which the number of pixels is reduced, and the image data corresponding to the reduced image signals S3 in which the number of pixels is further reduced. More specifically, as shown in FIG. 10, it is possible to separately output the image data (full-resolution image data) corresponding to the full-resolution image signals S1 of all the pixels included in the pixel signal processing unit 10, the image data (reduced image data (½)) corresponding to the reduced image signals S2 in which the number of pixels included in the pixel signal processing unit 10 is reduced to ½, and the image data (reduced image data (¼)) corresponding to the reduced image signals S3 in which the number of pixels included in the pixel signal processing unit 10 is further reduced to ¼.

Figure 11:
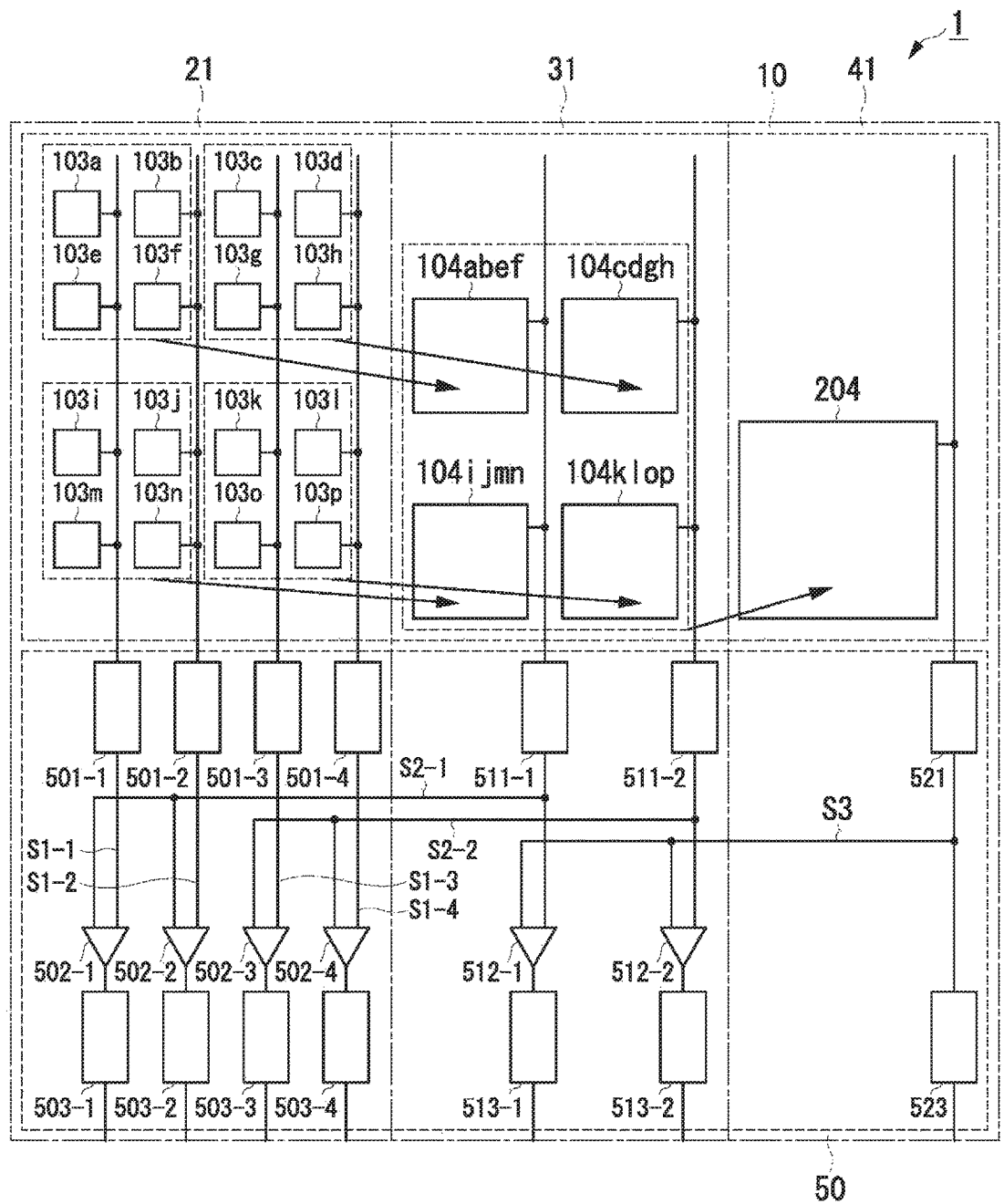
FIG. 11 is a block diagram showing a more specific configuration of the modification example of the solid-state imaging device according to the first embodiment.

An example of a specific configuration of the solid-state imaging device 1 shown in FIG. 10 will be described. FIG. 11 is a block diagram showing a more specific configuration of the modification example of the solid-state imaging device 1 according to the first embodiment. As in the more specific configuration example of the solid-state imaging device 1 according to the first embodiment shown in FIG. 9, FIG. 11 shows an example of the configuration of the first reading substrate 21, the second reading substrate 31, and a third reading substrate 41 in the solid-state imaging device 1 that includes the pixel signal processing unit 10 in which the pixel array of the pixels disposed in the 2-dimensional matrix of 4 rows and 4 columns is formed and has a multi-layered substrate structure formed by four substrates. In FIG. 11, to facilitate the description, the configuration of the photoelectric conversion substrate in which the photoelectric conversion unit 101 and the charge transmission circuit 102 of each pixel shown in FIG. 10 are formed is omitted. In FIG. 11, the inter-substrate connection unit that electrically connects the signal lines of the substrates is also omitted.

In the following description, as in the more specific configuration example of the solid-state imaging device 1 according to the first embodiment shown in FIG. 9, to distinguish the pixels to which the constituent elements correspond, reference numerals denoting the corresponding pixels are suffixed to the reference numerals of the constituent elements as necessary for description. In the following description, as in the more specific configuration example of the solid-state imaging device 1 according to the first embodiment shown in FIG. 9, numerals denoting the corresponding pixels or columns of sets of the pixels are suffixed to reference numerals of the constituent elements for description as necessary to distinguish the corresponding pixels or the columns of the sets of the pixels from each other.

In FIG. 11, 16 first charge storage circuits 103 included in 16 pixels included in the pixel signal processing unit 10 of the solid-state imaging device 1 are formed in the first reading substrate 21. Further, 4 first reading circuits 501, 4 differential circuits 502, and 4 first A/D conversion circuits 503 corresponding to each column of 16 first charge storage circuits 103, that is, each column of 16 pixels included in the solid-state imaging device 1, are formed in the first reading substrate 21. Since the configuration of the first reading substrate 21 is the same as the more specific configuration example of the solid-state imaging device 1 according to the first embodiment shown in FIG. 9, a detailed description thereof will be omitted.

In FIG. 11, in the second reading substrate 31, as in the more specific configuration example of the solid-state imaging device 1 according to the first embodiment shown in FIG. 9, 4 second charge storage circuits 104 corresponding to a pixel set that form one set for every 2 rows and 2 columns are formed for 16 pixels included in the pixel signal processing unit 10 of the solid-state imaging device 1. Since the configuration of the second charge storage circuit 104 in the second reading substrate 31 is the same as the more specific configuration example of the solid-state imaging device 1 according to the first embodiment shown in FIG. 9, a detailed description thereof will be omitted.

In the second reading substrate 31, 2 second reading circuits 511, 2 second differential circuits 512, and 2 second A/D conversion circuits 513 corresponding to each column of the second charge storage circuits 104, that is, each column of a pixel set formed by 4 pixels among 16 pixels included in the solid-state imaging device 1, are formed.

More specifically, in the second reading substrate 31, the second reading circuit 511-1, the second differential circuit 512-1, and the second A/D conversion circuit 513-1 are formed to correspond to the second charge storage circuit 104abef and the second charge storage circuit 104ijmn of the first column. Similarly, in the second reading substrate 31, the second reading circuit 511-2, the second differential circuit 512-2, and the second A/D conversion circuit 513-2 are formed to correspond to the second charge storage circuit 104cdgh and the second charge storage circuit 104klop of the second column.

In FIG. 11, in the third reading substrate 41, one third charge storage circuit 204 corresponding to the pixel set in which 4 pixel sets included in the pixel signal processing unit 10 of the solid-state imaging device 1 are formed as one set, that is, the pixel set in which 16 pixels included in the pixel signal processing unit 10 of the solid-state imaging device 1 are formed as one set, is formed.

More specifically, in the third reading substrate 41, the third charge storage circuit 204 corresponding to the pixel set formed by the second charge storage circuit 104abef, the second charge storage circuit 104cdgh, the second charge storage circuit 104ijmn, and the second charge storage circuit 104klop is formed. Accordingly, in the modification example of the solid-state imaging device 1 shown in 11, the number of pixels included in the pixel signal processing unit 10 can be reduced to ¼ and further reduced to ¼. That is, the number of pixels included in the pixel signal processing unit 10 can be reduced to ¹⁄₁₆.

In the third reading substrate 41, the third reading circuit 521 and the third A/D conversion circuit 523 are formed to correspond to the third charge storage circuit 204. More specifically, in the third reading substrate 41, one third reading circuit 521 and one third A/D conversion circuit 523 corresponding to each column of the third charge storage circuit 204, that is, the column of the pixel set in which 4 pixels are set as one pixel set among 16 pixels included in the solid-state imaging device 1 and four pixel sets are formed as one pixel set, are formed.

Each of the first charge storage circuits 103 outputs the signal voltages (the full-resolution image signals S1) according to the signal charges generated by each of the corresponding photoelectric conversion units 101 (not shown) to the corresponding first reading circuits 501 in the differential AD conversion unit 50, as in the more specific configuration example of the solid-state imaging device 1 according to the first embodiment shown in FIG. 9. Each of the second charge storage circuits 104 arithmetically averages the signal charges generated by each of the corresponding photoelectric conversion units 101 (not shown), as in the more specific configuration example of the solid-state imaging device 1 according to the first embodiment shown in FIG. 9. The second charge storage circuits 104 output the signal voltages (the reduced image signals S2) according to the signal charges in which the number of pixels included in the pixel signal processing unit 10 is reduced to ¼ to the corresponding second reading circuits 511 in the differential AD conversion unit 50. The third charge storage circuit 204 holds (stores) the signal charges for reducing the number of pixels of the pixels 100a to 100p included in the pixel signal processing unit 10 to ¹⁄₁₆ by arithmetically averaging the signal charges generated by each of the corresponding photoelectric conversion units 101a to 101p (not shown) and transmitted from each of the corresponding second charge storage circuits 104abef, 104cdgh, 104ijmn, and 104klop. The third charge storage circuit 204 outputs the signal voltages according to the held signal charges as the reduced image signals S3 to the corresponding third reading circuit 521 in the differential AD conversion unit 50.

Each of the first reading circuits 501 sequentially reads the full-resolution image signals S1 from each of the first charge storage circuits 103 of the corresponding column and outputs the full-resolution image signals S1 to each of the corresponding differential circuits 502, as in the more specific configuration example of the solid-state imaging device 1 according to the first embodiment shown in FIG. 9. Each of the second reading circuits 511 sequentially reads the reduced image signals S2 from each of the second charge storage circuits 104 of the corresponding column and outputs the reduced image signals S2 to each of the corresponding differential circuits 502-1 to 502-4 and the second differential circuits 512-1 and 512-2. The third reading circuit 521 sequentially reads the reduced image signals S3 from the corresponding third charge storage circuit 204 and outputs the reduced image signals S3 to each of the corresponding second differential circuits 512-1 and 512-2 and the third A/D conversion circuit 523. The reduced image signals S2 sequentially read by the second reading circuits 511 are output to the corresponding differential circuits 502-1 to 502-4 formed in the first reading substrate 21 via the same inter-substrate connection unit (not shown) as the second inter-substrate connection unit 22, as in the more specific configuration example of the solid-state imaging device 1 according to the first embodiment shown in FIG. 9. The reduced image signals S3 sequentially read by the third reading circuits 521 are also output to the corresponding second differential circuits 512-1 and 512-2 formed in the second reading substrate 31 via, for example, the inter-substrate connection unit (not shown) as the third inter-substrate connection unit or the like.

The first reading circuits 501-1 to 501-4, the second reading circuits 511-1 and 511-2, and the third reading circuit 521 may be configured to have a function of performing a process of removing noise from the read full-resolution image signals S1, reduced image signals S2, and reduced image signals S3, for example, a function for a CDS process, as the function of these reading circuits.

Accordingly, the differential circuits 502 output the differential pixel signals Vout obtained by calculating the differences between the full-resolution image signals S1 input from the corresponding first reading circuits 501 and the reduced image signals S2 input from the corresponding second reading circuits 511, to the corresponding first A/D conversion circuits 503, as in the more specific configuration example of the solid-state imaging device 1 according to the first embodiment shown in FIG. 9. The first A/D conversion circuits 503 output the image data corresponding to the full-resolution image signals S1 of all the pixels included in the pixel signal processing unit 10 and obtained by performing the analog/digital conversion on the differential pixel signals Vout input from the corresponding differential circuits 502, as in the more specific configuration example of the solid-state imaging device 1 according to the first embodiment shown in FIG. 9.

The second differential circuits 512-1 and 512-2 output the second differential pixel signals Vout2 obtained by calculating the differences between the reduced image signals S2 input from the corresponding second reading circuits 511 and the reduced image signals S3 input from the corresponding third reading circuit 521, to the corresponding second A/D conversion circuits 513-1 and 513-2. More specifically, the second differential circuit 512-1 outputs the second differential pixel signal Vout2 obtained by calculating the difference between the reduced image signal S2-1 input from the corresponding second reading circuit 511-1 and the reduced image signal S3 input from the corresponding third reading circuit 521 to the corresponding second A/D conversion circuit 513-1. The second differential circuit 512-2 outputs the second differential pixel signal Vout2 obtained by calculating the difference between the reduced image signal S2-2 input from the corresponding second reading circuit 511-2 and the reduced image signal S3 input from the corresponding third reading circuit 521 to the corresponding second A/D conversion circuit 513-2. The second A/D conversion circuits 513-1 and 513-2 output the image data obtained by performing the analog/digital conversion on the second differential pixel signals Vout2 input from the corresponding second differential circuits 512-1 and 512-2, that is, the image data in a state in which the dynamic range of the reduced image signals S2 in which the number of pixels included in the pixel signal processing unit 10 is reduced to ¼ is narrowed.

The third A/D conversion circuit 523 outputs the image data obtained by performing the analog/digital conversion on the reduced image signals S3 input from the corresponding third reading circuit 521, that is, the image data in which the number of pixels included in the pixel signal processing unit 10 is reduced to ¹/₁₆.

According to the first embodiment, the plurality of third charge storage circuits 204 and the plurality of third A/D conversion circuits 523 are disposed in a third substrate (the third reading substrate 41). The solid-state imaging device 1 is configured to further include a third connection unit (for example, the third inter-substrate connection unit) configured to electrically connect the second reading substrate 31 to the third reading substrate 41.

According to the first embodiment, the solid-state imaging device 1 is configured such that a third connection unit (for example, the third inter-substrate connection unit) is disposed between the second reading substrate 31 and the third reading substrate 41, the third connection unit corresponds to each of the third charge storage circuits 204 disposed in the third reading substrate 41, and the third connection unit electrically connects signal lines of the third signal charges transmitted from the second charge storage circuits (the second charge storage circuits 104ab and 104cd) disposed in the second reading substrate 31 to the corresponding third charge storage circuits 204 disposed in the third reading substrate 41 to signal lines of the reduced image signals S3 for calculating differences from the corresponding reduced image signals S2 corresponding to the plurality of second differential circuits 512 between the second reading substrate 31 and the third reading substrate 41.

As described above, in the configuration of the modification example of the solid-state imaging device 1 according to the first embodiment, the full-resolution image signals S1 of all the pixels, the reduced image signals S2 in which the number of pixels is reduced, and the reduced image signals S3 in which the number of pixels is further reduced are held separately based on the signal charges obtained through the same one-time exposure of the pixels included in the pixel signal processing unit 10. In the configuration of the modification example of the solid-state imaging device 1 according to the first embodiment, the held pixel signals are subjected to the analog/digital conversion and the image data corresponding to the full-resolution image signals S1 of all the pixels, the image data corresponding to the reduced image signals S2 in which the number of pixels is reduced, and the image data corresponding to the reduced image signals S3 in which the number of pixels is further reduced are output separately. At this time, in the configuration of the modification example of the solid-state imaging device 1 according to the first embodiment, the image data obtained by performing the analog/digital conversion on the differential pixel signals Vout taking the difference between the full-resolution image signals S1 and the reduced image signals S2 is output as the full-resolution image data corresponding to all the pixels included in the pixel signal processing unit 10.

The image data obtained by performing the analog/digital conversion on the second differential pixel signals Vout2 taking the differences between the reduced image signals S2 and S3 is output as the reduced image data (¼) in which the number of pixels included in the pixel signal processing unit 10 is reduced to ¼. The differential pixel signal Vout and the second differential pixel signal Vout2 are pixel signals in a state in which the dynamic range of the full-resolution image signals S1 or the reduced image signals S2 is narrowed. Therefore, it is possible to shorten the counting time of the counter CNT included in the first A/D conversion circuit 503 or the second A/D conversion circuit 513, and thus it is possible to reduce the number of bits of the counter CNT. Accordingly, in the configuration of the modification example of the solid-state imaging device 1 according to the first embodiment, it is possible to reduce the power consumption of the first A/D conversion circuit 503 and the second A/D conversion circuit 513 outputting the full-resolution image data and the reduced image data ($\frac{1}{4}$).

In the configuration of the modification example of the solid-state imaging device 1 according to the first embodiment, the image data obtained by directly performing the analog/digital conversion on the reduced image signal S3 is output as reduced image data ($\frac{1}{16}$) in which the number of pixels included in the pixel signal processing unit 10 is reduced to $\frac{1}{16}$. The number of bits of the reduced image data ($\frac{1}{16}$) output in the configuration of the modification example of the solid-state imaging device 1 according to the first embodiment is the same as the number of bits of the image data output by the A/D conversion circuit included in the solid-state imaging device of the related art, but the reduced image signals S3 are the pixel signals in which the number of pixels is further reduced. Therefore, it is possible to output the image data in a state in which the power consumption is reduced more than when the A/D conversion circuit included in the solid-state imaging device of the related art outputs the image data of all the pixels. Accordingly, in the configuration of the modification example of the solid-state imaging device 1 according to the first embodiment, it is possible to output the full-resolution image data and the reduced image data in the state in which the power consumption is reduced overall, as in the more specific configuration example of the solid-state imaging device 1 according to the first embodiment shown in FIG. 9. Accordingly, it is possible to achieve low power consumption of the configuration of the modification example of the solid-state imaging device 1 according to the first embodiment or the imaging system on which the configuration of the modification example of the solid-state imaging device 1 according to the first embodiment is mounted.

The pixel signal processing unit 10 in the configuration of the modification example of the solid-state imaging device 1 shown in FIGS. 10 and 11 is configured such that the second charge storage circuits 104 hold the signal charges obtained by averaging the charge amounts of the signal charges generated by the photoelectric conversion units 101 included in the pixels forming the corresponding the pixel set and the third charge storage circuit 204 holds the signal charges obtained by further averaging the charge amounts of the signal charges generated by the photoelectric conversion units 101 included in the pixels of each pixel set. However, the configuration of the pixel signal processing unit 10 of the solid-state imaging device 1 according to the first embodiment and the number of stages in which the number of pixels included in the pixel signal processing unit 10 is reduced are not limited to the configurations shown in FIGS. 10 and 11.

In FIG. 11, the configuration in which one third charge storage circuit 204 corresponds to 4 adjacent pixel sets is shown. However, when color filters are attached to the solid-state imaging device 1, the pixel sets to which one third charge storage circuits 204 corresponds are configured such that the centroids do not deviate in the same color, as shown in (B) of FIG. 6.

For example, in the pixel signal processing unit 10 of the modification example of the solid-state imaging device 1 shown in FIG. 11, the pixel sets to which the third charge storage circuit 204 corresponds are considered such that centroids do not deviate in the same color, as in the pixel sets of the second charge storage circuits 104 in which the number of pixels included in the pixel array is reduced to $\frac{1}{3}$ in the row direction and $\frac{1}{3}$ in the column direction, as shown in (B) of FIG. 6. In this case, in the solid-state imaging device 1 having the configuration of the pixel signal processing unit 10 shown in FIG. 11, the third charge storage circuit 204 outputs the reduced image signals S3 in which the signal charges in which the total number of pixels is reduced to $\frac{1}{9}$ by the second charge storage circuits 104 are further reduced to $\frac{1}{3}$ in the row direction and $\frac{1}{3}$ in the column direction. That is, in the solid-state imaging device 1 having the configuration of the pixel signal processing unit 10 shown in FIG. 11, the third charge storage circuit 204 outputs the reduced image signals S3 in which the total number of pixels included in the pixel array is reduced to $\frac{1}{81}$.

In the solid-state imaging device 1 according to the first embodiment to which the color filters are attached, the multi-layered structure is considered to be more advantageous than a monolithic structure. This is because as the number of stages at which the number of pixels in the pixel signal processing unit 10 of the solid-state imaging device 1 according to the first embodiment is reduced increases, regions necessary for the second charge storage circuit 104 and the third charge storage circuit 204 holding the reduced signal charges and a charge storage circuit or the like holding the signal charges in which the number of pixels is reduced at a further subsequent stage increase in the solid-state imaging device 1. Here, for example, the first reading substrate 21 in which the first charge storage circuits 103 are formed and the second reading substrate 31 in which the second charge storage circuits 104 are formed are formed in a monolithic structure, so that a structure in which the monolithic structure and the multi-layered substrate structure are combined can be realized as necessary.

According to the first embodiment, the solid-state imaging device 1 is configured to include a photoelectric conversion substrate (the photoelectric conversion substrate 11) in which the plurality of photoelectric conversion units 10a and 101b are disposed; a first substrate (the first reading substrate 21) in which the plurality of first charge storage circuits 103a and 103b and the plurality of second charge storage circuit 104 are disposed; and first connection unit (the first inter-substrate connection unit 12a or 12b) configured to electrically connect the photoelectric conversion substrate 11 to the first reading substrate 21. The differential circuit 502, the first A/D conversion circuits 503, and the second A/D conversion circuits 513 are disposed in the first reading substrate 21.

According to the first embodiment, the solid-state imaging device 1 is configured such that the first inter-substrate connection unit 12a or 12b is disposed between the photoelectric conversion substrate 11, the first inter-substrate connection unit 12a or 12b corresponds to at least one of the plurality of first charge storage circuits 103a, the plurality of first charge storage circuits 103b, and the plurality of second charge storage circuits 104 disposed in the first reading substrate 21, and the first inter-substrate connection unit 12a or 12b electrically connects signal lines of the first signal charges transmitted from the photoelectric conversion units (the photoelectric conversion units 101a and 101b) disposed in the photoelectric conversion substrate 11 to at least some of the corresponding first charge storage circuits 103a, second charge storage circuits 103b, and second charge storage circuits 104 disposed in the first reading substrate 21 between the photoelectric conversion substrate 11 and the first reading substrate 21.

According to the first embodiment, the solid-state imaging device 1 is configured such that the plurality of third charge storage circuits 204 and the plurality of third A/D conversion circuits 523 are further disposed in the first reading substrate 21.

As described above, in the solid-state imaging device 1 according to the first embodiment, the pixel signals of all the pixels and the pixel signals in which the number of pixels is reduced are output separately based on the signal charges obtained through the same one-time exposure of the pixels included in the pixel signal processing unit 10. In the solid-state imaging device 1 according to the first embodiment, the differential AD conversion unit 50 performs the analog/digital conversion on the pixel signals after the dynamic range is narrowed using the pixel signals in which the number of pixels included in the pixel signal processing unit 10 is reduced at one stage. Accordingly, in the solid-state imaging device 1 according to the first embodiment, it is possible to shorten the counting time of the counter CNT included in the A/D conversion circuit (the first A/D conversion circuit 503 or the first A/D conversion circuit 503 and the second A/D conversion circuit 513 in the modification example) in which the corresponding number of pixels is large in the analog/digital conversion, and thus it is possible to reduce the number of bits of the counter CNT and reduce the power consumption of the A/D conversion circuit. In the solid-state imaging device 1 according to the first embodiment, the differential AD conversion unit 50 directly performs the analog/digital conversion on the pixel signals in which the number of pixels included in the pixel signal processing unit 10 is reduced. However, the pixel signals in which the number of pixels is most reduced are the pixel signals in which the corresponding number of pixels is the smallest in the analog/digital conversion. Therefore, the power consumption of the A/D conversion circuit is not large. Accordingly, in the solid-state imaging device 1 according to the first embodiment, it is possible to output the image data (the full-resolution image data) obtained by performing the analog/digital conversion on the pixel signals of all the pixels and the image data (the reduced image data) obtained by performing the analog/digital conversion on the pixel signals in which the number of pixels is reduced while reducing the power consumption overall. Accordingly, it is possible to achieve a reduction in the power consumption of the solid-state imaging device 1 according to the first embodiment or an imaging system on which the solid-state imaging device 1 according to the first embodiment is mounted.

Second Embodiment

Next, a second embodiment of the present invention will be described. A pixel signal processing unit included in a solid-state imaging device (hereinafter referred to as a "solid-state imaging device 2") according to the second embodiment is the same as the pixel signal processing unit 10 included in the solid-state imaging device 1 according to the first embodiment. Accordingly, in the description of the solid-state imaging device 2 according to the second embodiment, a detailed description of a configuration in which the pixel signal processing unit 10 is included in the solid-state imaging device 2 will be omitted and the configuration of a differential AD conversion unit included in the solid-state imaging device 2 according to the second embodiment will be described. Here, in the following description, the pixel signal processing unit 10 outputting image signals to the differential AD conversion unit included in the solid-state imaging device 2 according to the second embodiment is assumed to have the configuration of the pixel signal processing unit 10 shown in FIG. 10 to which the color filters are attached. In the description, the pixel signal processing unit 10 is the pixel signal processing unit 10 that separately outputs the full-resolution image signals S1 of the total number of pixels included in the pixel array, the reduced image signals S2 in which the number of pixels is reduced to $\frac{1}{9}$, and the reduced image signals S3 in which the number of pixels is reduced to $\frac{1}{81}$.

When the frequency of each reading circuit included in the differential AD conversion unit included in the solid-state imaging device 2 according to the second embodiment is assumed to be the same as the frequency of a clock at which each pixel signal is read from the pixel signal processing unit 10 included in the solid-state imaging device 2, reading of the reduced image signals S2 in which the number of pixels is reduced to $\frac{1}{9}$ is completed in $\frac{1}{9}$ of the time necessary to read the full-resolution image signals S1 and reading of the reduced image signals S3 in which the number of pixels is reduced to $\frac{1}{81}$ is completed in $\frac{1}{81}$ of the time necessary to read the full-resolution image signals S1. The reading of the reduced image signals S3 is completed in $\frac{1}{9}$ of the time necessary to read the reduced image signals S2. Accordingly, the analog/digital conversion of the reduced image signals S2 can be completed 9 times as fast as the analog/digital conversion on the full-resolution image signals S1. The analog/digital conversion of the reduced image signals S3 can be completed 81 times as fast as the analog/digital conversion on the full-resolution image signals S1.

In the differential AD conversion unit included in the solid-state imaging device 2 according to the second embodiment, the analog/digital conversion on the reduced image signals S3 can be completed faster than the analog/digital conversion on the reduced image signals S2 or the full-resolution image signals S1. Using this, information necessary at the time of the analog/digital conversion on the reduced image signals S2 and the full-resolution image signals S1 can be acquired faster, for example, when the dynamic range of the reduced image signals S2 and the full-resolution image signals S1 is confirmed. The differential AD conversion unit included in the solid-state imaging device 2 according to the second embodiment is a differential AD conversion unit that has a configuration example in which the reduced image signals S3 are first read from the pixel signal processing unit 10 and the maximum number of bits at the time of the analog/digital conversion on differential pixel signals corresponding to the reduced image signals S2 and the full-resolution image signals S1 is determined based on the read reduced image signals S3.

Figure 12:
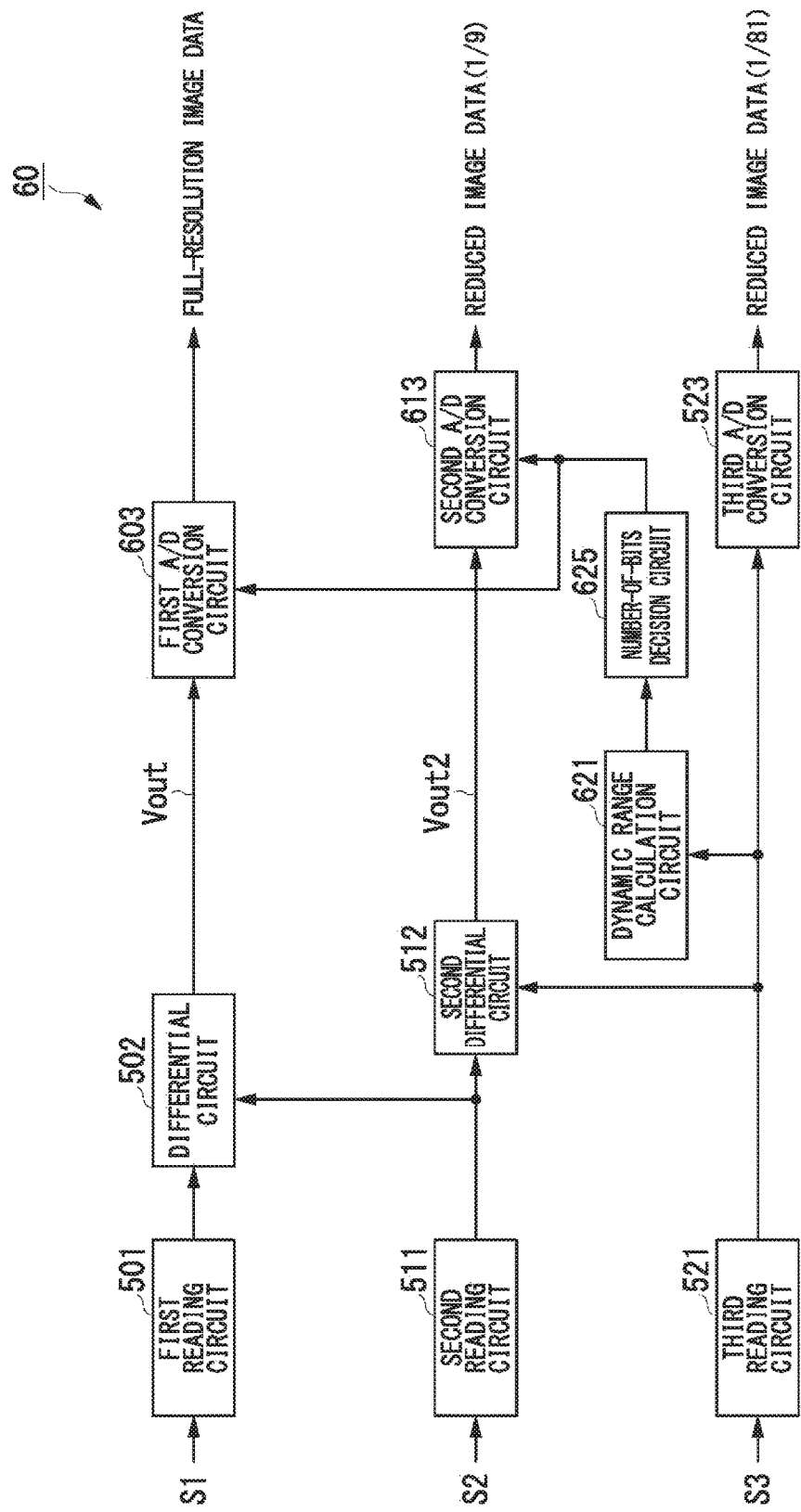
FIG. 12 is a block diagram showing a schematic configuration of a differential AD conversion unit included in a solid-state imaging device according to a second embodiment of the present invention.

FIG. 12 is a block diagram showing a schematic configuration of the differential AD conversion unit included in the solid-state imaging device 2 according to the second embodiment of the present invention. A differential AD conversion unit 60 of the solid-state imaging device 2 shown in FIG. 12 is configured to include a first reading circuit 501, a differential circuit 502, a first A/D conversion circuit 603, a second reading circuit 511, a second differential circuit 512, a second A/D conversion circuit 613, a third reading circuit 521, a third A/D conversion circuit 523, a dynamic range calculation circuit 621, and a number-of-bits decision circuit 625.

In the solid-state imaging device 2 according to the second embodiment, the dynamic range calculation circuit 621 and the number-of-bits decision circuit 625 included in the differential AD conversion unit 60 form an analog/digital conversion mode control unit that controls the analog/digital conversion in the first A/D conversion circuit 603 and the second A/D conversion circuit 613.

In the constituent elements of the differential AD conversion unit 60 included in the solid-state imaging device 2 according to the second embodiment, the same reference numerals are given to the same constituent elements as the constituent elements of the differential AD conversion unit 50 included in the solid-state imaging device 1 according to the first embodiment. A detailed description of the constituent elements will be omitted.

The dynamic range calculation circuit 621 calculates the dynamic ranges of the full-resolution image signals S1 and the reduced image signals S2 obtained through the same exposure based on the reduced image signals S3 read from the pixel signal processing unit 10 included in the solid-state imaging device 2 by the third reading circuit 521. That is, the dynamic range calculation circuit 621 calculates the dynamic range of pixels included in one corresponding pixel set. The dynamic range calculation circuit 621 outputs information regarding the calculated dynamic range to the number-of-bits decision circuit 625.

The dynamic range calculation circuit 621 can be configured to calculate the dynamic ranges of the corresponding full-resolution image signals S1 and the reduced image signals S2 obtained through the same exposure based on the reduced image signals S3 of one column read by the third reading circuit 521. In this case, the dynamic range calculation circuit 621 may be configured to include a storage circuit such as a memory capable of holding the reduced image signals S3 of one column.

Based on the information regarding the dynamic range input from the dynamic range calculation circuit 621, the number-of-bits decision circuit 625 determines the maximum number of pixels at the time of the analog/digital conversion on differential pixel signals Vout (analog signals) corresponding to the full-resolution image signals S1 and the second differential pixel signals Vout2 (analog signals) corresponding to the reduced image signals S2 obtained through the same exposure. Then, the number-of-bits decision circuit 625 outputs a number-of-bits control signal for performing the analog/digital conversion on the differential pixel signals Vout with the determined number of bits to the first A/D conversion circuit 603 and outputs a number-of-bits control signal for performing the analog/digital conversion on the second differential pixel signals Vout2 with the determined number of bits to the second A/D conversion circuit 613.

Figure 13:
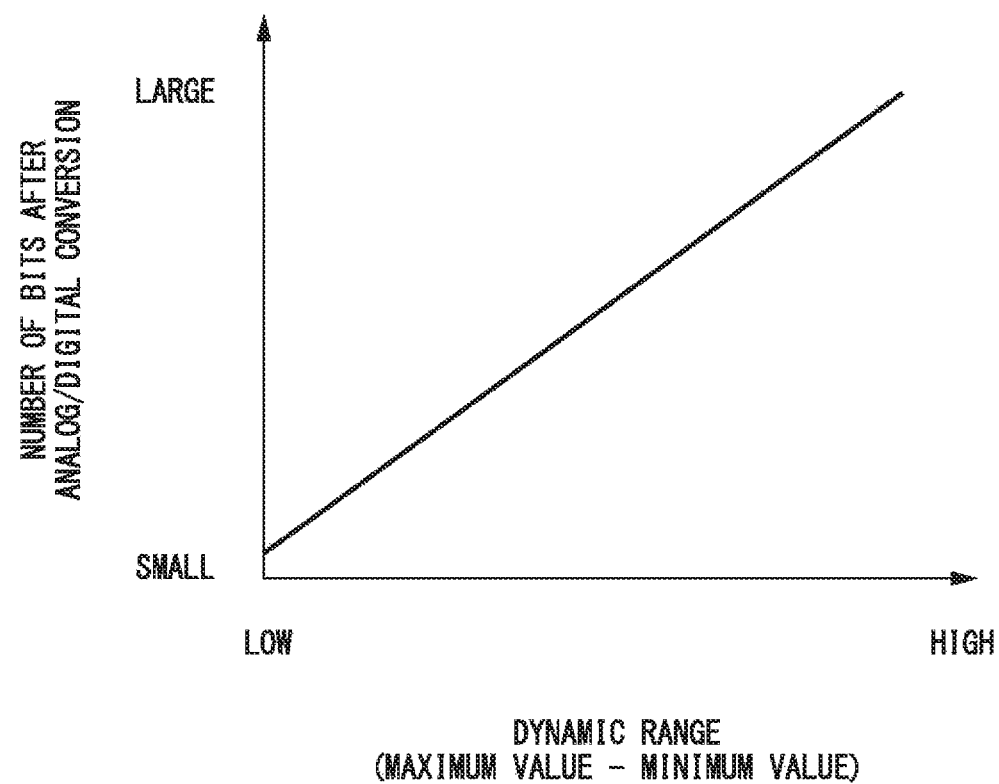
FIG. 13 is a diagram showing a method of determining the number of bits in a number-of-bits decision circuit included in the differential AD conversion unit included in the solid-state imaging device according to the second embodiment.

A method in which the number-of-bits decision circuit 625 determines the maximum number of bits at the time of the analog/digital conversion based on the information regarding the dynamic range will be described. FIG. 13 is a diagram showing a method of determining the number of bits in the number-of-bits decision circuit 625 included in the differential AD conversion unit 60 included in the solid-state imaging device 2 according to the second embodiment. The dynamic ranges of the full-resolution image signals S1 and the reduced image signals S2 can be predicted to be lower when the dynamic range of the reduced image signals S3 is lower, and can be predicted to be higher when the dynamic range of the reduced image signals S3 is higher. Therefore, as shown in FIG. 13, the number-of-bits decision circuit 625 determines the maximum number of bits at the time of the analog/digital conversion on the differential pixel signals (analog signals) corresponding to the full-resolution image signals S1 and the reduced image signals S2 so that the number of bits after the analog/digital conversion decreases when the dynamic range of the reduced image signals S3 is lower, and so that the number of bits after the analog/digital conversion increases when the dynamic range of the reduced image signals S3 is higher. For example, when the dynamic range of the reduced image signals S3 is high, the maximum number of bits at the time of the analog/digital conversion on the differential pixel signals Vout corresponding to the full-resolution image signals S1 is determined to be 12 bits (see FIG. 8C). For example, when the dynamic range of the reduced image signals S3 is low, the maximum number of bits at the time of the analog/digital conversion on the differential pixel signals Vout corresponding to the full-resolution image signals S1 is determined to be 10 bits (see FIG. 8B).

The first A/D conversion circuit 603 outputs the full-resolution image data obtained by performing the analog/digital conversion on the differential pixel signals Vout (analog signals) input from the differential circuit 502 in image data (digital values) of the number of bits according to the number-of-bits control signal at the time of the analog/digital conversion on the differential pixel signals Vout corresponding to the full-resolution image signals S1 input from the number-of-bits decision circuit 625.

The second A/D conversion circuit 613 outputs the reduced image data ($\frac{1}{9}$) obtained by performing the analog/digital conversion on the second differential pixel signals Vout2 (analog signals) input from the second differential circuit 512 in image data (digital values) of the number of bits according to the number-of-bits control signal at the time of the analog/digital conversion on the second differential pixel signals Vout2 corresponding to the reduced image signals S2 input from the number-of-bits decision circuit 625.

The third A/D conversion circuit 523 directly outputs the reduced image data ($\frac{1}{81}$) obtained by performing the analog/digital conversion on the reduced image signals S3 (analog signals) input from the third reading circuit 521.

According to the second embodiment, the solid-state imaging device (the solid-state imaging device 2) is configured such that the differential analog/digital conversion unit (the differential AD conversion unit 60) further includes an analog/digital conversion mode control unit (the analog/digital conversion mode control unit) that controls the number of bits when the corresponding first A/D conversion circuit 603 performs the analog/digital conversion on the differential pixel signals Vout, in correspondence with the plurality of first analog/digital conversion units (the first A/D conversion circuit 603).

According to the second embodiment, the solid-state imaging device 2 is configured such that the analog/digital conversion mode control unit first reads the reduced image signals S2 corresponding to the differential pixel signals Vout subjected to the analog-digital conversion by the corresponding first A/D conversion unit 603, and controls the number of bits based on the dynamic range of signals according to the read reduced image signals S2.

According to the second embodiment, the solid-state imaging device 2 is configured such that the analog/digital conversion mode control unit controls the number of bits based on the dynamic range of the reduced image signals S2 corresponding to the differential pixel signals Vout subjected to the analog/digital conversion by the corresponding first A/D conversion circuit 603.

According to the second embodiment, the solid-state imaging device 2 is configured such that the analog/digital conversion mode control unit further controls the number of bits when the corresponding second A/D conversion circuit 613 performs the analog/digital conversion on the second differential pixel signals Vout2, in correspondence with the second analog/digital conversion unit (the second A/D conversion circuit 613).

According to the second embodiment, the solid-state imaging device 2 is configured such that the analog/digital conversion mode control unit first reads the reduced image signals S3 instead of the reduced image signals S2 and controls the number of bits when the corresponding first A/D conversion circuit 603 performs the analog/digital conversion on the differential pixel signals Vout and the number of bits when the corresponding second A/D conversion circuit 613 performs the analog/digital conversion on the second differential pixel signals Vout, based on the dynamic range of signals according to the read reduced image signals S3.

According to the second embodiment, the solid-state imaging device 2 is configured such that the analog/digital conversion mode control unit controls the number of bits based on the dynamic range of the reduced image signals S3 corresponding to the differential pixel signals Vout subjected to the analog/digital conversion by the corresponding first A/D conversion circuit 603 and the second differential pixel signal Vout2 subjected to the analog/digital conversion by the corresponding second A/D conversion circuit 613.

In the differential AD conversion unit 60 included in the solid-state imaging device 2 according to the second embodiment, the analog/digital conversion mode control unit calculates the dynamic range before the analog/digital conversion on the differential pixel signals corresponding to the reduced image signals S2 or the full-resolution image signals S1 of the same exposure and adaptively controls the maximum number of bits when the second A/D conversion circuit 613 or the first A/D conversion circuit 603 performs the analog/digital conversion on the corresponding pixel signals in accordance with the dynamic range by first reading the reduced image signals S3. Accordingly, in the differential AD conversion unit 60 included in the solid-state imaging device 2 according to the second embodiment, it is possible to reduce power consumption when the counter CNT included in the second A/D conversion circuit 613 or the first A/D conversion circuit 603 counts the clock signals CLK. Accordingly, it is possible to achieve a reduction in the power consumption of the solid-state imaging device 2 according to the second embodiment or an imaging system on which the solid-state imaging device 2 according to the second embodiment is mounted.

When the dynamic range of the reduced image signals S3 is low, the maximum number of bits at the time of the analog/digital conversion determined by the number-of-bits decision circuit 625 may be a smaller number of bits than the number of bits of pre-determined digital values of the first A/D conversion circuit 603 or the second A/D conversion circuit 613. Accordingly, in the differential AD conversion unit 60 included in the solid-state imaging device 2 according to the second embodiment, it is possible to reduce the power consumption of the first A/D conversion circuit 603 or the second A/D conversion circuit 613 more than in the differential AD conversion unit 50 included in the solid-state imaging device 1 according to the first embodiment.

In the differential AD conversion unit 60 of the solid-state imaging device 2 according to the second embodiment shown in FIG. 12, the configuration example of the analog/digital conversion mode control unit determining the maximum number of bits at the time of the analog/digital conversion on the differential pixel signals corresponding to the reduced image signals S2 or the full-resolution image signals S1 of the same exposure based on the dynamic range of the reduced image signals S3 (analog signals) has been described. However, the configuration of the analog/digital conversion mode control unit is not limited to the configuration shown in FIG. 12.

<First Modification Example of Analog/Digital Conversion Mode Control Unit>

Figure 14:
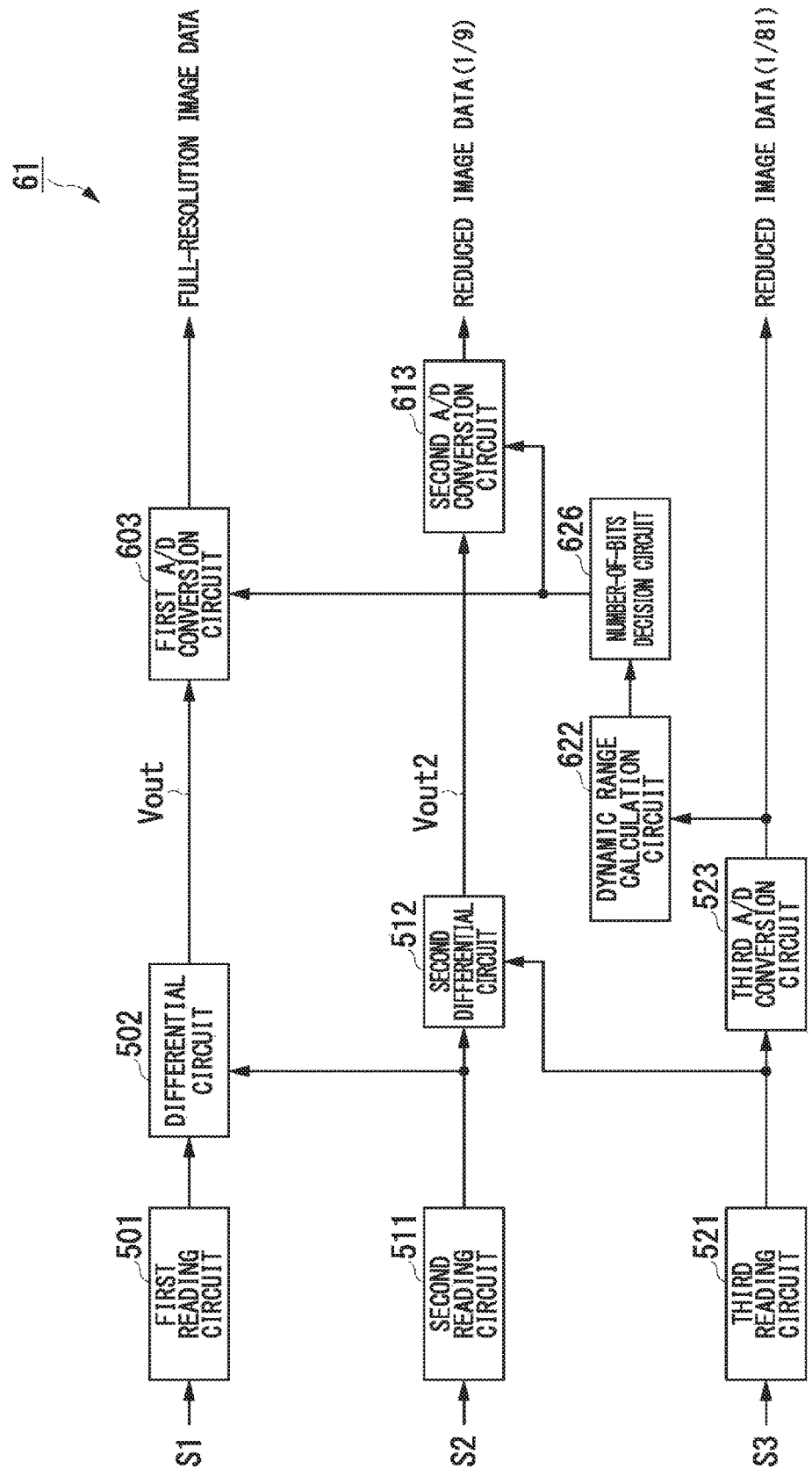
FIG. 14 is a block diagram showing another schematic configuration of the differential AD conversion unit included in the solid-state imaging device according to a second embodiment.

A configuration of a first modification example of the analog/digital conversion mode control unit included in the differential AD conversion unit in the solid-state imaging device 2 according to the second embodiment will be described. FIG. 14 is a block diagram showing another schematic configuration of the differential AD conversion unit 61 included in the solid-state imaging device 2 according to a second embodiment. A differential AD conversion unit 61 of the solid-state imaging device 2 shown in FIG. 14 is configured to include a first reading circuit 501, a differential circuit 502, a first A/D conversion circuit 603, a second reading circuit 511, a second differential circuit 512, a second A/D conversion circuit 613, a third reading circuit 521, a third A/D conversion circuit 523, a dynamic range calculation circuit 622, and a number-of-bits decision circuit 626.

In the differential AD conversion unit 61 included in the solid-state imaging device 2 according to the second embodiment, the dynamic range calculation circuit 622 and the number-of-bits decision circuit 626 included in the differential AD conversion unit 61 form an analog/digital conversion mode control unit that controls the analog/digital conversion in the first A/D conversion circuit 603 and the second A/D conversion circuit 613.

In the constituent elements of the differential AD conversion unit 61 included in the solid-state imaging device 2 according to the second embodiment, the same reference numerals are given to the same constituent elements as the constituent elements of the differential AD conversion unit 60 included in the solid-state imaging device 2 according to the second embodiment shown in FIG. 12. A detailed description of the constituent elements will be omitted.

The dynamic range calculation circuit 622 calculates dynamic ranges of the full-resolution image signals S1 and the reduced image signals S2 obtained through the same exposure based on the reduced image signals (⅛₁) according to the reduced image signals S3 subjected to the analog/digital conversion by the third A/D conversion circuit 523. That is, the dynamic range calculation circuit 622 calculates the dynamic range of pixels included in one corresponding pixel set or pixel sets of one column based on a digital value indicating the magnitude of the reduced image signals S3. The dynamic range calculation circuit 621 outputs information regarding the calculated dynamic range to the number-of-bits decision circuit 625.

Based on the information regarding the dynamic range input from the dynamic range calculation circuit 622, the number-of-bits decision circuit 626 determines the maximum number of pixels at the time of the analog/digital conversion on differential pixel signals Vout (analog signals) corresponding to the full-resolution image signals S1 and the second differential pixel signals Vout2 (analog signals) corresponding to the reduced image signals S2 obtained through the same exposure. Then, the number-of-bits decision circuit 626 outputs a number-of-bits control signal for performing the analog/digital conversion on the differential pixel signals Vout with the determined number of bits to the first A/D conversion circuit 603 and outputs a number-of-bits control signal for performing the analog/digital conversion on the second differential pixel signals Vout2 with the determined number of bits to the second A/D conversion circuit 613. Since the method in which the number-of-bits decision circuit 626 determines the maximum number of bits at the time of the analog/digital conversion based on the information regarding the dynamic range is the same as the method in which the number-of-bits decision circuit 625 determines the maximum number of bits at the time of the analog/digital conversion based on the information regarding the dynamic range, a detailed description thereof will be omitted.

The first A/D conversion circuit 603 outputs the full-resolution image data obtained by performing the analog/digital conversion on the differential pixel signals Vout (analog signals) input from the differential circuit 502 in image data (digital values) of the number of bits according to the number-of-bits control signal at the time of the analog/digital conversion on the differential pixel signals Vout corresponding to the full-resolution image signals S1 input from the number-of-bits decision circuit 626.

The second A/D conversion circuit 613 outputs the reduced image data (1/9) obtained by performing the analog/digital conversion on the second differential pixel signals Vout2 (analog signals) input from the second differential circuit 512 in image data (digital values) of the number of bits according to the number-of-bits control signal at the time of the analog/digital conversion on the second differential pixel signals Vout2 corresponding to the reduced image signals S2 input from the number-of-bits decision circuit 626.

According to the first modification example, the solid-state imaging device 2 is configured such that the analog/digital conversion mode control unit controls the number of bits in regard to the reduced image signals S2 corresponding to the differential pixel signals Vout subjected to the analog/digital conversion by the corresponding first A/D conversion circuit 603 based on the dynamic range of the reduced image signals S2 calculated based on the digital values (for example, the reduced image data (1/9)) subjected to the analog/digital conversion by the corresponding second A/D conversion circuit 613.

According to the first modification example, the solid-state imaging device 2 is configured such that the analog/digital conversion mode control unit controls the number of bits in regard to the reduced image signals S3 corresponding to the differential pixel signals Vout subjected to the analog/digital conversion by the corresponding first A/D conversion circuit 603 and the second differential pixel signals Vout2 subjected to the analog/digital conversion by the corresponding second A/D conversion circuit 613 based on the dynamic range of the reduced image signals S3 calculated based on the digital values (for example, the reduced image data (1/81)) subjected to the analog/digital conversion by the corresponding third A/D conversion unit (the third A/D conversion circuit 523).

In this way, in the differential AD conversion unit 61 of the first modification example included in the solid-state imaging device 2 according to the second embodiment, as in the differential AD conversion unit 60 included in the solid-state imaging device 2 according to the second embodiment, the analog/digital conversion mode control unit can adaptively control the maximum number of bits at the time of the analog/digital conversion on the differential pixel signals corresponding to the reduced image signals S2 or the full-resolution image signals S1 of the same exposure in accordance with the dynamic range by first reading the reduced image signals S3. Accordingly, in the differential AD conversion unit 61 of the first modification example included in the solid-state imaging device 2 according to the second embodiment, it is possible to obtain the same advantages as those of the differential AD conversion unit 60 included in the solid-state imaging device 2 according to the second embodiment.

<Second Modification Example of Analog/Digital Conversion Mode Control Unit>

Figure 15:
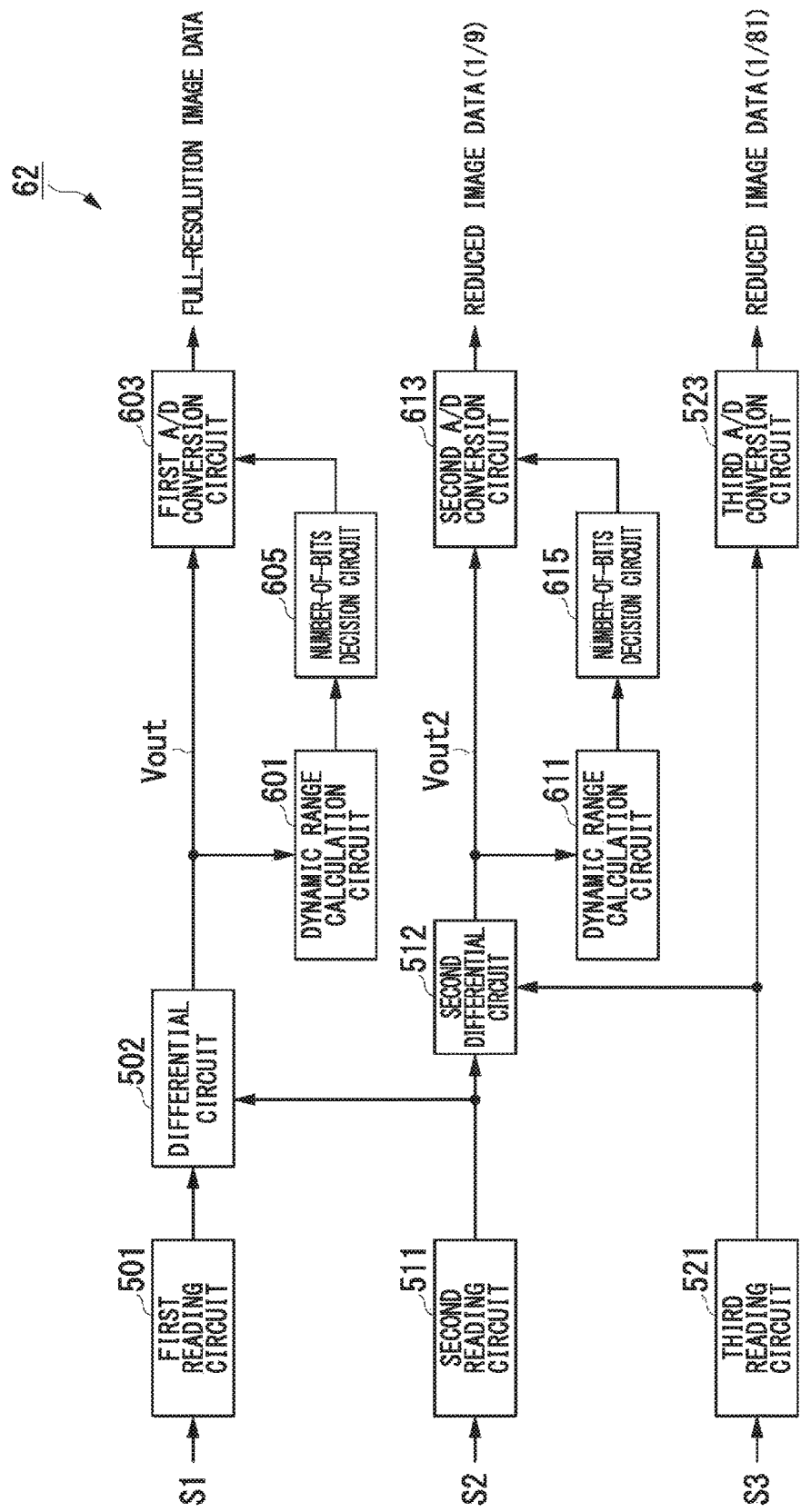
FIG. 15 is a block diagram showing still another schematic configuration of the differential AD conversion unit included in the solid-state imaging device according to the second embodiment.

A configuration of a second modification example of the analog/digital conversion mode control unit included in the differential AD conversion unit in the solid-state imaging device 2 according to the second embodiment will be described. FIG. 15 is a block diagram showing still another schematic configuration of the differential AD conversion unit of the second modification example included in the solid-state imaging device 2 according to the second embodiment. A differential AD conversion unit 62 of the solid-state imaging device 2 shown in FIG. 15 is configured to include a first reading circuit 501, a differential circuit 502, a first A/D conversion circuit 603, a dynamic range calculation circuit 601, a number-of-bits decision circuit 605, a second reading circuit 511, a second differential circuit 512, a second A/D conversion circuit 613, a dynamic range calculation circuit 611, a number-of-bits decision circuit 615, a third reading circuit 521, and a third A/D conversion circuit 523.

In the configuration of the differential AD conversion unit 62 of the second modification example included in the solid-state imaging device 2 according to the second embodiment, the dynamic range calculation circuit 601, the number-of-bits decision circuit 605, the dynamic range calculation circuit 611, and the number-of-bits decision circuit 615 included in the differential AD conversion unit 62 form an analog/digital conversion mode control unit that controls the analog/digital conversion in the first A/D conversion circuit 603 and the second A/D conversion circuit 613.

In the constituent elements of the differential AD conversion unit 62 of the second modification example included in the solid-state imaging device 2 according to the second embodiment, the same reference numerals are given to the same constituent elements as the constituent elements of the differential AD conversion unit 60 included in the solid-state imaging device 2 according to the second embodiment shown in FIG. 12. A detailed description of the constituent elements will be omitted.

The dynamic range calculation circuit 601 calculates the dynamic range of the differential pixel signals Vout obtained when the differential circuit 502 calculates the differences between the full-resolution image signals S1 and the reduced image signals S2. That is, the dynamic range calculation circuit 601 calculates the dynamic range of each pixel or pixels of one column included in the differential pixel signals Vout to be subjected to the analog/digital conversion. Then, the dynamic range calculation circuit 601 outputs information regarding the calculated dynamic range to the number-of-bits decision circuit 605.

The number-of-bits decision circuit 605 determines the maximum number of bits at the time of the analog/digital conversion on the differential pixel signals Vout (analog signals) based on the information regarding the dynamic range input from the dynamic range calculation circuit 601 and outputs a number-of-bits control signal for performing the analog/digital conversion on the differential pixel signals Vout with the determined number of bits to the first A/D conversion circuit 603.

The first A/D conversion circuit 603 outputs the full-resolution image data obtained by performing the analog/digital conversion on the differential pixel signals Vout (analog signals) input from the differential circuit 502 in image data (digital values) of the number of bits according to the number-of-bits control signal at the time of the analog/digital conversion on the differential pixel signals Vout input from the number-of-bits decision circuit 605.

The dynamic range calculation circuit 611 calculates the dynamic range of the second differential pixel signal Vout2 obtained when the second differential circuit 512 calculates the differences between the reduced image signals S2 and S3. That is, the dynamic range calculation circuit 611 calculates the dynamic range of pixels included in each pixel set or pixel sets of one column included in the second differential pixel signals Vout2 to be subjected to the analog/digital conversion. The dynamic range calculation circuit 611 outputs information regarding the calculated dynamic range to the number-of-bits decision circuit 615.

The number-of-bits decision circuit 615 determines the maximum number of bits when the second differential pixel signals Vout2 (analog signals) are subjected to the analog/digital conversion based on the information regarding the dynamic range input from the dynamic range calculation circuit 611 and outputs a number-of-bits control signal for performing the analog/digital conversion on the second differential pixel signals Vout2 with the determined number of bits to the second A/D conversion circuit 613.

The second A/D conversion circuit 613 outputs the reduced image data (⅓) obtained by performing the analog/digital conversion on the second differential pixel signals Vout2 (analog signals) input from the second differential circuit 512 in image data (digital values) of the number of bits according to the number-of-bits control signal at the time of the analog/digital conversion on the second differential pixel signals Vout2 input from the number-of-bits decision circuit 615.

According to the second modification example, the solid-state imaging device 2 is configured such that the analog/digital conversion mode control unit controls the number of bits based on the dynamic range of the differential pixel signals Vout subjected to the analog/digital conversion by the corresponding first A/D conversion circuit 603.

According to the second modification example, the solid-state imaging device 2 is configured such that the analog/digital conversion mode control unit controls the number of bits when the first A/D conversion circuit 603 performs the analog/digital conversion on the differential pixel signals Vout based on the dynamic range of the differential pixel signals Vout subjected to the analog/digital conversion by the corresponding first A/D conversion circuit 603 and controls the number of bits when the second A/D conversion circuit 613 performs the analog/digital conversion on the second differential pixel signals Vout2 based on the dynamic range of the second differential pixel signals Vout2 subjected to the analog/digital conversion by the corresponding second A/D conversion circuit 613.

In this way, in the differential AD conversion unit 62 of the second modification example included in the solid-state imaging device 2 according to the second embodiment, the analog/digital conversion mode control unit calculates the dynamic range of the differential pixel signals before the first A/D conversion circuit 603 and the second A/D conversion circuit 613 perform the analog/digital conversion on the corresponding differential pixel signals. Thus, the analog/digital conversion mode control unit can adaptively control the maximum number of bits at the time of the analog/digital conversion in accordance with the dynamic range. Accordingly, in the differential AD conversion unit 62 of the second modification example included in the solid-state imaging device 2 according to the second embodiment, it is possible to obtain the same advantages as those of the differential AD conversion unit 60 included in the solid-state imaging device 2 according to the second embodiment.

<Third Modification Example of Analog/Digital Conversion Mode Control Unit>

The analog/digital conversion mode control unit included in the differential AD conversion unit in the solid-state imaging device 2 according to the second embodiment can have a different configuration in consideration of the configurations of the digital/analog conversion mode control units included in the differential AD conversion units (the differential AD conversion unit 60, the differential AD conversion unit 61, and the differential AD conversion unit 62) in the solid-state imaging device 2 according to the second embodiment shown in FIGS. 12 to 15. A configuration of a third modification example of the analog/digital conversion mode control unit included in the differential AD conversion unit in the solid-state imaging device 2 according to the second embodiment will be described.

Figure 16:
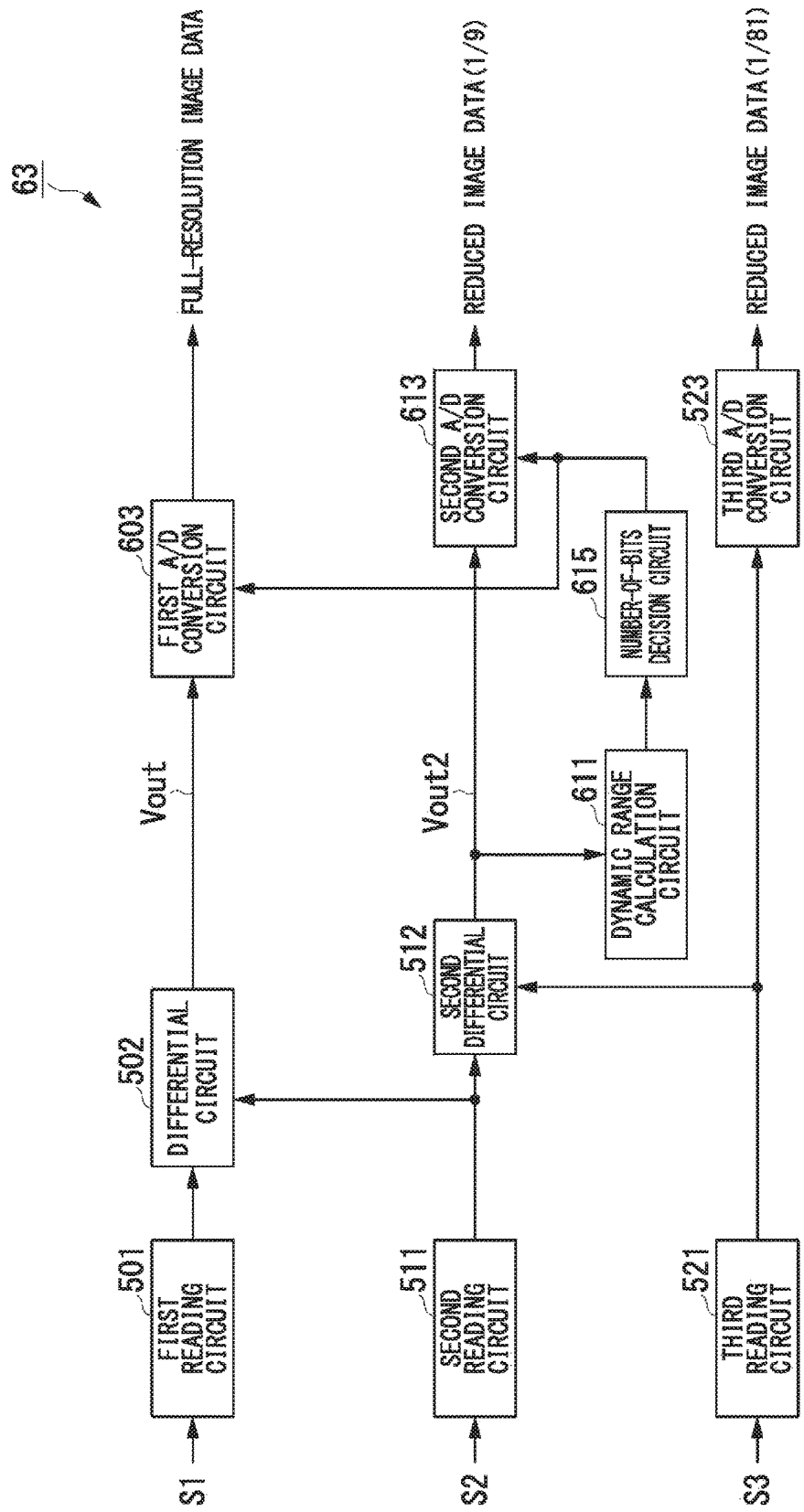
FIG. 16 is a block diagram showing still another schematic configuration of the differential AD conversion unit included in the solid-state imaging device according to the second embodiment.

FIG. 16 is a block diagram showing still another schematic configuration of the differential AD conversion unit of the third modification example included in the solid-state imaging device 2 according to a second embodiment. The configuration of the analog/digital conversion mode control unit in a differential AD conversion unit 63 shown in FIG. 16 is realized in consideration of the configuration of the analog/digital conversion mode control unit included in the differential AD conversion unit 60 in the solid-state imaging device 2 according to the second embodiment shown in FIG. 12 and the configuration of the analog/digital conversion mode control unit included in the differential AD conversion unit 62 of the second modification example in the solid-state imaging device 2 according to the second embodiment shown in FIG. 15. The differential AD conversion unit 63 of the third modification example of the solid-state imaging device 2 shown in FIG. 16 is configured to include a first reading circuit 501, a differential circuit 502, a first A/D conversion circuit 603, a second reading circuit 511, a second differential circuit 512, a second A/D conversion circuit 613, a dynamic range calculation circuit 611, and a number-of-bits decision circuit 615, a third reading circuit 521, and a third A/D conversion circuit 523.

In the configuration of the differential AD conversion unit 63 of the third modification example included in the solid-state imaging device 2 according to the second embodiment, the dynamic range calculation circuit 611 and the number-of-bits decision circuit 615 included in the differential AD conversion unit 63 form an analog/digital conversion mode control unit that controls the analog/digital conversion in the first A/D conversion circuit 603 and the second A/D conversion circuit 613.

In the constituent elements of the differential AD conversion unit 62 of the third modification example included in the solid-state imaging device 2 according to the second embodiment, the same reference numerals are given to the same constituent elements as the constituent elements of the differential AD conversion unit 60 included in the solid-state imaging device 2 according to the second embodiment shown in FIG. 12. A detailed description of the constituent elements will be omitted.

The number-of-bits decision circuit 615 determines the maximum number of bits at the time of the analog/digital conversion on the second differential pixel signals Vout2 (analog signals) based on the information regarding the dynamic range input from the dynamic range calculation circuit 611 and the maximum number of bits at the time of the analog/digital conversion on the differential pixel signals Vout (analog signals) corresponding to the full-resolution image signals S1 obtained through the same exposure. Then, the number-of-bits decision circuit 615 outputs a number-of-bits control signal for performing the analog/digital conversion on the second differential pixel signals Vout2 with the determined number of bits to the second A/D conversion circuit 613 and outputs a number-of-bits control signal for performing the analog/digital conversion on the differential pixel signals Vout with the determined number of bits to the first A/D conversion circuit 603.

The first A/D conversion circuit 603 outputs the full-resolution image data obtained by performing the analog/digital conversion on the differential pixel signals Vout (analog signals) input from the differential circuit 502 in image data (digital values) of the number of bits according to the number-of-bits control signal at the time of the analog/digital conversion on the differential pixel signals Vout input from the number-of-bits decision circuit 615.

According to the third modification example, the solid-state imaging device 2 is configured such that the analog/digital conversion mode control unit controls the number of bits based on the dynamic range of the second differential pixel signals Vout2 subjected to the analog/digital conversion by the corresponding second A/D conversion circuit 613.

In this way, in the differential AD conversion unit 63 of the third modification example included in the solid-state imaging device 2 according to the second embodiment, the analog/digital conversion mode control unit calculates the dynamic range of the second differential pixel signals Vout2 before the first A/D conversion circuit 603 performs the analog/digital conversion on the corresponding differential pixel signals Vout. Thus, the analog/digital conversion mode control unit can adaptively control the maximum number of bits at the time of the analog/digital conversion on the differential pixel signals in accordance with the dynamic range. Accordingly, in the differential AD conversion unit 63 of the third modification example included in the solid-state imaging device 2 according to the second embodiment, it is possible to obtain the same advantages as those of the differential AD conversion unit 60 included in the solid-state imaging device 2 according to the second embodiment.

As described above, in the solid-state imaging device 2 according to the second embodiment, the pixel signals of all the pixels and the pixel signals in which the number of pixels is reduced are output separately based on the signal charges obtained through the same one-time exposure of the pixels included in the pixel signal processing unit 10, as in the solid-state imaging device 1 according to the first embodiment. In the solid-state imaging device 2 according to the second embodiment, the differential AD conversion unit 60 (which may be the differential AD conversion unit 61, 62, or 63) performs the analog/digital conversion on the pixel signals after the dynamic range is narrowed using the pixel signals in which the number of pixels included in the pixel signal processing unit 10 is reduced in one stage, as in the solid-state imaging device 1 according to the first embodiment. In the solid-state imaging device 2 according to the second embodiment, the dynamic range is calculated before the pixel signals are subjected to the analog/digital conversion, and the maximum number of bits at the time of the analog/digital conversion is adaptively controlled in accordance with the dynamic range. Accordingly, in the solid-state imaging device 2 according to the second embodiment, it is possible to shorten a time in which the counter CNT included in the second A/D conversion circuit (the first A/D conversion circuit 603 or the second AD conversion circuit 613) in the differential AD conversion unit 60 counts the clock signals CLK, and thus to reduce power consumption. Accordingly, it is possible to achieve a reduction in the power consumption of the solid-state imaging device 2 according to the second embodiment or an imaging system on which the solid-state imaging device 2 according to the second embodiment is mounted.

Third Embodiment

Next, a third embodiment of the present invention will be described. A pixel signal processing unit included in a solid-state imaging device (hereinafter referred to as a "solid-state imaging device 3") according to the third embodiment is the same as the pixel signal processing unit 10 included in the solid-state imaging device 1 according to the first embodiment. Accordingly, in the description of the solid-state imaging device 3 according to the third embodiment, a detailed description of a configuration in which the pixel signal processing unit 10 is included in the solid-state imaging device 3 will be omitted and the configuration of a differential AD conversion unit included in the solid-state imaging device 3 according to the third embodiment will be described. Here, in the following description, the pixel signal processing unit 10 outputting pixel signals to the differential AD conversion unit included in the solid-state imaging device 3 according to the third embodiment is assumed to have the configuration of the pixel signal processing unit 10 shown in FIG. 10 to which the color filters are attached and have a configuration of the pixel signal processing unit 10 that separately outputs the full-resolution image signals S1 of the total number of pixels included in the pixel array, the reduced image signals S2 in which the number of pixels is reduced to $\frac{1}{9}$, and the reduced image signals S3 in which the number of pixels is reduced to $\frac{1}{81}$.

The differential AD conversion unit included in the solid-state imaging device 3 according to the third embodiment is a differential AD conversion unit that has a configuration example in which the full-resolution image data of the number of bits designated by an external analog/digital conversion number-of-bits control unit of the differential AD conversion unit and corresponding to the maximum number of bits at the time of the analog/digital conversion on the differential pixel signals corresponding to the reduced image signals S2 and the full-resolution image signals S1 is output, and the reduced image data ($\frac{1}{9}$) is output.

Figure 17:
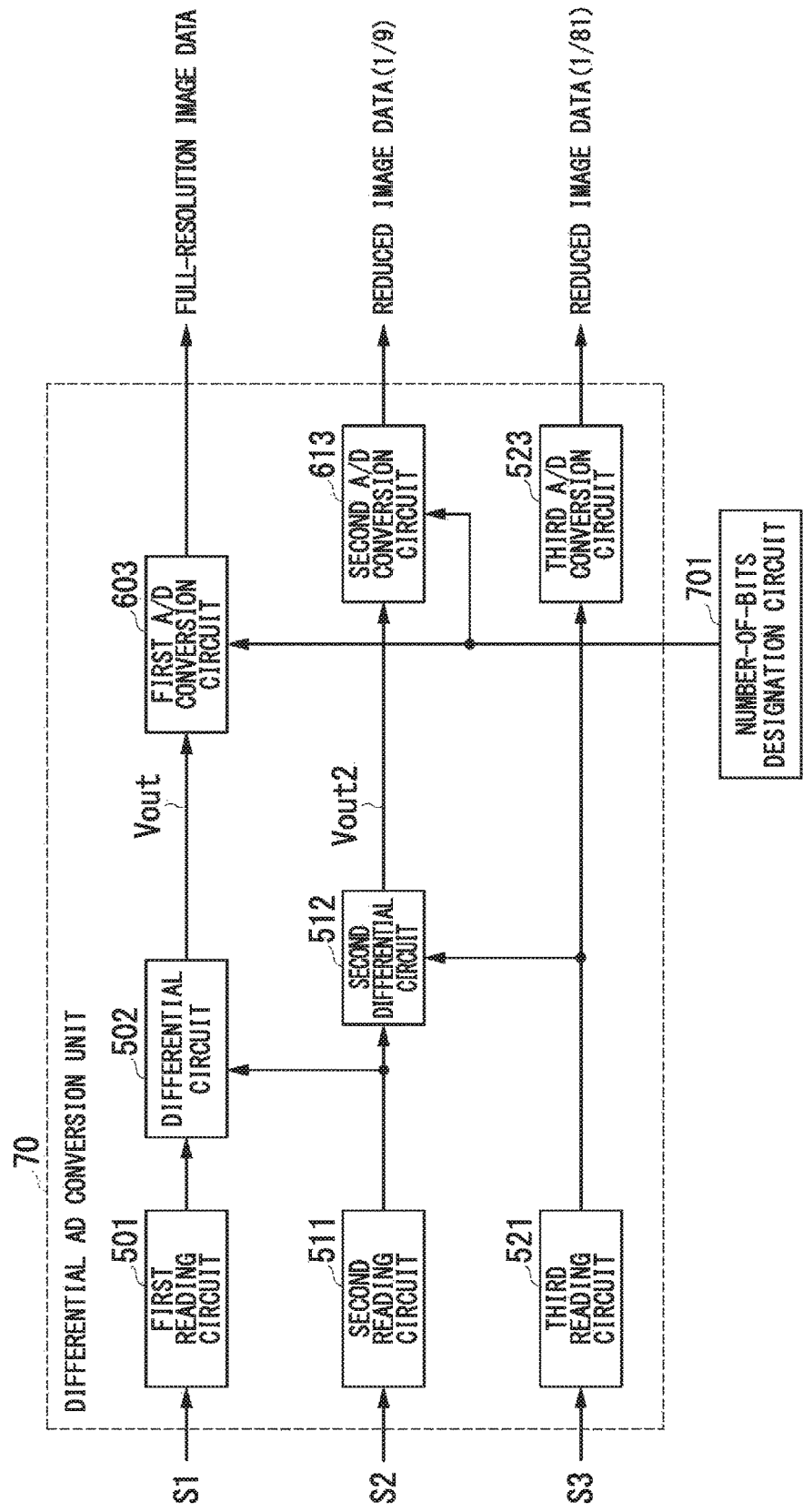
FIG. 17 is a block diagram showing a schematic configuration of a differential AD conversion unit included in a solid-state imaging device according to a third embodiment of the present invention.

FIG. 17 is a block diagram showing a schematic configuration of a differential AD conversion unit 70 included in a solid-state imaging device 3 according to the third embodiment of the present invention. The differential AD conversion unit 70 according to the solid-state imaging device 3 shown in FIG. 17 is configured to include a first reading circuit 501, a differential circuit 502, a first A/D conversion circuit 603, a second reading circuit 511, a second differential circuit 512, a second A/D conversion circuit 613, a third reading circuit 521, and a third A/D conversion circuit 523. In FIG. 17, a number-of-bits designation unit 701 which can be realized by, for example, a central processing unit (CPU) is also shown as an analog/digital conversion number-of-bits control unit that designates the maximum number of bits at the time of the analog/digital conversion on the differential pixel signals corresponding to the reduced image signals S2 and the full-resolution image signals S1.

In the constituent elements of the differential AD conversion unit 70 included in the solid-state imaging device 3 according to the third embodiment, the reference numerals are given to the same constituent elements as the constituent elements of the differential AD conversion unit 50 included in the solid-state imaging device 1 according to the first embodiment and the differential AD conversion unit 60 included in the solid-state imaging device 2 according to the second embodiment, and a detailed description thereof will be omitted.

The number-of-bits designation unit 701 designates the maximum number of bits at the time of the analog/digital conversion on the differential pixel signals Vout (analog signals) corresponding to the full-resolution image signals S1 obtained at the same exposure and the second differential pixel signals Vout2 (analog signals) corresponding to the reduced image signals S2 in the first A/D conversion circuit 603 and the second A/D conversion circuit 613 in the differential AD conversion unit 70.

A method in which the number-of-bits designation unit 701 determines and designates the maximum number of bits at the time of the analog/digital conversion on the pixel signals is not particularly limited. For example, in an imaging system on which the solid-state imaging device 3 according to the third embodiment is mounted, the designating method may be a method in which the number-of-bits designation unit 701 or a processing unit at a rear stage sets and designates the maximum number of bits determined based on a dynamic range of reduced image data (⅛1) first read from the solid-state imaging device 3 in the first A/D conversion circuit 603 and the second A/D conversion circuit 613 in the differential AD conversion unit 70. The designating method may be a method of designating a number-of-bits control signal indicating the determined maximum number of bits. For example, the designating method may be a method of designating the maximum number of bits determined based on a dynamic range predicted from an imaging state in the imaging system on which the solid-state imaging device 3 according to the third embodiment is mounted. That is, the designating method may be a method of designating the maximum number of bits according to a dynamic range of a captured image changed in accordance with an imaging mode determined by a user of the imaging system and an imaging mode automatically set by a control unit of the imaging system based on a confirmation image (so-called live-view image (through image)) used for the imaging system to image a subject appropriately.

The first A/D conversion circuit 603 outputs the full-resolution image data obtained by performing the analog/digital conversion on the differential pixel signals Vout (analog signals) input from the differential circuit 502 in image data (digital values) of the number of bits according to the number-of-bits control signal at the time of the analog/digital conversion on the differential pixel signals Vout corresponding to the full-resolution image signals S1 designated by the number-of-bits designation unit 701.

The second A/D conversion circuit 613 outputs the reduced image data (⅛) obtained by performing the analog/digital conversion on the second differential pixel signals Vout2 (analog signals) input from the second differential circuit 512 in image data (digital values) of the number of bits according to the number-of-bits control signal at the time of the analog/digital conversion on the second differential pixel signals Vout2 corresponding to the reduced image signals S2 designated by the number-of-bits designation unit 701.

According to the third embodiment, the imaging system is configured to include a solid-state imaging device (the solid-state imaging device 3).

According to the third embodiment, the imaging system is configured to further include an analog/digital conversion number-of-bits control unit (for example, the number-of-bits designation unit 701) that designates the number of bits when at least the first A/D conversion circuit 603 performs the analog/digital conversion on the corresponding differential pixel signals Vout.

According to the third embodiment, the solid-state imaging device (the solid-state imaging device 3) is configured such that each first A/D conversion circuit 603 performs the analog/digital conversion on the corresponding differential pixel signals Vout with the designated number of bits.

According to the third embodiment, the solid-state imaging device 3 is configured such that each second A/D conversion circuit 613 performs the analog/digital conversion on the corresponding second differential pixel signals Vout2 with the designated number of bits.

In this way, the differential AD conversion unit 70 included in the solid-state imaging device 3 according to the third embodiment adaptively controls the maximum number of bits when the second A/D conversion circuit 613 or the first A/D conversion circuit 603 performs the analog/digital conversion on the corresponding pixel signals, in accordance with designation from the outside according to an imaging state or the like in the imaging system on which the solid-state imaging device 3 according to the third embodiment is mounted. That is, the maximum number of bits is adaptively controlled according to the entire state of an image captured in the imaging system on which the solid-state imaging device 3 according to the third embodiment is mounted. Accordingly, in the differential AD conversion unit 70 included in the solid-state imaging device 3 according to the third embodiment, it is possible to reduce power consumption when the counter CNT included in the second A/D conversion circuit 613 or the first A/D conversion circuit 603 counts the clock signals CLK, as in the differential AD conversion unit 50 included in the solid-state imaging device 1 according to the first embodiment or the differential AD conversion unit 60 or the like included in the solid-state imaging device 2 according to the second embodiment. Accordingly, it is possible to achieve a reduction in the power consumption of the solid-state imaging device 3 according to the third embodiment or the imaging system on which the solid-state imaging device 3 according to the third embodiment is mounted.

According to the embodiments of the present invention, as described above, the pixel signal processing unit of the solid-state imaging device includes the first charge storage circuit that holds (stores) the signal charges generated by the photoelectric conversion units in the pixels and the second charge storage circuit that holds (stores) the signal charges to reduce the signal charges generated through the same exposure by the photoelectric conversion units in the predetermined pixels. Accordingly, in the embodiments, the pixel signals according to the signal charges of all the pixels obtained through the same exposure and included in the pixel signal processing unit and the pixel signals in which the number of pixels included in the pixel signal processing unit is reduced can be output separately and independently from the pixel signal processing unit of the solid-state imaging device.

According to the embodiments of the present invention, the differential AD conversion unit of the solid-state imaging device includes the differential circuit that takes the differences between the pixel signals which are output from the pixel signal processing unit and in which the number of pixels is large and the pixel signals in which the number of pixels is small (reduced) and the A/D conversion circuit that performs the analog/digital conversion on the differential pixel signals output from the differential circuits. Accordingly, in the embodiments, the A/D conversion circuit included in the differential AD conversion unit of the solid-state imaging device can perform the analog/digital conversion on the differential pixel signals in which the dynamic range of the pixel signals which are output from the pixel signal processing unit of the solid-state imaging device and in which the number of pixels is large is narrowed, and thus it is possible to reduce the power consumption of the A/D conversion circuit and the number of bits of the output image data. Accordingly, it is possible to achieve a reduction in the power consumption of the solid-state imaging device according to the embodiments or an imaging system on which the solid-state imaging device according to the embodiments is mounted.

According to the embodiments of the present invention, the image data (the full-resolution image data or the reduced image data) corresponding to the pixel signals output from the pixel signal processing unit of the solid-state imaging device can be output separately. Accordingly, in the imaging system on which the solid-state imaging device according to the embodiments is mounted, the image data according to differential pixel signals in which a dynamic range is narrowed can be restored to image data obtained by performing the analog/digital conversion on the original pixel signals, that is, the pixel signals before the dynamic range is narrowed by processing the image data output from the solid-state imaging device according to the embodiments. Accordingly, in the imaging system on which the solid-state imaging device according to the embodiments is mounted, it is possible to generate a good image in which quality does not deteriorate.

Even in a solid-state imaging device of the related art, for example, when a moving image is captured, the number of bits of the image data to be output is sometimes reduced more before being output than when a still image is captured, which reduces power consumption of the A/D conversion circuit. However, when the number of pixels of the image data in a solid-state imaging device of the related art is reduced before being output, the image data can be restored to a state before the number of bits was reduced. In contrast, in the solid-state imaging device according to the embodiments of the present invention, as described above, the dynamic range is narrowed or the number of bits is reduced only in the A/D conversion circuit outputting the image data according to the differential pixel signals. Therefore, in the solid-state imaging device according to the embodiments of the present invention, the image data can be restored to the state before the dynamic range is narrowed or the number of bits is reduced by processing the output image data. Thus, there is the advantage from the viewpoint of the quality of a generated image in addition to the viewpoint of power consumption.

According to the embodiments of the present invention, the A/D conversion circuit included in the differential AD conversion unit of the solid-state imaging device performs the analog/digital conversion on the differential pixel signals corresponding to the pixel signals which are output from the pixel signal processing unit of the solid-state imaging device and in which the number of pixels is large, and the A/D conversion circuit adaptively controls the number of bits of the image data output in accordance with the dynamic range of the pixel signals in which the number of pixels is small. Accordingly, in the solid-state imaging device according to the embodiment, the A/D conversion circuit included in the differential AD conversion unit of the solid-state imaging device can also further reduce the power consumption at the time of the analog/digital conversion on the differential pixel signals or the number of pixels of the image data to be output.

The specific configurations of the present invention are not limited to the embodiments of the present invention, but can be modified in various forms within the scope of the present invention without departing from the gist of the present invention. For example, in the embodiments of the present invention, the first and second configuration examples have been described as the configuration of the pixel signal processing unit 10 and the example of the driving method in the configuration example of each pixel signal processing unit 10 has been described. The configuration of the pixel signal processing unit 10 and the specific configuration of the driving method are not limited to the embodiments of the present invention, but the ideas of the present invention can be applied according to modified driving methods or constituent elements of pixels included in the pixel signal processing unit 10 even when the driving methods or the constituent elements of the pixels are modified. For example, in the embodiments of the present invention, a case in which the slope integration type A/D conversion circuit is included as the A/D conversion circuit has been described. The type of A/D conversion circuit included in the solid-state imaging device according to the embodiments of the present invention is not limited to the embodiments of the present invention. Even when another type of A/D conversion circuit is included, the same advantage can be obtained by applying the ideas of the present invention. For example, the number of pixels of the digital values to be output can be reduced even in various other types of A/D conversion circuits such as a pulse delay type A/D conversion circuit in which a plurality of delay elements are connected in a circular form, a sequential comparison type A/D conversion circuit sequentially performing comparison using capacitors, or a loop cyclic type A/D conversion circuit that counts a loop number of signals using an operational amplifier, and the same advantages can be obtained.

The number of pixels included in the pixel signal processing unit 10 and the number by which the number of pixels is reduced are not limited to the embodiments of the present invention, but the number of pixels included in the pixel signal processing unit 10 or the number by which the number of pixels is reduced can be modified within the scope of the present invention without departing from the gist of the present invention.

In the embodiments of the present invention, the example of the case in which the color filters with the Bayer array are attached has been described, but the color array of the color filters attached to the solid-state imaging device is not limited to the embodiments of the present invention. Even when the color array of the attached color filters is changed, the ideas of the present invention can be applied according to the modified color array.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device comprising:
a pixel signal processing unit includes:
a plurality of pixels in which photoelectric conversion units generating first signal charges obtained by photoelectrically converting incident light are disposed in a matrix;
a plurality of first charge storage circuits which are configured to hold the first signal charges generated by the photoelectric conversion units and output first signal voltages as first pixel signals, the first signal voltages being generated based on the held first signal charges; and
a plurality of second charge storage circuits which are configured to hold second signal charges based on the first signal charges generated by the photoelectric conversion units in the plurality of pixels and output second signal voltages as second pixel signals reduced to a pre-determined number of pixels, the second signal voltages being generated based on the held second signal charges, and
a differential analog/digital conversion unit includes:
a plurality of first differential calculation units which are configured to output pixel signals as first differential pixel signals, the first differential pixel signals being obtained by calculating differences between the first pixel signals of a corresponding column and the second pixel signals based on the first pixel signals, and the first differential pixel signals being corresponding to each column of the pixels;
a plurality of first analog/digital conversion units which are configured to perform analog/digital conversion to the first differential pixel signals output from the corresponding first differential calculation units and output digital values indicating magnitudes of the first differential pixel signals, each of the plurality of the first analog/digital conversion units corresponding to one of the plurality of first differential calculation units; and
a plurality of second analog/digital conversion units which are configured to perform analog/digital conversion to the second pixel signals output from the second charge storage circuits of a corresponding column and output digital values indicating magnitudes of the second pixel signals, each of the plurality of second analog/digital conversion units corresponding to one column of the second charge storage circuits,
wherein each of the plurality of first analog/digital conversion units outputs a digital value of the number of bits less than the number of bits of a digital value output by each of the plurality of second analog/digital conversion units.

2. The solid-state imaging device according to claim 1, wherein the second pixel signal is a signal of the second signal voltage based on the second signal charges with a charge amount obtained by averaging the signal charges based on the first signal charges, the first signal charges being generated during the same exposure period by the photoelectric conversion units in the corresponding pixel among the plurality of pixels.

3. The solid-state imaging device according to claim 2, wherein each of the plurality of first analog/digital conversion units performs analog/digital conversion to the corresponding first differential pixel signal by a designated number of bits.

4. The solid-state imaging device according to claim 2, further comprising:
a photoelectric conversion substrate on which the plurality of photoelectric conversion units are disposed;
a first substrate on which a plurality of the first charge storage circuits and the second charge storage circuits are disposed;
a second substrate on which another plurality of the first charge storage circuits and the second charge storage circuits are disposed;
a first connection unit configured to electrically connect the photoelectric conversion substrate to the first substrate; and
a second connection unit configured to electrically connect the first substrate to the second substrate;
wherein the plurality of first differential calculation units and the plurality of first analog/digital conversion units are disposed on one of the first and second substrates on which the first charge storage circuits of the corresponding pixels are disposed, and
wherein the plurality of second analog/digital conversion units are disposed on the other of the first and second substrate on which the corresponding second charge storage circuits are disposed.

5. The solid-state imaging device according to claim 2, further comprising:
a photoelectric conversion substrate on which the plurality of photoelectric conversion units are disposed;
a first substrate on which the plurality of first charge storage circuits and the plurality of second charge storage circuits are disposed; and
a first connection unit configured to electrically connect the photoelectric conversion substrate to the first substrate;
wherein the first differential calculation units, the first analog/digital conversion units, and the second analog/digital conversion units are disposed on the first substrate.

6. The solid-state imaging device according to claim 1, wherein the differential analog/digital conversion unit further includes an analog/digital conversion mode control unit which is configured to control the number of bits when the corresponding first analog/digital conversion units perform the analog/digital conversion to the first differential pixel signals, each of the analog/digital conversion mode control units corresponding to one of the plurality of first analog digital conversion units.

7. The solid-state imaging device according to claim 6, wherein the analog/digital conversion mode control unit controls the number of bits based on a dynamic range of the second pixel signals, the second pixel signals corresponding to the first differential pixel signals subjected to the analog-digital conversion by the corresponding first analog/digital conversion units.

8. The solid-state imaging device according to claim 6, wherein the analog/digital conversion mode control unit controls the number of bits based on a dynamic range of the first differential pixel signals subjected to the analog-digital conversion by the corresponding first analog/digital conversion units.

9. The solid-state imaging device according to claim 1,
wherein the pixel signal processing unit further includes:
- a plurality of third charge storage circuits configured to hold the second signal charges based on the first signal charges held by the plurality of second charge storage circuits, and output the second signal voltages as third pixel signals based on the held second signal charges, the third pixel signals being further reduced to a pre-determined number of pixels;

wherein the differential analog/digital conversion unit further includes:
- a plurality of second differential calculation units configured to correspond to each column of the second charge storage circuits and output pixel signals which are obtained by calculating differences between the second pixel signals of a corresponding column and the third pixel signals corresponding to the second pixel signals, as second differential pixel signals, and
- a plurality of third analog/digital conversion units configured to correspond to each column of the third charge storage circuits, perform analog/digital conversion to the third pixel signals output from the third charge storage circuits of the corresponding column, and output digital values indicating magnitudes of the third pixel signals; and wherein each of the plurality of second analog/digital conversion units is configured to correspond to each of the plurality of second differential calculation units, perform the analog/digital conversion to the second differential pixel signals output from the corresponding second differential calculation units, the second differential pixel signals being instead of the second pixel signals output from the second charge storage circuits, and output digital values indicating magnitudes of the second differential pixel signals, the number of bits of the digital values being less than the number of bits of the digital values output by the third analog/digital conversion units.

10. The solid-state imaging device according to claim 9, wherein the third pixel signal is a signal of a third signal voltage based on third signal charges with a charge amount obtained by averaging the second signal charges based on the first signal charges held by the plurality of corresponding second charge storage circuits.

11. The solid-state imaging device according to claim 10, wherein the differential analog/digital conversion unit further includes an analog/digital conversion mode control unit which is configured to control the number of bits when the corresponding first analog/digital conversion units perform the analog/digital conversion to the first differential pixel signals, each of the analog/digital conversion mode control units corresponding to one of the plurality of first analog digital conversion units, and
wherein the analog/digital conversion mode control unit further corresponds to each of the plurality of second analog/digital conversion units and controls the number of bits when the corresponding second analog/digital conversion units perform the analog/digital conversion on the second differential pixel signals.

12. The solid-state imaging device according to claim 11, wherein the analog/digital conversion mode control unit firstly reads the third pixel signals instead of the second pixel signals, and then controls the number of bits when the corresponding first analog/digital conversion units perform the analog/digital conversion to the first differential pixel signals and the number of bits when the corresponding second analog/digital conversion units perform the analog/digital conversion to the second differential pixel signals, based on a dynamic range of signals according to the read third pixel signals.

13. The solid-state imaging device according to claim 12, wherein the analog/digital conversion mode control unit controls the number of bits based on a dynamic range of the third pixel signals, the third pixel signals corresponding to the first differential pixel signals subjected to the analog/digital conversion by the corresponding first analog/digital conversion units and the second differential pixel signals subjected to the analog/digital conversion by the corresponding second analog/digital conversion units, and the third pixel signals being calculated based on digital values obtained through the analog/digital conversion by the corresponding third analog/digital conversion units.

14. The solid-state imaging device according to claim 12, wherein the analog/digital conversion mode control unit controls the number of bits based on a dynamic range of the third pixel signals, the third pixel signals corresponding to the first differential pixel signals subjected to the analog/digital conversion by the corresponding first analog/digital conversion units and the second differential pixel signals subjected to the analog/digital conversion by the corresponding second analog/digital conversion units.

15. The solid-state imaging device according to claim 11, wherein the analog/digital conversion mode control unit controls the number of bits based on a dynamic range of the differential pixel signals subjected to the analog/digital conversion by the corresponding first analog/digital conversion units when the first analog/digital conversion units performs the analog/digital conversion on the first differential pixel signals, and controls the number of bits based on a dynamic range of the second differential pixel signals subjected to the analog/digital conversion by the corresponding second analog/digital conversion units when the second analog/digital conversion units perform the analog/digital conversion on the second differential pixel signals.

16. The solid-state imaging device according to claim 11, wherein the analog/digital conversion mode control unit controls the number of bits based on a dynamic range of the second differential pixel signals subjected to the analog/digital conversion by the corresponding second analog/digital conversion units.

17. The solid-state imaging device according to claim 10, wherein each of the plurality of second analog/digital conversion units performs the analog/digital conversion to the corresponding second differential pixel signals by a designated number of bits.

18. The solid-state imaging device according to claim 10, further comprising:
- a second substrate on which another plurality of the first charge storage circuits and the second charge storage circuits are disposed;
- a third substrate on which the plurality of third charge storage circuits and the plurality of third analog/digital conversion units are disposed; and
- a third connection unit which is configured to electrically connect the second substrate to the third substrate.

19. The solid-state imaging device according to claim 18, wherein the third connection unit is disposed between the second substrate and the third substrate, the third connection unit is configured to correspond to the third charge storage circuits disposed on the third substrate, and the third connection unit is configured to electrically connect each of signal lines of the third signal charges to each of signal lines of the third pixel signals between the second substrate and the third substrate, the third signal charges being transmitted from the second charge storage circuits disposed on the second substrate to the corresponding third charge storage circuits disposed on the third substrate, the third pixel signals being used for calculating differences from the corresponding second pixel signals corresponding to each of the plurality of second differential calculation units.

20. The solid-state imaging device according to claim 10, further includes a first substrate on which the plurality of first charge storage circuits and the plurality of second charge storage circuits are disposed, wherein the plurality of third charge storage circuits and the plurality of third analog/digital conversion units are further disposed on the first substrate.

\* \* \* \* \*